United States Patent
Yamada et al.

(10) Patent No.: US 12,168,730 B2
(45) Date of Patent: Dec. 17, 2024

(54) OPTICAL FILTER AND IMAGING DEVICE

(71) Applicant: AGC Inc., Chiyoda-ku (JP)

(72) Inventors: Sayuri Yamada, Fukushima (JP); Kazuhiko Shiono, Fukushima (JP); Hiroki Hotaka, Fukushima (JP)

(73) Assignee: AGC Inc., Chiyoda-ku (JP)

( * ) Notice: Subject to any disclaimer, the term of this patent is extended or adjusted under 35 U.S.C. 154(b) by 1175 days.

(21) Appl. No.: 16/944,219

(22) Filed: Jul. 31, 2020

(65) Prior Publication Data

US 2020/0363576 A1 Nov. 19, 2020

Related U.S. Application Data

(63) Continuation of application No. PCT/JP2019/003227, filed on Jan. 30, 2019.

(30) Foreign Application Priority Data

Feb. 5, 2018 (JP) .................. 2018-018608

(51) Int. Cl.
| | | |
|---|---|---|
| C09B 57/00 | (2006.01) | |
| C09B 23/08 | (2006.01) | |
| C09B 23/10 | (2006.01) | |
| G02B 5/20 | (2006.01) | |
| G02B 5/22 | (2006.01) | |
| G02B 5/26 | (2006.01) | |

(52) U.S. Cl.
CPC .......... *C09B 57/007* (2013.01); *C09B 23/083* (2013.01); *C09B 23/10* (2013.01); *C09B 23/107* (2013.01); *G02B 5/223* (2013.01); *G02B 5/208* (2013.01); *G02B 5/26* (2013.01)

(58) Field of Classification Search
CPC .......... C09B 57/007; C09B 23/00–168; G02B 5/223
See application file for complete search history.

(56) References Cited

U.S. PATENT DOCUMENTS

| | | | |
|---|---|---|---|
| 2014/0264202 A1 | 9/2014 | Nagaya et al. | |
| 2015/0138369 A1* | 5/2015 | Takakuwa | G02B 5/208 427/160 |
| 2016/0011348 A1 | 1/2016 | Hirakoso et al. | |
| 2016/0018576 A1 | 1/2016 | Yamamoto et al. | |
| 2017/0003417 A1 | 1/2017 | Nagaya et al. | |
| 2017/0003425 A1 | 1/2017 | Nagaya et al. | |
| 2017/0066933 A1 | 3/2017 | Shiono et al. | |
| 2017/0343710 A1 | 11/2017 | Shiono et al. | |
| 2018/0017722 A1 | 1/2018 | Arimura et al. | |
| 2018/0346729 A1 | 12/2018 | Miyake et al. | |
| 2018/0364095 A1 | 12/2018 | Nagaya et al. | |
| 2019/0055375 A1 | 2/2019 | Choi et al. | |
| 2019/0161629 A1 | 5/2019 | Shiono et al. | |
| 2021/0173304 A1* | 6/2021 | Arayama | G02B 13/14 |

FOREIGN PATENT DOCUMENTS

| | | |
|---|---|---|
| JP | 2007-163644 A | 6/2007 |
| JP | 2008-88426 A | 4/2008 |
| WO | WO 2013/054864 A1 | 4/2013 |
| WO | WO 2014/168189 A1 | 10/2014 |
| WO | WO 2014/168190 A1 | 10/2014 |
| WO | WO 2016/133099 A1 | 8/2016 |
| WO | WO 2016/158461 A1 | 10/2016 |
| WO | WO 2016/158819 A1 | 10/2016 |
| WO | WO 2017/094672 A1 | 6/2017 |
| WO | WO 2017/094858 A1 | 6/2017 |
| WO | WO 2017/135359 A1 | 8/2017 |
| WO | WO 2017/146413 A2 | 8/2017 |

OTHER PUBLICATIONS

Partial machine translation of JP 2008-088426 A (generated Nov. 16, 2023).*
International Search Report issued Apr. 2, 2019, in PCT/JP2019/003227, filed on Jan. 30, 2019, citing documents AG-AH, AJ and AR-AV therein, 1 page.

* cited by examiner

*Primary Examiner* — Kregg T Brooks
(74) *Attorney, Agent, or Firm* — Oblon, McClelland, Maier & Neustadt, L.L.P.

(57) ABSTRACT

The present invention relates to an optical filter containing: an absorption layer containing a near-infrared absorbing dye (A) having a maximum absorption wavelength in dichloromethane being in a wavelength range of 850 to 1,100 nm and a transparent resin; and a reflection layer formed of a dielectric multilayer film, in which the near-infrared absorbing dye (A) satisfies the following Formulae (1) to (4).

$$ABS_{400(A)DCM}/ABS_{\lambda max(A)DCM} < 0.10 \quad (1),$$

$$ABS_{550(A)DCM}/ABS_{\lambda max(A)DCM} < 0.04 \quad (2),$$

$$ABS_{400(A)TR}/ABS_{\lambda max(A)TR} < 0.15 \quad (3), \text{ and}$$

$$ABS_{550(A)TR}/ABS_{\lambda max(A)TR} < 0.10 \quad (4).$$

20 Claims, 2 Drawing Sheets

OPTICAL FILTER AND IMAGING DEVICE

TECHNICAL FIELD

The present invention relates to an optical filter that transmits light in a visible wavelength region and shields light in a near-infrared wavelength region, and an imaging apparatus including the optical filter.

BACKGROUND ART

In an imaging apparatus using a solid-state image-sensing device, an optical filter, which transmits light in a visible region (hereinafter, also referred to as "visible light") and shields light in a near-infrared region (hereinafter, "near-infrared light"), is used in order to reproduce color tone well and obtain a clear image. As the optical filter, a near-infrared cut filter including an absorption layer containing a near-infrared absorber and a reflection layer formed of a dielectric multilayer film that shields near-infrared light is known. In other words, since a spectral transmittance curve of the dielectric multilayer film itself changes depending on an incident angle, the near-infrared cut filter including both the reflection layer and the absorption layer gives the spectral transmittance curve having the incident angle dependence suppressed by the absorption characteristics of the absorption layer.

In recent years, an optical component using laser light with a wavelength of 850 to 1,100 nm is often mounted in various machines equipped with such an imaging apparatus. Therefore, the near-infrared cut filter has been required to have characteristics of sufficiently cutting near-infrared light having a long wavelength of 850 to 1,100 nm while suppressing a decrease in transmittance of visible light.

In the near-infrared cut filter, many techniques using an absorbent exhibiting absorption in a relatively long wavelength region have been conventionally known. Specifically, techniques of combining a squarylium dye, a cyanine dye, a phthalocyanine dye, and the like (refer to, for example, Patent Literatures 1 and 2), and using a diimmonium dye, a metal dithiolate complex, an inorganic fine particle, and the like have been known (for example, Patent Literatures 3, 4, and 5).

CITATION LIST

Patent Literature

Patent Literature 1: Pamphlet of International Publication No. WO 2013/054864
Patent Literature 2: Pamphlet of International Publication No. WO 2016/158461
Patent Literature 3: Pamphlet of International Publication No. WO 2017/094672
Patent Literature 4: Pamphlet of International Publication No. WO 2014/168189
Patent Literature 5: Pamphlet of International Publication No. WO 2014/168190

SUMMARY OF INVENTION

Technical Problem

However, none of the near-infrared cut filters described above can achieve both high transmittance of visible light and high shielding properties in a long wavelength range of 850 to 1,100 nm.

An object of the present invention is to provide an optical filter having excellent shielding properties of near-infrared light, particularly the shielding properties of long-wavelength near-infrared light while maintaining excellent visible light transmittance, and an imaging apparatus excellent in color reproducibility using the optical filter.

Solution to Problem

An optical filter according to an aspect of the present invention includes: an absorption layer containing a near-infrared absorbing dye (A) satisfying the following (i-1) to (i-3) and a transparent resin; and a reflection layer formed of a dielectric multilayer film.

(i-1) A maximum absorption wavelength $\lambda_{max(A)DCM}$ is in a wavelength range of 850 to 1,100 nm in an absorbance curve of wavelength 350 to 1,200 nm measured in dichloromethane.

(i-2) In the absorbance curve of wavelength 350 to 1,200 nm measured in dichloromethane, when the absorbance at the maximum absorption wavelength $\lambda_{max(A)DCM}$ is denoted by $ABS_{\lambda max(A)DCM}$, the absorbance at a wavelength of 400 nm is denoted by $ABS_{400(A)DCM}$, and the absorbance at a wavelength of 550 nm is denoted by $ABS_{550(A)DCM}$, the following Formulae (1) and (2) are satisfied.

$$ABS_{400(A)DCM}/ABS_{\lambda max(A)DCM} < 0.10 \quad (1)$$

$$ABS_{550(A)DCM}/ABS_{\lambda max(A)DCM} < 0.04 \quad (2)$$

(i-3) In the absorbance curve of the wavelength of 350 to 1,200 nm measured in the transparent resin, a maximum absorption wavelength $\lambda_{max(A)TR}$ in a wavelength range of 850 to 1,100 nm, and when the absorbance at the maximum absorption wavelength max(A)TR is denoted by $ABS \lambda_{max(A)TR}$, the absorbance at the wavelength of 400 nm is denoted by $ABS_{400(A)TR}$, and the absorbance at the wavelength of 550 nm is denoted by $ABS_{550(A)TR}$, the following Formulae (3) and (4) are satisfied.

$$ABS_{400(A)TR}/ABS_{\lambda max(A)TR} < 0.15 \quad (3)$$

$$ABS_{550(A)TR}/ABS_{\lambda max(A)TR} < 0.10 \quad (4)$$

The present invention also provides an imaging apparatus provided with an optical filter of the present invention.

Advantageous Effects of Invention

According to the present invention, it is possible to obtain an optical filter having excellent shielding properties of near-infrared light, particularly the shielding properties of long-wavelength near-infrared light while maintaining excellent visible light transmittance. Furthermore, according to the present invention, it is possible to provide an imaging apparatus using the optical filter and having excellent color reproducibility.

DESCRIPTION OF EMBODIMENTS

Figure 1:
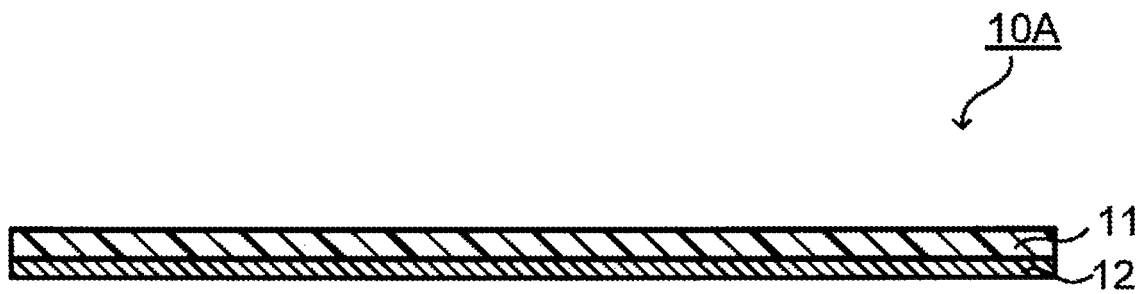
FIG. 1 is a cross-sectional view schematically illustrating an example of an optical filter according to an embodiment.

Hereinafter, embodiments of the present invention will be described.

In the present specification, a near-infrared absorbing dye may be abbreviated as "NIR dye" and the ultraviolet absorbing dye may be abbreviated as "UV dye".

In the present specification, a compound represented by Formula (I) is referred to as compound (I). The same applies to compounds represented by other formulae. The dye formed of the compound (I) is also referred to as a dye (I), and the same applies to other dyes. For example, a compound represented by Formula (ACi) described later is referred to as a compound (ACi), and a dye formed of the compound is also referred to as a dye (ACi). Furthermore, for example, a group represented by Formula (1x) is also referred to as a group (1x), and the same applies to groups represented by other formulae.

In the present specification, the transmittance of 90% or more for example with respect to a specific wavelength range means that the transmittance does not fall below 90% in the entirety of the wavelength range, and similarly, the transmittance of 1% or less with respect to a specific wavelength range means that the transmittance does not exceed 1% in the entirety of the wavelength range. An average transmittance in a specific wavelength range is an arithmetic average of the transmittance per 1 nm in the wavelength range.

In the present specification, "to" representing a numerical range includes the upper and lower limits.

In the present specification, in the case where a certain general formula has a plurality of substituents represented by the same symbols, the plurality of substituents may be the same as or different from each other.

<Optical Filter>

An optical filter of one embodiment of the present invention (hereinafter, also referred to as "present filter") includes an absorption layer containing a dye (A) which is an NIR dye satisfying the following (i-1) to (i-3) and a transparent resin, and a reflection layer.

(i-1) The dye (A) has a maximum absorption wavelength $\lambda_{max(A)DCM}$ in a wavelength range of 850 to 1,100 nm in an absorbance curve of 350 to 1,200 nm measured in dichloromethane.

(i-2) In the absorbance curve of wavelength 350 to 1,200 nm measured in dichloromethane, when the absorbance at the maximum absorption wavelength $\lambda_{max(A)DCM}$ is denoted by $ABS_{\lambda max(A)DCM}$, the absorbance at a wavelength of 400 nm is denoted by $ABS_{400(A)DCM}$, and the absorbance at a wavelength of 550 nm is denoted by $ABS_{550(A)DCM}$, the dye (A) satisfies the following Formulae (1) and (2).

$$ABS_{400(A)DCM}/ABS_{\lambda max(A)DCM} < 0.10 \quad (1)$$

$$ABS_{550(A)DCM}/ABS_{\lambda max(A)DCM} < 0.04 \quad (2)$$

(i-3) In the absorbance curve of the wavelength of 350 to 1,200 nm measured in the transparent resin, the dye (A) has a maximum absorption wavelength $\lambda_{max(A)TR}$ in a wavelength range of 850 to 1,100 nm, and when the absorbance at the maximum absorption wavelength $\lambda_{max(A)TR}$ is denoted by $ABS_{\lambda max(A)TR}$, the absorbance at the wavelength of 400 nm is denoted by $ABS_{400(A)TR}$, and the absorbance at the wavelength of 550 nm is denoted by $ABS_{550(A)TR}$, the dye (A) satisfies the following Formulae (3) and (4).

$$ABS_{400(A)TR}/ABS_{\lambda max(A)TR} < 0.15 \quad (3)$$

$$ABS_{550(A)TR}/ABS_{\lambda max(A)TR} < 0.10 \quad (4)$$

In the present filter, since the absorption layer contains the dye (A) having the features (i-1) to (i-3) and the transparent resin, it is excellent in the light shielding properties in the long wavelength region of near-infrared light and has high transmittance of visible light.

The dye (A) preferably further has the following feature (i-4).

(i-4) The dye (A) satisfies the following Formulae (5) and (6).

$$|ABS_{400(A)TR}/ABS_{\lambda max(A)TR} - ABS_{400(A)DCM}/ABS_{\lambda max(A)DCM}| < 0.10 \quad (5)$$

$$|ABS_{550(A)TR}/ABS_{\lambda max(A)TR} - ABS_{550(A)DCM}/ABS_{\lambda max(A)DCM}| < 0.08 \quad (6)$$

The absorbance curve at a wavelength of 350 to 1,200 nm measured by dissolving the dye (A) in dichloromethane is an absorbance curve when the addition amount of the dye (A) is adjusted such that the absorbance at the maximum absorption wavelength $\lambda_{max(A)DCM}$ is 1, that is, the light transmittance is adjusted to 10%. Similarly, the absorbance curve at a wavelength of 350 to 1,200 nm measured by adding the dye (A) in the transparent resin is an absorbance curve when the addition amount of the dye (A) is adjusted such that the absorbance at the maximum absorption wavelength $\lambda_{max(A)TR}$ is 1, that is, the light transmittance is adjusted to 10%.

The dye (A) preferably further has the following feature (i-5).

(i-5) The dye (A) has a mass absorption coefficient of 1,000/(cm mass %) or more when contained in the transparent resin.

The mass absorption coefficient can be calculated by $-\log_{10}(T/100)$ by calculating an internal transmittance T [%] (=measured transmittance [%]/(100−measured reflectance [%])×100 [%]) of light at the maximum absorption wavelength within a range of wavelength of 350 to 1,200 nm. Hereinafter, unless otherwise specified, the "mass absorption coefficient" of a dye is a mass absorption coefficient calculated by this method.

The present filter may further include a transparent substrate. In this case, the absorption layer and the reflection layer are provided on the main surface of the transparent substrate. The present filter may have the absorption layer and the reflection layer on the same main surface of the transparent substrate or on different main surfaces. In the case where the absorption layer and the reflection layer are provided on the same main surface, the order of stacking these layers is not particularly limited.

The present filter may also include other functional layers. Examples of the other functional layers include an antireflection layer that suppresses a loss of visible light transmittance. In particular, in the structure where the absorption layer serves an outermost surface, visible light transmittance loss occurs due to reflection at the interface between the absorption layer and air. Therefore, it is preferable to provide an antireflection layer on the absorption layer.

Next, configuration examples of the present filter will be described with reference to the drawings. FIG. 1 is a configuration example of an optical filter 10A including a reflection layer 12 on one main surface of an absorption layer 11. In the optical filter 10A, the absorption layer 11 can be configured to include a layer containing a dye (A) and a transparent resin. The phrase "providing the reflection layer 12 on one main surface (upper side) of the absorption layer 11" includes not only the case where the reflection layer 12 is provided in contact with the absorption layer 11, but also the case where another functional layer is provided between the absorption layer 11 and the reflection layer 12, and the following configuration is also the same.

Figure 2:
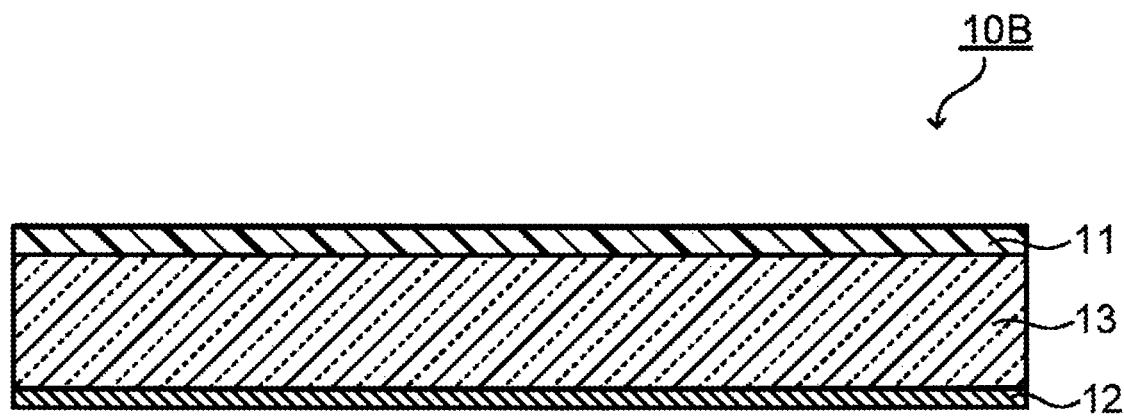
FIG. 2 is a cross-sectional view schematically illustrating another example of the optical filter according to the embodiment.

FIG. 2 is a cross-sectional view schematically illustrating an example of the optical filter of the embodiment having a transparent substrate, an absorption layer and a reflection layer. The optical filter 10B includes a transparent substrate 13, an absorption layer 11 disposed on one main surface of the transparent substrate 13, and a reflection layer 12 provided on the other main surface of the transparent substrate 13. In the optical filter 10B, the absorption layer 11 can be configured to include a layer containing a dye (A) and a transparent resin.

Figure 3:
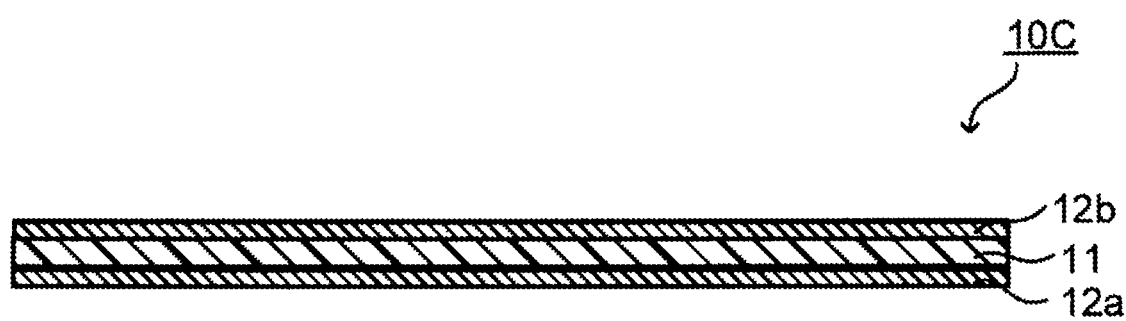
FIG. 3 is a cross-sectional view schematically illustrating another example of the optical filter according to the embodiment.

FIG. 3 is a configuration example of an optical filter 10C including the absorption layer 11 and the reflection layers 12a and 12b on both main surfaces of the absorption layer 11, respectively.

Figure 4:
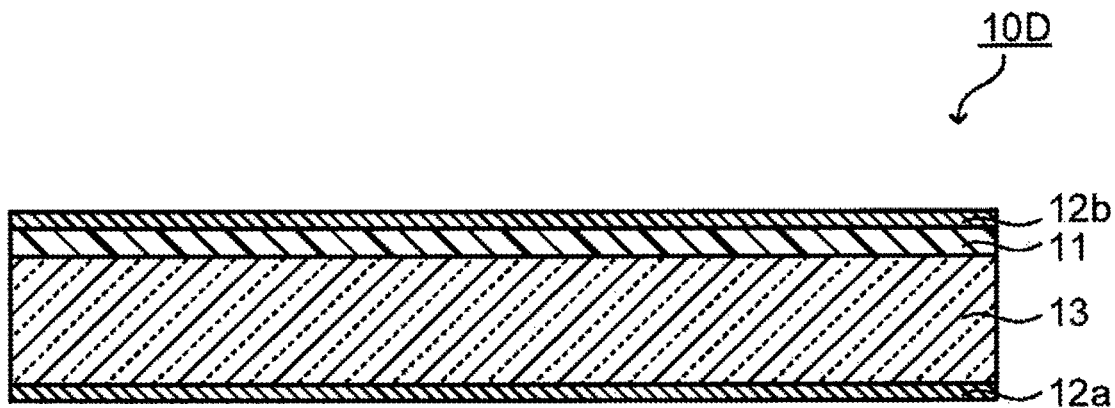
FIG. 4 is a cross-sectional view schematically illustrating another example of the optical filter according to the embodiment.

FIG. 4 is a configuration example of an optical filter 10D including the transparent substrate 13, the absorption layer 11 on one main surface of the transparent substrate 13, and the reflection layers 12a and 12b on the other main surface of the transparent substrate 13 and on the main surface of the absorption layer 11, respectively.

Figure 5:
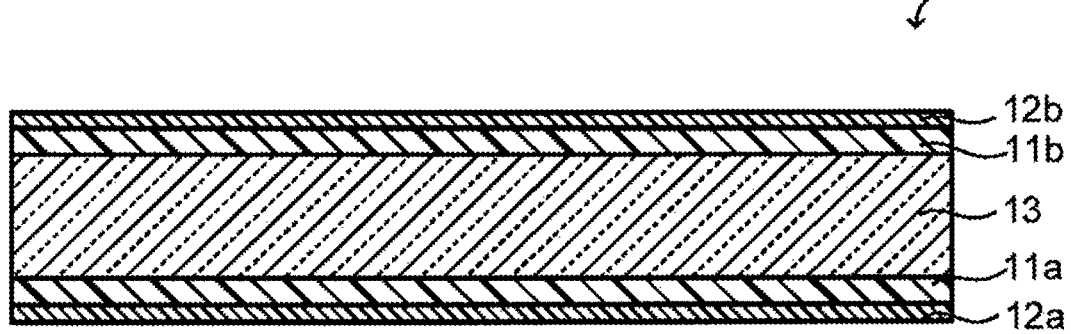
FIG. 5 is a cross-sectional view schematically illustrating another example of the optical filter according to the embodiment.

FIG. 5 is a configuration example of an optical filter 10E including the transparent substrate 13, the absorption layers 11a and 11b on both main surfaces of the transparent substrate 13, and the reflection layers 12a and 12b on the main surfaces of the absorption layers 11a and 11b, respectively.

In FIGS. 3, 4 and 5, the two reflection layers 12a and 12b to be combined may be the same as or different from each other. For example, the reflection layers 12a and 12b may have characteristics of reflecting ultraviolet light and near-infrared light and transmitting visible light, in which the reflection layer 12a may reflect ultraviolet light and light in a first near-infrared region, and the reflection layer 12b may reflect ultraviolet light and light in a second near-infrared region.

Furthermore, in FIG. 4, the two absorption layers 11a and 11b may be the same as or different from each other. In the case where the absorption layers 11a and 11b are different from each other, for example, the absorption layers 11a and 11b may be a combination of a near-infrared absorption layer and an ultraviolet absorption layer, or a combination of an ultraviolet absorption layer and a near-infrared absorption layer, respectively.

Figure 6:
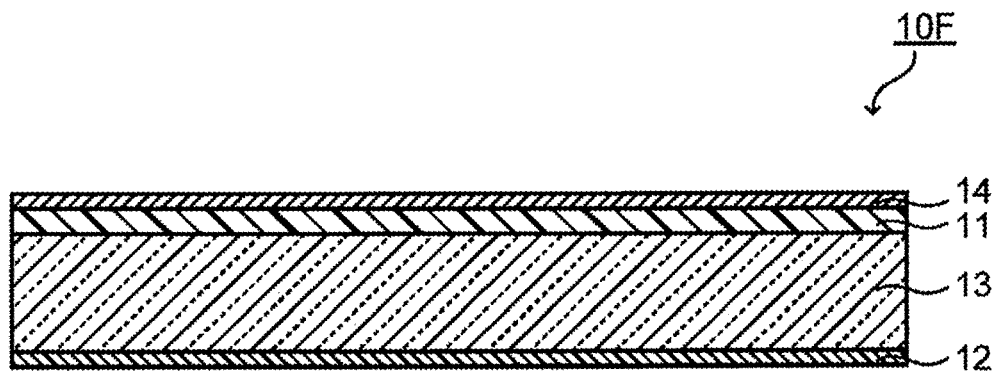
FIG. 6 is a cross-sectional view schematically illustrating another example of the optical filter according to the embodiment.

FIG. 6 is a configuration example of an optical filter 10F including an antireflection layer 14 on the main surface of the absorption layer 11 of the optical filter 10B as illustrated in FIG. 2. In the structure where the absorption layer serves an outermost surface without providing the reflection layer, it is preferable to provide the antireflection layer on the absorption layer. The antireflection layer may be configured to cover not only the outermost surface of the absorption layer but also the entire side surfaces of the absorption layer. In that case, the moisture-proof effect of the absorption layer can be also enhanced.

Hereinafter, the absorption layer, the reflection layer, the transparent substrate, and the antireflection layer will be described.

(Absorption Layer)

The absorption layer contains a dye (A) having the above-mentioned features (i-1) to (i-3), preferably further having the above-mentioned feature (i-4), and a transparent resin.

The absorption layer is typically a layer or (resin) substrate in which the dye (A) is uniformly dissolved or dispersed in the transparent resin. The absorption layer may contain other NIR dyes in addition to the dye (A) as long as the effect of the present invention is not impaired. Furthermore, the absorption layer may contain a dye other than the NIR dyes, particularly a UV dye, as long as the effect of the present invention is not impaired.

As other NIR dyes, it is preferable to contain a dye (D) satisfying the following requirements (v-1) and (v-2).

(v-1) the dye (D) has a maximum absorption wavelength $\lambda_{max(D)TR}$ in a wavelength range of 650 to 750 nm in an absorbance curve of 350 to 1,200 nm measured in the transparent resin.

(v-2) The dye (D) is represented by any of the Formulae (I) to (III) described below.

Furthermore, the dye (D) preferably satisfies the following requirement (v-3).

(v-3) The dye (D) has an average transmittance of light in the wavelength range of 400 to 500 nm of 85% or more in the spectral transmittance curve measured in the transparent resin at a concentration in which the transmittance at the maximum absorption wavelength $\lambda_{max(D)TR}$ becomes 10%.

Furthermore, in the spectral transmittance curve of the internal transmittance at a wavelength of 350 to 1,200 nm measured in the transparent resin, the dye (D) preferably has an absorption peak having an absorption peak top at $\lambda_{max(D)TR}$ (hereinafter, refer to "absorption peak of $\lambda_{max(D)TR}$") having a steep slope on the visible light side, that is, the wavelength from the transmittance of 70% to the transmittance of 20% in the slope on the visible light side is preferably 60 nm or less, and is further preferably 50 nm or less.

[Dye (A)]

The dye (A) has a maximum absorption wavelength $\lambda_{max(A)DCM}$ in the wavelength range of 850 to 1,100 nm in (i-1). The maximum absorption wavelength $\lambda_{max(A)DCM}$ is preferably in the wavelength range of 860 to 1,000 nm.

The dye (A) satisfies Formulae (1) and (2) in (i-2). In Formula (1), "$ABS_{400(A)DCM}/ABS_{\lambda max(A)DCM}$" indicates the value of the ratio of $ABS_{400(A)DCM}$ to $ABS_{\lambda max(A)DCM}$. That is, it indicates the value of $ABS_{400(A)DCM}$ when $ABS_{\lambda max(A)DCM}$ is defined as 1. The same applies to the following Formulae (2) to (4). According to Formula (1), $ABS_{400(A)DCM}/ABS_{\lambda max(A)DCM}$ is less than 0.10. The $ABS_{400(A)DCM}/ABS_{\lambda max(A)DCM}$ is preferably 0.08 or less, and more preferably 0.04 or less.

According to Formula (2), $ABS_{550(A)DCM}/ABS_{\lambda max(A)DCM}$ is less than 0.04. The $ABS_{550(A)DCM}/ABS_{\lambda max(A)DCM}$ is preferably 0.03 or less, and more preferably 0.02 or less.

The dye (A) has a maximum absorption wavelength $\lambda_{max(A)TR}$ in the wavelength range of 850 to 1,100 nm in (i-3). The maximum absorption wavelength $\lambda_{max(A)TR}$ is preferably in the wavelength range of 860 to 1,000 nm. Furthermore, the dye (A) satisfies Formulae (3) and (4) in (i-3). According to Formula (3), $ABS_{400(A)TR}/ABS_{\lambda max(A)TR}$ is less than 0.15. The $ABS_{400(A)TR}/ABS_{\lambda max(A)TR}$ is preferably 0.12 or less, and more preferably 0.09 or less.

According to Formula (4), $ABS_{550(A)TR}/ABS\, \lambda_{max(A)TR}$ is less than 0.10. The $ABS_{550(A)TR}/ABS_{\lambda max(A)TR}$ is preferably 0.08 or less, and more preferably 0.06 or less.

The dye (A) preferably satisfies Formulae (5) and (6) in (i-4). According to Formula (5), $ABS_{400(A)TR}/ABS_{\lambda max(A)TR}-ABS_{400(A)DCM}/ABS_{\lambda max(A)DCM}$ is less than 0.10, preferably 0.08 or less, and more preferably 0.06 or less. According to Formula (6), $ABS_{550(A)TR}/ABS_{\lambda max(A)TR}-ABS_{550(A)DCM}/ABS_{\lambda max(A)DCM}$ is less than 0.08, preferably 0.06 or less, and more preferably 0.04 or less.

The dye (A) has a mass absorption coefficient of 1,000/(cm·mass %) or more in (i-5). The mass absorption coefficient is preferably 1,500/(cm·mass %) or more.

The dye (A) is not particularly limited in a molecular structure thereof as long as it satisfies the requirements (i-1) to (i-3). Specific examples thereof include at least one dye selected from the group consisting of a cyanine dye, a croconium dye, a phthalocyanine dye, a squarylium dye, a diimonium dye, and a diketopyrrolopyrrole dye, and from the viewpoint of high visible light transmittance, a cyanine dye and a squarylium dye are particularly preferable.

The cyanine dye that is the dye (A) is preferably a cyanine dye represented by any of the following Formulae (ACi) to (ACiv).

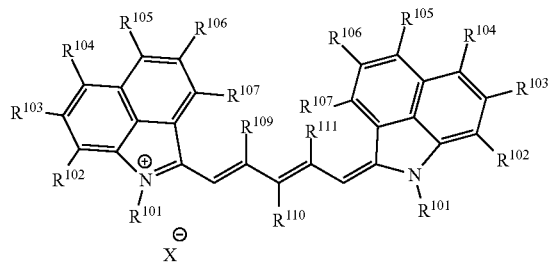
(ACi)

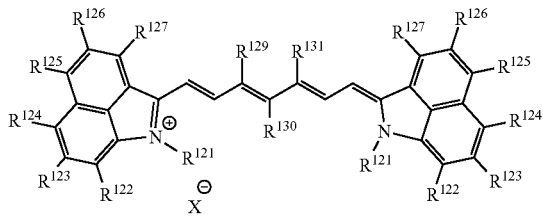
(ACii)

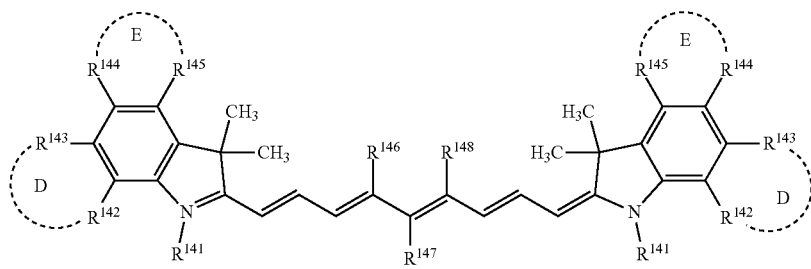
(ACiii)

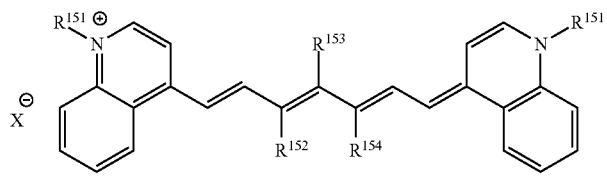
(ACiv)

It can be said that since the dye (A) satisfies the above (i-1) to (i-3), the dye (A) has a large maximum absorption wavelength both in dichloromethane and in the transparent resin and has sharp spectral characteristics with high transmittance of the visible light. It is generally known that a dye having a large maximum absorption wavelength, which also contributes to association, is difficult to reproduce a high visible light transmittance and a sharp spectrum as in dichloromethane in a transparent resin. Since the dye (A) satisfies the above-described (i-1) to (i-3), the dye (A) exhibits a characteristic of having absorptivity with a large maximum absorption wavelength and a high visible light transmittance in dichloromethane, while maintaining the absorptivity even in a transparent resin.

Furthermore, in the case of satisfying (i-4), the dye (A) can maintain the absorptivity in dichloromethane more reproducibly in the transparent resin used in the optical filter.

Here, symbols in Formulae (ACi) to (ACiv) are as follows.

$R^{101}$ to $R^{107}$, $R^{121}$ to $R^{127}$, $R^{141}$, and $R^{151}$ are each independently a hydrogen atom, a halogen atom, a sulfo group, a hydroxy group, a cyano group, a nitro group, a carboxyl group, a phosphoric acid group, a —$NR^{112}R^{113}$ group, a —$NHSO_2R^{114}$ group, a —$NHCOR^{115}$ group, a —$SR^{116}$ group, a —$SO_2R^{117}$ group, a —$OSO_2R^{118}$ group, an alkyl group or alkoxy group having 1 to 20 carbon atoms, a halogen-substituted alkyl group having 1 to 12 carbon atoms, a cycloalkyl group having 3 to 14 carbon atoms, an aryl group having 6 to 14 carbon atoms, or a heterocyclic group having 3 to 14 members.

Two adjacent $R^{102}$ to $R^{107}$ and $R^{122}$ to $R^{127}$ may be bonded to each other to form a 5-membered ring, a 6-membered ring or a 7-membered ring. As for Formula (ACi), a structure in which $R^{105}$ and $R^{106}$ are bonded to each other to form an aromatic ring together with a part (C=C) of a benzene ring of a skeleton is particularly preferable. Furthermore, as for Formula (ACii), a structure in which $R^{125}$ and $R^{126}$ are bonded to each other to form an aromatic ring together with a part (C=C) of a benzene ring of a skeleton is particularly preferable.

$R^{142}$ and $R^{143}$ may be a hydrogen atom or may be bonded to each other to form an aromatic ring D having a 6-membered ring. $R^{145}$ and $R^{144}$ may be a hydrogen atom or may be bonded to each other to form an aromatic ring E having a 6-membered ring. However, the aromatic ring D and the aromatic ring E are not formed simultaneously.

$R^{109}$ to $R^{111}$, $R^{129}$ to $R^{131}$, $R^{146}$ to $R^{148}$, and $R^{152}$ to $R^{154}$ are each independently a hydrogen atom, an alkyl group having 1 to 6 carbon atoms, a —$NR^{112}R^{113}$ group, a cycloalkyl group having 3 to 14 carbon atoms, or an aryl group having 6 to 14 carbon atoms.

$R^{109}$ and $R^{111}$, $R^{129}$ and $R^{131}$, $R^{146}$ and $R^{148}$, and $R^{152}$ and $R^{154}$ may be bonded to each other to form a 5- or 6-membered ring. In the case of forming a ring, the hydrogen atom bonded to the ring may be substituted with an alkyl group having 1 to 6 carbon atoms, and two of the ring-constituting atoms may be cross-linked with a methylene group.

$R^{112}$ to $R^{118}$ each independently represents a hydrogen atom, an alkyl group or alkoxy group having 1 to 20 carbon atoms, a halogen-substituted alkyl group having 1 to 12 carbon atoms, a cycloalkyl group having 3 to 14 carbon atoms, an aryl group having 6 to 14 carbon atoms, or a heterocyclic group having 3 to 14 members.

A plurality of $R^{101}$'s to $R^{107}$'s, $R^{121}$'s to $R^{127}$'s, $R^{141}$'s to $R^{145}$'s, $R^{151}$'s, D's, and E's included in each formula may be the same as or different from each other.

$X^-$ represents a monovalent anion.

In the above description, the alkyl group and an alkyl group of the alkoxy group may be linear, and may have a branched structure or a saturated ring structure. The aryl group refers to a group bonding via a carbon atom constituting an aromatic ring of an aromatic compound, such as a benzene ring, a naphthalene ring, biphenyl, a furan ring, a thiophene ring, and a pyrrole ring. Examples of the halogen atom include a fluorine atom, a chlorine atom, a bromine atom, and an iodine atom, and a fluorine atom and a chlorine atom are preferable.

Examples of $X^-$ include $I^-$, $BF_4^-$, $PF_6^-$, $ClO_4^-$, anions represented by Formulae (X1) and (X2), and the like, and $BF_4^-$, $PF_6^-$, and anions (X1) are preferable.

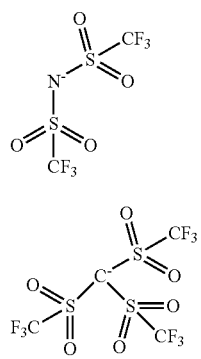

As the dye (ACi), a compound represented by the following Formula (ACi1) in which $R^{109}$ to $R^{111}$ in Formula (ACi) are hydrogen atoms is preferable from the viewpoint of maintaining high visible transparency in the transparent resin.

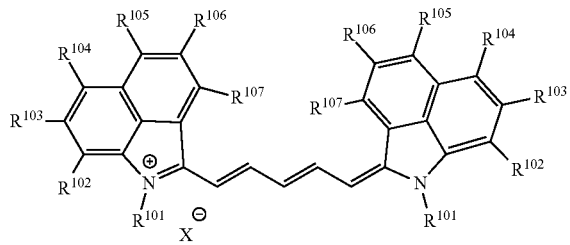

$R^{101}$ to $R^{107}$ and $X^-$ in Formula (ACi1) are the same as those described above in Formulae (ACi) to (ACiv) including the preferable embodiments. As $R^{101}$, from the viewpoint of solubility in a transparent resin or a solvent (hereinafter, also referred to as "host solvent") used when forming an absorption layer on a transparent substrate, an alkyl group having 1 to 20 carbon atoms with a linear or branched structure is preferable, and an alkyl group having 4 to 20 carbon atoms with a linear or branched structure is more preferable. $R^{102}$ to $R^{107}$ are each independently preferably a hydrogen atom, a —$NR^{112}R^{113}$ group, a —$NHSO_2R^{114}$ group, a —$NHCOR^{115}$ group, an alkyl group or alkoxy group having 1 to 20 carbon atoms, or a heterocyclic group having 3 to 14 members, and more preferably a hydrogen atom, or an alkyl group or alkoxy group having 1 to 20 carbon atoms. In this case, $R^{112}$ to $R^{115}$ can be the same as those described above in Formulae (ACi) to (ACiv).

As the dye (ACii), a compound represented by the following Formula (ACii1), in which $R^{129}$ and $R^{131}$ in Formula (ACii) are bonded to each other to form a 6-membered ring, and a compound represented by the following Formula (ACii2), in which $R^{129}$ and $R^{131}$ in Formula (ACii) are bonded to each other to form a 5-membered ring, are preferable from the viewpoint of maintaining high visible transparency in the transparent resin.

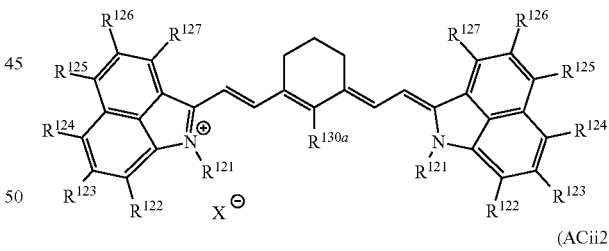

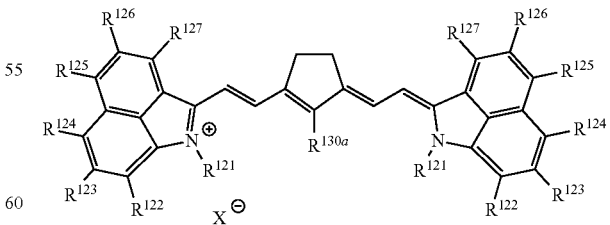

$R^{121}$ to $R^{127}$ and X in Formulae (ACii1) and (ACii2) are the same as those described above in Formulae (ACi) to (ACiv) including the preferable embodiments In Formula (ACii1), $R^{130a}$ is a hydrogen atom, a phenyl group or a methyl group, and preferably a phenyl group. In Formula (ACii2), $R^{130b}$ is a hydrogen atom, a phenyl group, a methyl group, or a diphenylamino group, and preferably a phenyl group or a diphenylamino group.

As $R^{121}$, from the viewpoint of solubility in a transparent resin or a host solvent, an alkyl group having 1 to 20 carbon atoms with a linear or branched structure is preferable, and an alkyl group having 4 to 20 carbon atoms with a linear or branched structure is more preferable. $R^{122}$ to $R^{127}$ are each independently preferably a hydrogen atom, a dimethylamino group, a —$NHSO_2R^{114}$ group, a —$NHCOR^{115}$ group, an alkyl group or alkoxy group having 1 to 20 carbon atoms, or a heterocyclic group having 3 to 14 members, and more preferably a hydrogen atom, or an alkyl group or alkoxy group having 1 to 20 carbon atoms. In this case, $R^{112}$ to $R^{115}$ can be the same as those described above in Formulae (ACi) to (ACiv).

Specific examples of the dye (ACiii) include a compound represented by the following Formula (ACiii1), having neither the aromatic ring D nor the aromatic ring E in Formula (ACiii), a compound represented by the following Formula (ACiii2), having only the aromatic ring E in Formula (ACiii), and a compound represented by the following Formula (ACiii3), having only the aromatic ring D in Formula (ACiii).

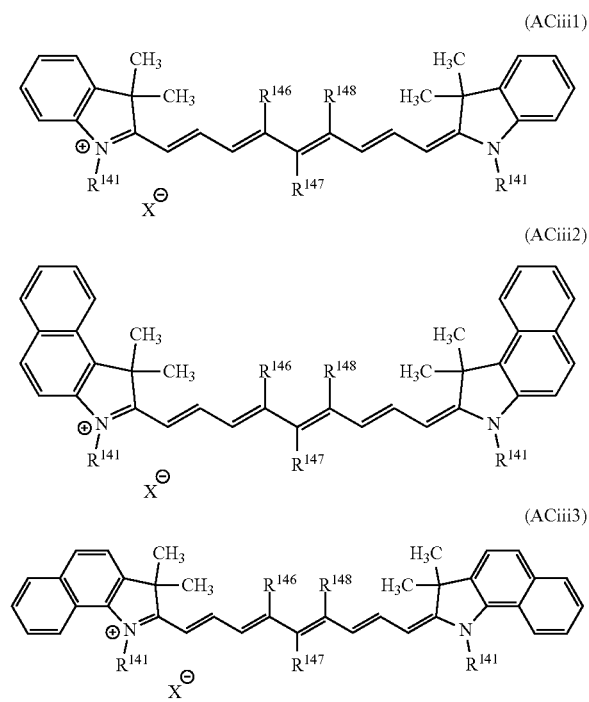

$R^{141}$, and $R^{146}$ to $R^{148}$, and $X^-$ in Formulae (ACiii1), (ACiii2), and (ACiii3) are the same as those described above in Formulae (ACi) to (ACiv) including the preferable embodiments. As $R^{141}$, from the viewpoint of solubility in a transparent resin or a host solvent, an alkyl group having 1 to 20 carbon atoms with a linear or branched structure is preferable, and from the viewpoint of ease of synthesis, an alkyl group having 2 to 5 carbon atoms with a linear or branched structure is more preferable. $R^{147}$ is preferably a hydrogen atom, a methyl group or a phenyl group, and more preferably a hydrogen atom or a phenyl group.

It is preferable that both $R^{146}$ and $R^{148}$ are hydrogen atoms, or that $R^{146}$ and $R^{148}$ are bonded to each other to form a 5-membered ring or a 6-membered ring together with the main chain (methine chain) to which these are bonded. In the case of forming a ring, the hydrogen atom bonded to the ring may be substituted with an alkyl group having 1 to 6 carbon atoms, and two of the ring-constituting atoms may be cross-linked with a methylene group. A structure represented by —$(CH_2)_3$— described below in which $R^{146}$ and $R^{148}$ are bonded to each other to form a 6-membered ring with the main chain is more preferable.

In the dye (ACiv), as $R^{151}$, from the viewpoint of solubility in a transparent resin or a host solvent, an alkyl group having 1 to 20 carbon atoms with a linear or branched structure is preferable, and from the viewpoint of ease of synthesis, an alkyl group having 2 to 5 carbon atoms with a linear or branched structure is more preferable. $R^{153}$ is preferably a hydrogen atom, a methyl group or a phenyl group, and more preferably a hydrogen atom or a phenyl group.

It is preferable that both $R^{152}$ and $R^{154}$ are hydrogen atoms, or that $R^{152}$ and $R^{154}$ are bonded to each other to form a 5-membered ring or a 6-membered ring together with the main chain (methine chain) to which these are bonded. In the case of forming a ring, the hydrogen atom bonded to the ring may be substituted with an alkyl group having 1 to 6 carbon atoms, and two of the ring-constituting atoms may be cross-linked with a methylene group. A structure represented by —$(CH_2)_3$— described below in which $R^{152}$ and $R^{154}$ are bonded to each other to form a 6-membered ring with the main chain is more preferable.

Specific examples of the compounds represented by Formula (ACi1), Formula (ACii1), Formula (ACii2), Formula (ACiii1), Formula (ACiii2), Formula (ACiii3), and Formula (ACiv) include compounds in which the atoms or groups bonded to each skeleton are indicated in Tables 1 to 7 below. In all the compounds indicated in Table 1, $R^{101}$ to $R^{107}$ are all the same on the left and right sides of the formula. In the compounds indicated in Tables 2 and 3, $R^{121}$ to $R^{127}$ are all the same on the left and right sides of the formula. In all the compounds indicated in Tables 4 to 6, $R^{141}$s are all the same on the left and right sides of the formula. In all the compounds indicated in Table 7, $R^{151}$s are all the same on the left and right sides of the formula. In Tables 1 to 7, the alkyl group represented by —$C_nH_{2n+1}$ (n is an integer of 3 or more) represents a linear alkyl group, and -Ph represents a phenyl group. Although only left-right symmetrical compounds are indicated in Tables 1 to 7, the invention of the present application is not limited to this, and left-right asymmetric compounds may be used. The left-right asymmetric compounds have an advantage of improving solubility in a resin.

In Tables 4 to 6, $R^{146}$ and $R^{148}$ in the case where $R^{146}$ and $R^{148}$ are bonded to each other to form a 6-membered ring together with three carbon atoms (C—C=C) of the methine chain are represented by —$(CH_2)_3$—. The same applies to other rings and the case where a hydrogen atom of the ring is substituted. The same applies to $R^{152}$ and $R^{154}$ in Table 7. In Tables 4 to 7, "NOR" described in the columns of $R^{146}$ and $R^{148}$ and $R^{152}$ and $R^{154}$ represents the following divalent groups.

(NOR)

Although X⁻ is not indicated in Tables 1 to 7, X⁻ in any compound is $BF_4^-$, $PF_6^-$ or anion X1. In the dye (ACi1-1), the case where X⁻ is $BF_4^-$ is called dye (ACi1-1B), the case where X⁻ is $PF_6^-$ is called dye (ACi1-1P), and the case where X⁻ is anion (X1) is called dye (ACi1-1X1). The same applies to other dyes indicated in Tables 1 to 7.

TABLE 1

| Dye No. | $R^{101}$ | $R^{102}$ | $R^{103}$ | $R^{104}$ | $R^{105}$ | $R^{106}$ | $R^{107}$ |
|---|---|---|---|---|---|---|---|
| ACi1-1  | —C₄H₉ | H | H | H | H | H | H |
| ACi1-2  | —C₄H₉ | H | H | —O—C₄H₉ | H | H | H |
| ACi1-3  | —C₄H₉ | H | H | —CH₃ | H | H | H |
| ACi1-4  | —C₄H₉ | H | H | —O—CH₂—CH(C₂H₅)(C₄H₉) | H | H | H |
| ACi1-5  | —C₄H₉ | H | H | —O—CH₂—CH(C₈H₁₇)(C₆H₁₃) | H | H | H |
| ACi1-6  | —C₄H₉ | H | H | —NH—SO₂—C₈H₁₇ | H | H | H |
| ACi1-7  | —C₈H₁₇ | H | H | H | H | H | H |
| ACi1-8  | —C₈H₁₇ | H | H | —O—C₄H₉ | H | H | H |
| ACi1-9  | —C₁₂H₂₅ | H | H | H | H | H | H |
| ACi1-10 | —C₁₂H₂₅ | H | H | —O—C₄H₉ | H | H | H |
| ACi1-11 | —CH₂—CH(C₂H₅)(C₄H₉) | H | H | H | H | H | H |
| ACi1-12 | —CH₂—CH(C₂H₅)(C₄H₉) | H | H | —O—C₄H₉ | H | H | H |
| ACi1-13 | —CH₂—CH(C₈H₁₇)(C₆H₁₃) | H | H | H | H | H | H |
| ACi1-14 | —CH₂—CH(C₈H₁₇)(C₆H₁₃) | H | H | —O—C₄H₉ | H | H | H |
| ACi1-15 | —CH₂—CH(C₈H₁₇)(C₆H₁₃) | H | H | —O—CH₂—CH(C₈H₁₇)(C₆H₁₃) | H | H | H |

Among these, the dye (ACi1) is preferably a dye (ACi1-1B), a dye (ACi1-1P), a dye (ACi1-1X1), a dye (ACi1-2B), a dye (ACi1-2P), a dye (ACi1-14B), a dye (ACi1-15B), and the like.

TABLE 2

| Dye No. | $R^{121}$ | $R^{122}$ | $R^{123}$ | $R^{124}$ | $R^{125}$ | $R^{126}$ | $R^{127}$ | $R^{130a}$ |
|---|---|---|---|---|---|---|---|---|
| ACii1-1  | —C₄H₉ | H | H | H | H | H | H | —Ph |
| ACii1-2  | —C₄H₉ | H | H | —CH₃ | H | H | H | —Ph |
| ACii1-3  | —C₄H₉ | H | H | —O—C₄H₉ | H | H | H | —Ph |
| ACii1-4  | —C₈H₁₇ | H | H | H | H | H | H | —Ph |
| ACii1-5  | —C₁₂H₂₅ | H | H | H | H | H | H | —Ph |
| ACii1-6  | —CH₂—CH(C₂H₅)(C₄H₉) | H | H | H | H | H | H | —Ph |
| ACii1-7  | —CH₂—CH(C₈H₁₇)(C₆H₁₃) | H | H | H | H | H | H | —Ph |
| ACii1-8  | —C₄H₉ | H | H | H | H | H | H | —CH₃ |
| ACii1-9  | —C₈H₁₇ | H | H | H | H | H | H | —CH₃ |
| ACii1-10 | —C₁₂H₂₅ | H | H | H | H | H | H | —CH₃ |
| ACii1-11 | —CH₂—CH(C₂H₅)(C₄H₉) | H | H | H | H | H | H | —CH₃ |
| ACii1-12 | —CH₂—CH(C₈H₁₇)(C₆H₁₃) | H | H | H | H | H | H | —CH₃ |
| ACii1-13 | —C₄H₉ | H | H | H | H | H | H | H |
| ACii1-14 | —C₈H₁₇ | H | H | H | H | H | H | H |
| ACii1-15 | —C₁₂H₂₅ | H | H | H | H | H | H | H |
| ACii1-16 | —CH₂—CH(C₂H₅)(C₄H₉) | H | H | H | H | H | H | H |
| ACii1-17 | —CH₂—CH(C₈H₁₇)(C₆H₁₃) | H | H | H | H | H | H | H |

Among these, the dye (ACii1) is preferably a dye (ACii1-1B), a dye (ACii1-1P), a dye (ACii1-7B), a dye (ACii1-7P), and the like.

TABLE 3

| Dye No. | $R^{121}$ | $R^{122}$ | $R^{123}$ | $R^{124}$ | $R^{125}$ | $R^{126}$ | $R^{127}$ | $R^{130b}$ |
|---|---|---|---|---|---|---|---|---|
| ACii2-1  | —C₄H₉ | H | H | H | H | H | H | —Ph |
| ACii2-2  | —C₄H₉ | H | H | H | H | H | H | —NPh₂ |
| ACii2-3  | —C₄H₉ | H | H | —CH₃ | H | H | H | —Ph |
| ACii2-4  | —C₄H₉ | H | H | —O—C₄H₉ | H | H | H | —Ph |
| ACii2-5  | —C₈H₁₇ | H | H | H | H | H | H | —Ph |
| ACii2-6  | —C₈H₁₇ | H | H | H | H | H | H | —NPh₂ |
| ACii2-7  | —C₁₂H₂₅ | H | H | H | H | H | H | —Ph |
| ACii2-8  | —C₁₂H₂₅ | H | H | H | H | H | H | —NPh₂ |
| ACii2-9  | —CH₂—CH(C₂H₅)(C₄H₉) | H | H | H | H | H | H | —Ph |
| ACii2-10 | —CH₂—CH(C₂H₅)(C₄H₉) | H | H | H | H | H | H | —NPh₂ |
| ACii2-11 | —CH₂—CH(C₈H₁₇)(C₆H₁₃) | H | H | H | H | H | H | —Ph |

TABLE 3-continued

| Dye No. | $R^{121}$ | $R^{122}$ | $R^{123}$ | $R^{124}$ | $R^{125}$ | $R^{126}$ | $R^{127}$ | $R^{130b}$ |
|---|---|---|---|---|---|---|---|---|
| ACii2-12 | —CH$_2$—CH(C$_8$H$_{17}$)(C$_6$H$_{13}$) | H | H | H | H | H | H | —NPh$_2$ |
| ACii2-13 | —C$_4$H$_9$ | H | H | H | H | H | H | —CH$_3$ |
| ACii2-14 | —C$_8$H$_{17}$ | H | H | H | H | H | H | —CH$_3$ |
| ACii2-15 | —C$_{12}$H$_{25}$ | H | H | H | H | H | H | —CH$_3$ |
| ACii2-16 | —CH$_2$—CH(C$_2$H$_5$)(C$_4$H$_9$) | H | H | H | H | H | H | —CH$_3$ |
| ACii2-17 | —CH$_2$—CH(C$_8$H$_{17}$)(C$_6$H$_{13}$) | H | H | H | H | H | H | —CH$_3$ |
| ACii2-18 | —C$_4$H$_9$ | H | H | H | H | H | H | H |
| ACii2-19 | —C$_8$H$_{17}$ | H | H | H | H | H | H | H |
| ACii2-20 | —C$_{12}$H$_{25}$ | H | H | H | H | H | H | H |
| ACii2-21 | —CH$_2$—CH(C$_2$H$_5$)(C$_4$H$_9$) | H | H | H | H | H | H | H |
| ACii2-22 | —CH$_2$—CH(C$_8$H$_{17}$)(C$_6$H$_{13}$) | H | H | H | H | H | H | H |

Among these, the dye (ACii2) is preferably a dye (ACii2-1B), a dye (ACii2-1P), a dye (ACii2-2B), a dye (ACii2-2P), a dye (ACii2-11B), a dye (ACi2-11P), a dye (ACi2-12B), a dye (ACii2-12P), and the like.

TABLE 4

| Dye No. | $R^{141}$ | $R^{147}$ | $R^{146}$ | $R^{148}$ |
|---|---|---|---|---|
| ACiii1-1 | —C$_2$H$_5$ | H | H | H |
| ACiii1-2 | —C$_2$H$_5$ | —Ph | —(CH$_2$)$_3$— | |
| ACiii1-3 | —C$_2$H$_5$ | H | —CH$_2$—C(CH$_3$)$_2$—CH$_2$— | |
| ACiii1-4 | —C$_2$H$_5$ | —CH$_3$ | —(CH$_2$)$_3$— | |
| ACiii1-5 | —C$_2$H$_5$ | H | NOR | |
| ACiii1-6 | —CH$_3$ | H | H | H |
| ACiii1-7 | —CH$_3$ | —Ph | —(CH$_2$)$_3$— | |
| ACiii1-8 | —CH$_3$ | —CH$_3$ | —(CH$_2$)$_3$— | |
| ACiii1-9 | —CH$_3$ | H | —CH$_2$—C(CH$_3$)$_2$—CH$_2$— | |
| ACiii1-10 | —CH$_3$ | H | NOR | |
| ACiii1-11 | —C$_3$H$_7$ | H | H | H |
| ACiii1-12 | —C$_3$H$_7$ | —Ph | —(CH$_2$)$_3$— | |
| ACiii1-13 | —C$_3$H$_7$ | —CH$_3$ | —(CH$_2$)$_3$— | |
| ACiii1-14 | —C$_3$H$_7$ | H | —CH$_2$—C(CH$_3$)$_2$—CH$_2$— | |
| ACiii1-15 | —C$_3$H$_7$ | H | NOR | |
| ACiii1-16 | —CH(CH$_3$)CH$_3$ | H | H | H |
| ACiii1-17 | —CH(CH$_3$)CH$_3$ | —Ph | —(CH$_2$)$_3$— | |
| ACiii1-18 | —CH(CH$_3$)CH$_3$ | —CH$_3$ | —(CH$_2$)$_3$— | |
| ACiii1-19 | —CH(CH$_3$)CH$_3$ | H | —CH$_2$—C(CH$_3$)$_2$—CH$_2$— | |
| ACiii1-20 | —CH(CH$_3$)CH$_3$ | H | NOR | |
| ACiii1-21 | —C$_4$H$_9$ | H | H | H |
| ACiii1-22 | —C$_4$H$_9$ | —Ph | —(CH$_2$)$_3$— | |
| ACiii1-23 | —C$_4$H$_9$ | —CH$_3$ | —(CH$_2$)$_3$— | |
| ACiii1-24 | —C$_4$H$_9$ | H | —CH$_2$—C(CH$_3$)$_2$—CH$_2$— | |
| ACiii1-25 | —C$_4$H$_9$ | H | NOR | |

Among these, the dye (ACiii1) is preferably a dye (ACiii1-11B), a dye (ACiii1-1P), a dye (ACiii1-2B), a dye (ACiii1-2P), a dye (ACiii1-3B), a dye (ACiii1-3P), a dye (ACiii1-7B), a dye (ACiii1-7P), a dye (ACiii1-9B), a dye (ACiii1-9P), a dye (ACiii1-12B), a dye (ACiii1-12P), a dye (ACiii1-17B), a dye (ACiii1-17P), a dye (ACiii1-19B), a dye (ACiii1-19P), and the like.

TABLE 5

| Dye No. | $R^{141}$ | $R^{147}$ | $R^{146}$ | $R^{148}$ |
|---|---|---|---|---|
| ACiii2-1 | —C$_2$H$_5$ | H | H | H |
| ACiii2-2 | —C$_2$H$_5$ | —Ph | —(CH$_2$)$_3$— | |
| ACiii2-3 | —C$_2$H$_5$ | H | —CH$_2$—C(CH$_3$)$_2$—CH$_2$— | |
| ACiii2-4 | —C$_2$H$_5$ | —CH$_3$ | —(CH$_2$)$_3$— | |
| ACiii2-5 | —C$_2$H$_5$ | H | NOR | |
| ACiii2-6 | —CH$_3$ | H | H | H |
| ACiii2-7 | —CH$_3$ | —Ph | —(CH$_2$)$_3$— | |
| ACiii2-8 | —CH$_3$ | —CH$_3$ | —(CH$_2$)$_3$— | |
| ACiii2-9 | —CH$_3$ | H | —CH$_2$—C(CH$_3$)$_2$—CH$_2$— | |
| ACiii2-10 | —CH$_3$ | H | NOR | |
| ACiii2-11 | —C$_3$H$_7$ | H | H | H |
| ACiii2-12 | —C$_3$H$_7$ | —Ph | —(CH$_2$)$_3$— | |
| ACiii2-13 | —C$_3$H$_7$ | —CH$_3$ | —(CH$_2$)$_3$— | |
| ACiii2-14 | —C$_3$H$_7$ | H | —CH$_2$—C(CH$_3$)$_2$—CH$_2$— | |
| ACiii2-15 | —C$_3$H$_7$ | H | NOR | |
| ACiii2-16 | —CH(CH$_3$)CH$_3$ | H | H | H |
| ACiii2-17 | —CH(CH$_3$)CH$_3$ | —Ph | —(CH$_2$)$_3$— | |
| ACiii2-18 | —CH(CH$_3$)CH$_3$ | —CH$_3$ | —(CH$_2$)$_3$— | |
| ACiii2-19 | —CH(CH$_3$)CH$_3$ | H | —CH$_2$—C(CH$_3$)$_2$—CH$_2$— | |
| ACiii2-20 | —CH(CH$_3$)CH$_3$ | H | NOR | |
| ACiii2-21 | —C$_4$H$_9$ | H | H | H |
| ACiii2-22 | —C$_4$H$_9$ | —Ph | —(CH$_2$)$_3$— | |
| ACiii2-23 | —C$_4$H$_9$ | —CH$_3$ | —(CH$_2$)$_3$— | |
| ACiii2-24 | —C$_4$H$_9$ | H | —CH$_2$—C(CH$_3$)$_2$—CH$_2$— | |
| ACiii2-25 | —C$_4$H$_9$ | H | NOR | |

Among these, the dye (ACiii2) preferably a dye (ACiii2-1B), a dye (ACiii2-1P), a dye (ACiii2-2B), a dye (ACiii2-2P), a dye (ACiii2-3B), a dye (ACiii2-3P), a dye (ACiii2-7B), a dye (ACiii2-7P), a dye (ACiii2-9B), a dye (ACiii2-9P), a dye (ACiii2-12B), a dye (ACiii2-12P), a dye (ACiii2-17B), a dye (ACiii2-17P), a dye (ACiii2-19B), a dye (ACiii2-19P), and the like.

TABLE 6

| Dye No. | $R^{141}$ | $R^{147}$ | $R^{146}$ | $R^{148}$ |
|---|---|---|---|---|
| ACiii3-1 | —C$_2$H$_5$ | H | H | H |
| ACiii3-2 | —C$_2$H$_5$ | —Ph | —(CH$_2$)$_3$— | |
| ACiii3-3 | —C$_2$H$_5$ | H | —CH$_2$—C(CH$_3$)$_2$—CH$_2$— | |
| ACiii3-4 | —C$_2$H$_5$ | —CH$_3$ | —(CH$_2$)$_3$— | |
| ACiii3-5 | —C$_2$H$_5$ | H | NOR | |
| ACiii3-6 | —CH$_3$ | H | H | H |
| ACiii3-7 | —CH$_3$ | —Ph | —(CH$_2$)$_3$— | |
| ACiii3-8 | —CH$_3$ | —CH$_3$ | —(CH$_2$)$_3$— | |
| ACiii3-9 | —CH$_3$ | H | —CH$_2$—C(CH$_3$)$_2$—CH$_2$— | |
| ACiii3-10 | —CH$_3$ | H | NOR | |
| ACiii3-11 | —C$_3$H$_7$ | H | H | H |
| ACiii3-12 | —C$_3$H$_7$ | —Ph | —(CH$_2$)$_3$— | |
| ACiii3-13 | —C$_3$H$_7$ | —CH$_3$ | —(CH$_2$)$_3$— | |
| ACiii3-14 | —C$_3$H$_7$ | H | —CH$_2$—C(CH$_3$)$_2$—CH$_2$— | |
| ACiii3-15 | —C$_3$H$_7$ | H | NOR | |
| ACiii3-16 | —CH(CH$_3$)CH$_3$ | H | H | H |
| ACiii3-17 | —CH(CH$_3$)CH$_3$ | —Ph | —(CH$_2$)$_3$— | |
| ACiii3-18 | —CH(CH$_3$)CH$_3$ | —CH$_3$ | —(CH$_2$)$_3$— | |
| ACiii3-19 | —CH(CH$_3$)CH$_3$ | H | —CH$_2$—C(CH$_3$)$_2$—CH$_2$— | |
| ACiii3-20 | —CH(CH$_3$)CH$_3$ | H | NOR | |

TABLE 6-continued

| Dye No. | R¹⁴¹ | R¹⁴⁷ | R¹⁴⁶ | R¹⁴⁸ |
|---|---|---|---|---|
| ACiii3-21 | —C₄H₉ | H | H | H |
| ACiii3-22 | —C₄H₉ | —Ph | | —(CH₂)₃— |
| ACiii3-23 | —C₄H₉ | —CH₃ | | —(CH₂)₃— |
| ACiii3-24 | —C₄H₉ | H | | —CH₂—C(CH₃)₂—CH₂— |
| ACiii3-25 | —C₄H₉ | H | | NOR |

Among these, the dye (ACiii3) is preferably a dye (ACiii3-1B), a dye (ACiii3-1P), a dye (ACiii3-2B), a dye (ACiii3-2P), a dye (ACiii3-3B), a dye (ACiii3-3P), a dye (ACiii3-7B), a dye (ACiii3-7P), a dye (ACiii3-9B), a dye (ACiii3-9P), a dye (ACiii3-12B), a dye (ACiii3-12P), a dye (ACiii3-17B), a dye (ACiii3-17P), a dye (ACiii3-19B), a dye (ACiii3-19P), and the like.

TABLE 7

| Dye No. | R¹⁵¹ | R¹⁵³ | R¹⁵² | R¹⁵⁴ |
|---|---|---|---|---|
| ACiv-1 | —C₂H₅ | H | H | H |
| ACiv-2 | —C₂H₅ | —Ph | | —(CH₂)₃— |
| ACiv-3 | —C₂H₅ | H | | —CH₂—C(CH₃)₂—CH₂— |
| ACiv-4 | —C₂H₅ | —CH₃ | | —(CH₂)₃— |
| ACiv-5 | —C₂H₅ | H | | NOR |
| ACiv-6 | —CH₃ | H | H | H |
| ACiv-7 | —CH₃ | —Ph | | —(CH₂)₃— |
| ACiv-8 | —CH₃ | —CH₃ | | —(CH₂)₃— |
| ACiv-9 | —CH₃ | H | | —CH₂—C(CH₃)₂—CH₂— |
| ACiv-10 | —CH₃ | H | | NOR |
| ACiv-11 | —C₃H₇ | H | H | H |
| ACiv-12 | —C₃H₇ | —Ph | | —(CH₂)₃— |
| ACiv-13 | —C₃H₇ | —CH₃ | | —(CH₂)₃— |
| ACiv-14 | —C₃H₇ | H | | —CH₂—C(CH₃)₂—CH₂— |
| ACiv-15 | —C₃H₇ | H | | NOR |
| ACiv-16 | —CH(CH₃)CH₃ | H | H | H |
| ACiv-17 | —CH(CH₃)CH₃ | —Ph | | —(CH₂)₃— |
| ACiv-18 | —CH(CH₃)CH₃ | —CH₃ | | —(CH₂)₃— |
| ACiv-19 | —CH(CH₃)CH₃ | H | | —CH₂—C(CH₃)₂—CH₂— |
| ACiv-20 | —CH(CH₃)CH₃ | H | | NOR |
| ACiv-21 | —C₄H₉ | H | H | H |
| ACiv-22 | —C₄H₉ | —Ph | | —(CH₂)₃— |
| ACiv-23 | —C₄H₉ | —CH₃ | | —(CH₂)₃— |
| ACiv-24 | —C₄H₉ | H | | —CH₂—C(CH₃)₂—CH₂— |
| ACiv-25 | —C₄H₉ | H | | NOR |
| ACiv-26 | —C₂H₅ | —Ph | | —(CH₂)₂— |

Among these, the dye (ACiv) is preferably a dye (ACiv-1B), a dye (ACiv-1P), a dye (ACiv-2B), a dye (ACiv-2P), a dye (ACiv-3B), and a dye (ACiv-3P), a dye (ACiv-7B), a dye (ACiv-7P), a dye (ACiv-9B), a dye (ACiv-9P), a dye (ACiv-12B), a dye (ACiv-12P), a dye (ACiv-17B), a dye (ACiv-17P), a dye (ACiv-19B), a dye (ACiv-19P), a dye (ACiv-26B), a dye (ACiv-26P), and the like.

The dye (ACi), the dye (ACii) and the dye (ACiv) can be produced by, for example, a method described in J. Heterocyclic Chem., 42 (2005), 959. The dye (ACiii) can be produced by a method described in UKRAINSKII KHIMICHESKII ZHURNAL, 44 (8), 838, (1978).

Furthermore, as the dye (ACi1-1B), the dye (ACi1-2B) and the dye (ACii2-2B), commercially available products produced by Few Chemicals, trade names, S0772, S2437, and S2007 can be used, respectively. As the dye (ACiii1-9B), the dye (ACiii2-9B) and the dye (ACiii3-9B), commercially available products produced by Spectrum Info., trade names, S1379, S1984, and S1985 can be used, respectively.

The squarylium dye that is the dye (A) is preferably a squarylium dye represented by the following Formula (ASi) or (ASii).

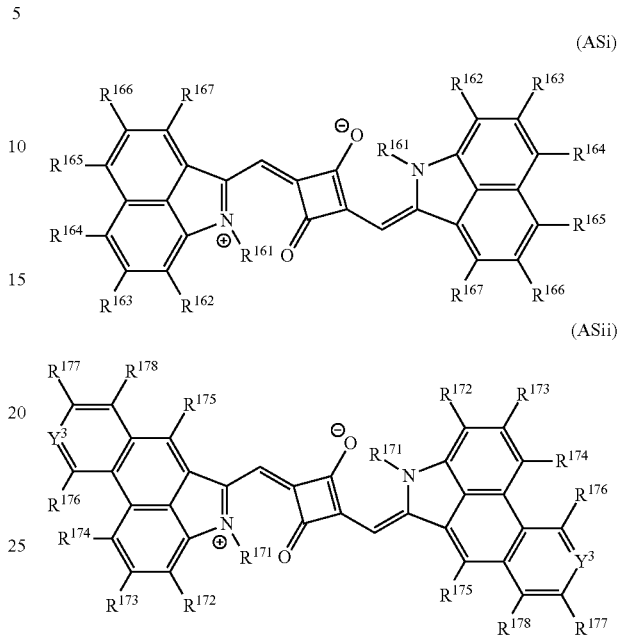

Here, symbols in Formulae (A Si) and (A Sii) are as follows.

$R^{161}$ is a branched alkyl group having 3 to 20 carbon atoms or a linear alkyl group having 13 to 20 carbon atoms. From the viewpoint of solubility in a transparent resin or a host solvent, $R^{16}$ is preferably a branched alkyl group having 8 to 20 carbon atoms, and more preferably a linear alkyl group having 16 to 20 carbon atoms. $R^{161}$ is more preferably a branched alkyl group having 8 to 20 carbon atoms from the viewpoint of maintaining high transmittance in the transparent resin.

$Y^3$ is C—$R^{179}$ or N.

$R^{162}$ to $R^{167}$ and $R^{171}$ to $R^{179}$ are each independently a hydrogen atom, a halogen atom, a sulfo group, a hydroxy group, a cyano group, a nitro group, a carboxyl group, a phosphoric acid group, a —$NR^{112}R^{113}$ group, a —$NHSO_2R^{114}$ group, a —$NHCOR^{115}$ group, a —$SR^{116}$ group, a —$SO_2R^{117}$ group, a —$OSO_2R^{118}$ group, an alkyl group or alkoxy group having 1 to 20 carbon atoms, a halogen-substituted alkyl group having 1 to 12 carbon atoms, a cycloalkyl group having 3 to 14 carbon atoms, an aryl group having 6 to 14 carbon atoms, or a heterocyclic group having 3 to 14 members.

Examples of the heterocyclic group having 3 to 14 members include a heterocyclic group containing at least one kind selected from N, O and S as a hetero atom. From the viewpoint of solubility in a transparent resin or a host solvent, $R^{171}$ is preferably a linear alkyl group having 8 to 20 carbon atoms or a branched alkyl group having 8 to 20 carbon atoms. $R^{171}$ is more preferably a branched alkyl group having 16 to 20 carbon atoms from the viewpoint of maintaining high transmittance in the transparent resin. $R^{162}$ to $R^{167}$ and $R^{172}$ to $R^{178}$ are each independently preferably a hydrogen atom, an alkyl or alkoxy group having 1 to 20 carbon atoms, a —$NHSO_2R^{114}$ group, or a —$NHCOR^{115}$ group, and more preferably a hydrogen atom, an alkyl group or alkoxy group having 1 to 20 carbon atoms or a —NH- COR$^{115}$ group. R$^{179}$ is preferably an alkyl group or alkoxy group having 1 to 20 carbon atoms, and more preferably an alkyl group or alkoxy group having 1 to 8 carbon atoms.

A plurality of R$^{161}$'s to R$^{167}$'s, R$^{171}$'s to R$^{178}$'s, and Y$^3$'s included in each formula may be the same as or different from each other.

R$^{112}$ to R$^{118}$ each independently represents a hydrogen atom, an alkyl group or alkoxy group having 1 to 20 carbon atoms, a halogen-substituted alkyl group having 1 to 12 carbon atoms, a cycloalkyl group having 3 to 14 carbon atoms, an aryl group having 6 to 14 carbon atoms, or a heterocyclic group having 3 to 14 members. Examples of the halogen atom include a fluorine atom, a chlorine atom, a bromine atom, and an iodine atom, and a fluorine atom and a chlorine atom are preferable.

R$^{112}$ to R$^{118}$ are each independently preferably an alkyl group or alkoxy group having 1 to 20 carbon atoms, and more preferably an alkyl group or alkoxy group having 1 to 16 carbon atoms.

In the above description, unless otherwise specified, the alkyl group and an alkyl group of the alkoxy group may be linear, and may have a branched structure or a saturated ring structure. An aryl group refers to a group bonding via a carbon atom constituting an aromatic ring of an aromatic compound, such as a benzene ring, a naphthalene ring, a biphenyl, a furan ring, a thiophene ring, and a pyrrole ring. Examples of the halogen atom include a fluorine atom, a chlorine atom, a bromine atom, and an iodine atom, and a fluorine atom and a chlorine atom are preferable.

Specific examples of the compounds represented by Formula (ASi) and Formula (ASii) include compounds in which the atoms or groups bonded to each skeleton are indicated in Tables 8 and 9 below. In all the compounds indicated in Table 8, R$^{161}$ to R$^{167}$ are all the same on the left and right sides of the formula. In the compounds indicated in Table 9, R$^{171}$ to R$^{178}$ and Y$^3$ are all the same on the left and right sides of the formula. In Tables 8 and 9, all alkyl groups such as —C$_4$H$_9$ are linear alkyl groups. Although only left-right symmetrical compounds are indicated in Tables 8 and 9, the invention of the present application is not limited to this, and left-right asymmetric compounds may be used. The left-right asymmetric compounds have an advantage of improving solubility in a resin.

TABLE 8

| Dye No. | R$^{161}$ | R$^{162}$ | R$^{163}$ | R$^{164}$ |
|---|---|---|---|---|
| ASi-1 | —CH$_2$—CH(C$_2$H$_5$)(C$_4$H$_9$) | H | H | H |
| ASi-2 | —CH$_2$—CH(C$_8$H$_{17}$)(C$_6$H$_{13}$) | H | H | H |
| ASi-3 | —CH$_2$—CH(C$_8$H$_{17}$)(C$_6$H$_{13}$) | H | H | —O—C$_4$H$_9$ |
| ASi-4 | —C$_{16}$H$_{33}$ | H | H | H |
| ASi-5 | —C$_{16}$H$_{33}$ | H | H | —CH$_3$ |
| ASi-6 | —C$_{16}$H$_{33}$ | H | H | —O—C$_4$H$_9$ |
| ASi-7 | —C$_{16}$H$_{33}$ | H | H | —O—C$_8$H$_{17}$ |
| ASi-8 | —C$_{16}$H$_{33}$ | H | H | —O—CH$_2$—CH(C$_8$H$_{17}$)(C$_6$H$_{13}$) |
| ASi-9 | —C$_{16}$H$_{33}$ | H | H | —NH—SO$_2$—C$_8$H$_{17}$ |
| ASi-10 | —C$_{20}$H$_{41}$ | H | H | H |
| ASi-11 | —C$_{20}$H$_{41}$ | H | H | —CH$_3$ |
| ASi-12 | —C$_{20}$H$_{41}$ | H | H | O—C$_4$H$_9$ |
| ASi-13 | —C$_{20}$H$_{41}$ | H | H | —O—C$_8$H$_{17}$ |
| ASi-14 | —C$_{20}$H$_{41}$ | H | H | —O—CH$_2$—CH(C$_8$H$_{17}$)(C$_6$H$_{13}$) |
| ASi-15 | —C$_{20}$H$_{41}$ | H | H | —NH—SO$_2$—C$_8$H$_{17}$ |
| ASi-16 | —CH$_2$—CH(C$_2$H$_5$)(C$_4$H$_9$) | H | H | —CH$_3$ |
| ASi-17 | —CH$_2$—CH(C$_2$H$_5$)(C$_4$H$_9$) | H | H | —O—C$_4$H$_9$ |
| ASi-18 | —CH$_2$—CH(C$_2$H$_5$)(C$_4$H$_9$) | H | H | —O—C$_8$H$_{17}$ |
| ASi-19 | —CH$_2$—CH(C$_2$H$_5$)(C$_4$H$_9$) | H | H | —O—CH$_2$—CH(C$_8$H$_{17}$)(C$_6$H$_{13}$) |
| ASi-20 | —CH$_2$—CH(C$_8$H$_{17}$)(C$_6$H$_{13}$) | H | H | —CH$_3$ |
| ASi-21 | —CH$_2$—CH(C$_8$H$_{17}$)(C$_6$H$_{13}$) | H | H | —O—C$_8$H$_{17}$ |
| ASi-22 | —CH$_2$—CH(C$_8$H$_{17}$)(C$_6$H$_{13}$) | H | H | —O—CH$_2$—CH(C$_8$H$_{17}$)(C$_6$H$_{13}$) |
| ASi-23 | —CH$_2$—CH(C$_8$H$_{17}$)(C$_6$H$_{13}$) | H | H | —NH—SO$_2$—C$_8$H$_{17}$ |
| ASi-24 | —CH$_2$—CH(C$_8$H$_{17}$)(C$_6$H$_{13}$) | H | H | —O—CH$_2$—CH(C$_2$H$_5$)(C$_4$H$_9$) |
| ASi-25 | —CH$_2$—CH(C$_8$H$_{17}$)(C$_6$H$_{13}$) | H | H | —NH—COO—CH$_2$—CH(C$_2$H$_5$)(C$_4$H$_9$) |
| ASi-26 | —C$_{16}$H$_{33}$ | H | H | —NH—COO—CH$_2$—CH(C$_2$H$_5$)(C$_4$H$_9$) |
| ASi-27 | —C$_{20}$H$_{41}$ | H | H | —NH—COO—CH$_2$—CH(C$_2$H$_5$)(C$_4$H$_9$) |
| ASi-28 | —CH$_2$—CH(C$_2$H$_5$)(C$_4$H$_9$) | H | H | —NH—COO—CH$_2$—CH(C$_8$H$_{17}$)(C$_6$H$_{13}$) |
| ASi-29 | —C$_{16}$H$_{33}$ | H | H | —NH—COO—CH$_2$—CH(C$_8$H$_{17}$)(C$_6$H$_{13}$) |
| ASi-30 | —C$_{20}$H$_{41}$ | H | H | —NH—COO—CH$_2$—CH(C$_8$H$_{17}$)(C$_6$H$_{13}$) |
| ASi-31 | —CH$_2$—CH(C$_8$H$_{17}$)(C$_6$H$_{15}$) | H | H | —NH—COO—CH$_2$—CH(C$_8$H$_{17}$)(C$_6$H$_{13}$) |

| Dye No. | R$^{165}$ | R$^{166}$ | R$^{167}$ |
|---|---|---|---|
| ASi-1 | H | H | H |
| ASi-2 | H | H | H |
| ASi-3 | H | H | H |
| ASi-4 | H | H | H |
| ASi-5 | H | H | H |
| ASi-6 | H | H | H |
| ASi-7 | H | H | H |
| ASi-8 | H | H | H |
| ASi-9 | H | H | H |
| ASi-10 | H | H | H |
| ASi-11 | H | H | H |
| ASi-12 | H | H | H |

TABLE 8-continued

| | | | |
|---|---|---|---|
| ASi-13 | H | H | H |
| ASi-14 | H | H | H |
| ASi-15 | H | H | H |
| ASi-16 | H | H | H |
| ASi-17 | H | H | H |
| ASi-18 | H | H | H |
| ASi-19 | H | H | H |
| ASi-20 | H | H | H |
| ASi-21 | H | H | H |
| ASi-22 | H | H | H |
| ASi-23 | H | H | H |
| ASi-24 | H | H | H |
| ASi-25 | H | H | H |
| ASi-26 | H | H | H |
| ASi-27 | H | H | H |
| ASi-28 | H | H | H |
| ASi-29 | H | H | H |
| ASi-30 | H | H | H |
| ASi-31 | H | H | H |

The dye (ASi) is preferably a dye (ASi-1), a dye (ASi-2), a dye (ASi-3), a dye (ASi-19), a dye (ASi-22), a dye (ASi-24), a dye (ASi-25), a dye (ASi-28), a dye (ASi-31), and the like, and more preferably a dye (ASi-1), a dye (ASi-19), a dye (ASi-22), a dye (ASi-25), a dye (ASi-31), and the like. As the left-right asymmetric dye (ASi), dyes whose left-right combination is any combination of ASi-19 and any of ASi-24, ASi-25 and ASi-28, dyes whose left-right combination is any combination of ASi-22 and any of AS-24 and ASi-31, and dyes whose left-right combination is any combination of ASi-24 and any of AS-25 and ASi-28, and the like are preferable.

The absorption layer may contain one kind of dye (A) alone, or may contain two or more kinds in combination. In the case where two or more kinds thereof are contained, it is preferable that the maximum absorption wavelength $\lambda_{max(A)TR}$ of each dye (A) is different. The difference in maximum absorption wavelength $\lambda_{max(A)TR}$ between the two or more kinds of dyes (A) is preferably, for example, in a range of 50 to 300 nm, and more preferably 50 to 150 nm. In the case where the dye (A) is formed of two or more kinds of compounds, each compound does not necessarily have the property of the dye (A), and it is sufficient to satisfy the property of the dye (A) as a mixture.

TABLE 9

| | Substituents | | | | | | | | |
|---|---|---|---|---|---|---|---|---|---|
| Dye No. | $R^{171}$ | $R^{172}$ | $R^{173}$ | $R^{174}$ | $R^{175}$ | $R^{176}$ | $R^{177}$ | $R^{178}$ | $Y^3$ |
| ASii-1 | —$C_8H_{17}$ | H | H | H | H | H | H | H | C—H |
| ASii-2 | —$CH_2$—$CH(C_8H_{17})(C_6H_{13})$ | H | H | —$CH_3$ | H | H | H | H | C—H |
| ASii-3 | —$CH_2$—$CH(C_8H_{17})(C_6H_{13})$ | H | H | —$OCH_3$ | H | H | H | H | C—H |
| ASii-4 | —$CH_2$—$CH(C_8H_{17})(C_6H_{13})$ | H | H | H | H | H | H | H | C—$CH_3$ |
| ASii-5 | —$CH_2$—$CH(C_8H_{17})(C_6H_{13})$ | H | H | H | H | H | H | H | C—$OCH_3$ |
| ASii-6 | —$CH_2$—$CH(C_8H_{17})(C_6H_{13})$ | H | H | H | H | H | H | H | N |
| ASii-7 | —$CH_2$—$CH(C_8H_{17})(C_6H_{13})$ | H | H | H | H | H | H | H | C—H |
| ASii-8 | —$CH_2$—$CH(C_8H_{17})(C_6H_{13})$ | H | H | —O—$C_8H_{17}$ | H | H | H | H | C—H |
| ASii-9 | —$C_{16}H_{33}$ | H | H | —$CH_3$ | H | H | H | H | C—H |
| ASii-10 | —$C_{16}H_{33}$ | H | H | —$OCH_3$ | H | H | H | H | C—H |
| ASii-11 | —$C_{16}H_{33}$ | H | H | H | H | H | H | H | C—$CH_3$ |
| ASii-12 | —$C_{16}H_{33}$ | H | H | H | H | H | H | H | C—$OCH_3$ |
| ASii-13 | —$C_{16}H_{33}$ | H | H | H | H | H | H | H | N |
| ASii-14 | —$C_{16}H_{33}$ | H | H | H | H | H | H | H | C—H |
| ASii-15 | —$C_{16}H_{33}$ | H | H | —O—$C_8H_{17}$ | H | H | H | H | C—H |
| ASii-16 | —$C_{20}H_{41}$ | H | H | —O—$C_8H_{17}$ | H | H | H | H | C—H |
| ASii-17 | —$CH_2$—$CH(C_2H_5)(C_4H_9)$ | H | H | —O—$C_8H_{17}$ | H | H | H | H | C—H |

Among these, the dye (ASii) is preferably a dye (ASii-1) to a dye (ASii-8), a dye (ASii-10), a dye (ASii-15) to a dye (ASii-17), and the like, and more preferably a dye (ASii-8), a dye (ASii-15) to a dye (ASii-17), and the like.

The dye (ASi) and the dye (ASii) can be produced by the method described in, for example, European Journal of Medical Chemistry, 54, 647, (2012), and the dye (ASii) can be produced in such a manner that a compound to be introduced on both sides of a squarylium ring is produced by the method described in Org. Lett. 18, 5232 (2016), and the compound is introduced into two positions on the diagonal of squaric acid by the method described in, for example, Organic Letters, 8, 111, (2006).

As a preferable combination of two or more kinds of dyes (A), for example, when the dye (A) having the maximum absorption wavelength on the relatively short wavelength side is denoted by a dye S, the dye (A) having the maximum absorption wavelength on the relatively long wavelength side is denoted by a dye L, and the dye (A) having the maximum absorption wavelength between the maximum absorption wavelength of the dye S and the maximum absorption wavelength of the dye L is denoted by a dye M, it is preferable to select and combine two or more kinds of dye S, dye M and dye L.

Specific examples include a combination of the dye S and the dye M, a combination of the dye S and the dye L, a combination of the dye M and the dye L, and a combination of the dye S, the dye M, and the dye L. The maximum absorption wavelength $\lambda_{max(A)TR}$ of the dye S is preferably in the wavelength range of 850 to 900 nm, and more preferably in the wavelength range of 860 to 890 nm. The maximum absorption wavelength $\lambda_{max(A)TR}$ of the dye M is preferably in the wavelength range of 900 to 1,000 nm, and more preferably in the wavelength range of 930 to 980 nm. The maximum absorption wavelength $\lambda_{max(A)TR}$ of the dye L is preferably in the wavelength range of 1,000 to 1,100 nm, and more preferably in the wavelength range of 1,000 to 1050 nm.

[Dye (D)]

The dye (D) satisfies the requirements of (v-1) and (v-2), that is, it is at least one dye selected from the group consisting of squarylium dyes represented by any one of the following Formulae (I) to (III), having the maximum absorption wavelength $\lambda_{max(D)TR}$ in the wavelength range of 650 to 750 nm. The dye (D) further preferably satisfies the above-described requirement (v-3).

The dye (D) formed of a squarylium dye has a small absorption of visible light in the absorbance curve, and has an absorption peak of $\lambda_{max(D)TR}$ having a steep slope on the visible light side, and the dye (D) has high storage stability and high stability to light.

Furthermore, the dye (D) has a mass absorption coefficient of preferably 1,000/(cm mass %) or more and more preferably 1,500/(cm mass %) or more, when added in the transparent resin.

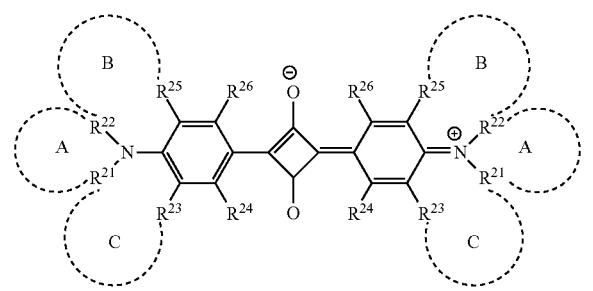
(I)

Here, symbols in Formulae (I) are as follows.

$R^{24}$ and $R^{26}$ are each independently a hydrogen atom, a halogen atom, a hydroxyl group, an alkyl group or alkoxy group having 1 to 6 carbon atoms, an acyloxy group having 1 to 10 carbon atoms, —$NR^{27}R^{28}$ ($R^{27}$ and $R^{28}$ are each independently a hydrogen atom, an alkyl group having 1 to 20 carbon atoms, —C(=O)—$R^{29}$ ($R^{29}$ is a hydrogen atom, an alkyl group having 1 to 20 carbon atoms or an aryl group having 6 to 11 carbon atoms which may have a substituent, or an araryl group having 7 to 18 carbon atoms which may have a substituent and have an oxygen atom between carbon atoms), —$NHR^{30}$, or —$SO_2$—$R^{30}$ ($R^{30}$ represents a hydrocarbon group having 1 to 25 carbon atoms, each of which one or more hydrogen atoms may be substituted with a halogen atom, a hydroxyl group, a carboxy group, a sulfo group, or a cyano group, or which may contain an unsaturated bond, an oxygen atom, or a saturated or unsaturated ring structure between carbon atoms)), or a group represented by the following Formula (S) ($R^{41}$ and $R^{42}$ each independently represents a hydrogen atom, a halogen atom, or an alkyl group or alkoxy group having 1 to 10 carbon atoms, and k is 2 or 3).

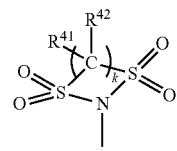
(S)

$R^{21}$ and $R^{22}$, $R^{22}$ and $R^{25}$, and $R^{21}$ and $R^{23}$ may be bonded to each other to form a heterocycle A, a heterocycle B, and a heterocycle C each having 5 or 6 members with a nitrogen atom, respectively.

$R^{21}$ and $R^{22}$ in the case where the heterocycle A is formed represent, as a divalent group -Q- to which these are bonded, an alkylene group or alkyleneoxy group in which a hydrogen atom may be substituted with an alkyl group having 1 to 6 carbon atoms, an aryl group having 6 to 10 carbon atoms, or acyloxy group having 1 to 10 carbon atoms which may have a substituent.

$R^{22}$ and $R^{25}$ in the case where the heterocycle B is formed, and $R^{21}$ and $R^{23}$ in the case where the heterocycle C is formed respectively represent as divalent groups —$X^1$—$Y^1$— and —$X^2$—$Y^2$— ($X^1$ and $X^2$ are on the side that bonds to nitrogen) to which these are bonded, a group in which $X^1$ and $X^2$ are each a group represented by the following Formula (1x) or (2x), and $Y^1$ and $Y^2$ are each a group represented by any one selected from the following Formulae (1y) to (5y). In the case where $X^1$ and $X^2$ are each a group represented by the following Formula (2x), $Y^1$ and $Y^2$ may be a single bond, and in that case, an oxygen atom may be contained between carbon atoms.

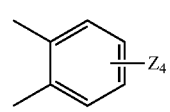
(1x)

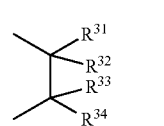
(2x)

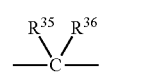
(1y)

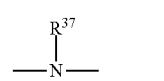
(2y)

(3y)

(4y)

(5y)

In Formula (1x), four Z's are each independently a hydrogen atom, a hydroxyl group, an alkyl group or alkoxy group having 1 to 6 carbon atoms, or —$NR^{38}R^{39}$ ($R^{38}$ and $R^{39}$ each independently represents a hydrogen atom or an alkyl group having 1 to 20 carbon atoms). $R^{31}$ to $R^{36}$ each independently represents a hydrogen atom, an alkyl group having 1 to 6 carbon atoms or an aryl group having 6 to 10 carbon atoms, and $R^{37}$ represents an alkyl group having 1 to 6 carbon atoms or an aryl group having 6 to 10 carbon atoms.

$R^{27}$, $R^{28}$, $R^{29}$, $R^{31}$ to $R^{37}$, $R^{21}$ to $R^{23}$ in the case where a heterocycle is not formed, and $R^{25}$ may be bonded to any of them to form a 5-membered ring or a 6-membered ring. $R^{31}$ and $R^{36}$, and $R^{31}$ and $R^{37}$ may be directly bonded to each other.

$R^{21}$ and $R^{22}$ in the case where a heterocycle is not formed, each independently represents a hydrogen atom, an alkyl group or allyl group having 1 to 6 carbon atoms which may have a substituent, or an aryl group or araryl group having 6 to 11 carbon atoms which may have a substituent. $R^{23}$ and $R^{21}$ in the case where a heterocycle is not formed, each independently represents a hydrogen atom, a halogen atom, or an alkyl group or alkoxy group having 1 to 6 carbon atoms.

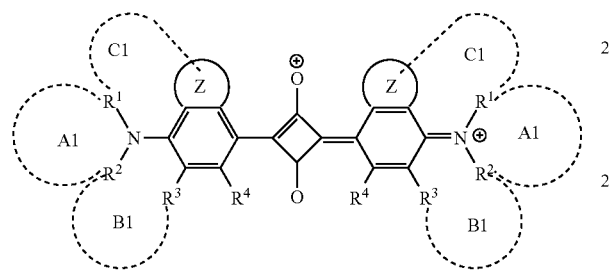

(II)

Here, symbols in Formulae (11) are as follows.

Ring Z's are each independently a 5-membered ring or 6-membered ring which has 0 to 3 heteroatoms in the ring and may be substituted.

The carbon atom or heteroatom constituting R and $R^2$, $R^2$ and $R^3$, and $R^1$ and the ring Z may be boded to each other to form a heterocycle A1, a heterocycle B1 and a heterocycle C1 together with a nitrogen atom, respectively. In the case where the heterocycle is not formed, $R^1$ and $R^2$ each independently represents a hydrogen atom, a halogen atom, or a hydrocarbon group which may contain an unsaturated bond, a heteroatom, or a saturated or unsaturated ring structure between carbon atoms, and may have a substituent, and $R^3$ and $R^4$ each independently represents a hydrogen atom, a halogen atom, or an alkyl group or alkoxy group which may contain a heteroatom between carbon atoms.

(III)

Here, symbols in Formulae (III) are as follows.

$R^{51}$ each independently represents a halogen atom or an alkyl group having 1 to 3 carbon atoms which may have a substituent.

$R^{52}$ to $R^{58}$ each independently represents a hydrogen atom, a halogen atom or an alkyl group having 1 to 10 carbon atoms which may have a substituent.

$R^{52}$ and $R^{53}$ may be bonded to each other to form a saturated or unsaturated hydrocarbon ring B2 having 5 to 15 carbon atoms, and the hydrogen atom of the hydrocarbon ring B2 may be substituted with an alkyl group having 1 to 10 carbon atoms.

$R^{54}$ and $R^{55}$ may be bonded to each other to form a benzene ring A2, and the hydrogen atom of the benzene ring A2 may be substituted with an alkyl group having 1 to 10 carbon atoms.

Examples of the compound (I) include compounds represented by any of Formulae (I-1) to (I-4).

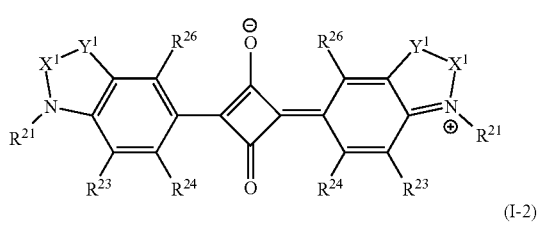

(I-1)

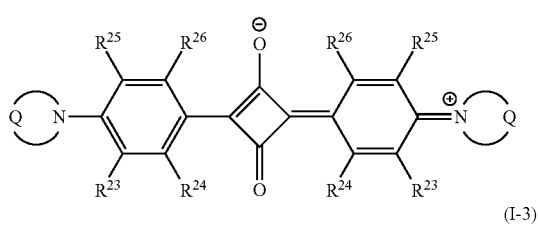

(I-2)

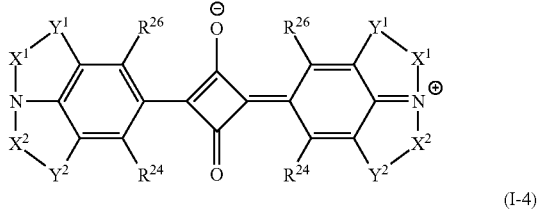

(I-3)

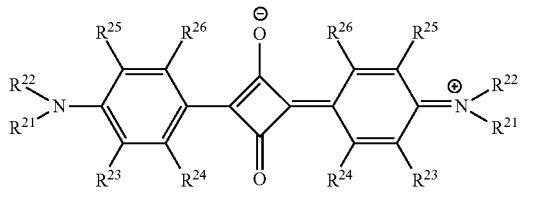

(I-4)

Here, the symbols in Formulae (I-1) to (I-4) are the same as the respective definitions of the same symbols in Formula (I), and the preferable embodiments are also the same.

Among the compounds (I-1) to (I-4), the dye (A) is preferably the compounds (I-1) to (I-3) from the viewpoint of increasing the visible light transmittance of the absorption layer, and is particularly preferably the compound (I-1).

In the compound (I-1), $X^1$ is preferably a group (2x), and $Y^1$ is preferably a single bond or a group (1y). In this case, $R^{31}$ to $R^{36}$ are preferably a hydrogen atom or an alkyl group having 1 to 3 carbon atoms, and more preferably a hydrogen atom or a methyl group. Specific examples of —$Y^1$—$X^1$— include divalent organic groups represented by Formulae (11-1) to (12-3).

—C(CH₃)₂—CH(CH₃)— (11-1)

—C(CH₃)₂—CH₂— (11-2)

—C(CH₃)₂—CH(C₂H₅)— (11-3)

—C(CH₃)₂—C(CH₃)(nC₃H₇)— (11-4)

—C(CH₃)₂—CH₂—CH₂— (12-1)

—C(CH₃)₂—CH₂—CH(CH₃)— (12-2)

—C(CH₃)₂—CH(CH₃)—CH₂— (12-3)

Furthermore, in the compound (I-1), $R^{21}$ is independently more preferably groups represented by Formula (4-1) or (4-2) from the viewpoint of solubility, heat resistance, and steepness of change near the boundary between the visible region and the near-infrared region in the spectral transmittance curve.

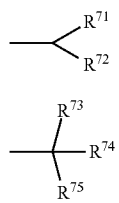

(4-1)

(4-2)

In Formulae (4-1) and (4-2), $R^{71}$ to $R^{75}$ each independently represents a hydrogen atom, a halogen atom, or an alkyl group having 1 to 4 carbon atoms.

In the compound (I-1), $R^{24}$ is preferably —$NR^{27}R^{28}$. As —$NR^{27}R^{28}$, —NH—C(=O)—$R^{29}$ is preferable from the viewpoint of the solubility in a host solvent and in a transparent resin. A compound in which $R^{24}$ is —NH—C(=O)—$R^{29}$ in the compound (I-1) is represented by Formula (I-11).

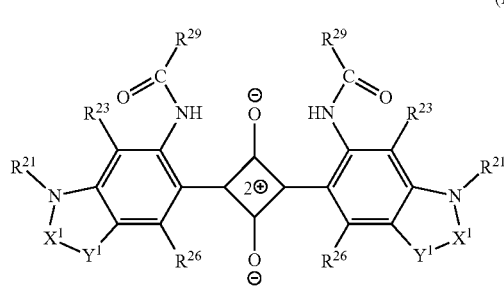

(I-11)

$R^{23}$ and $R^{26}$ in the compound (I-11) are independently preferably a hydrogen atom, a halogen atom, or an alkyl group or alkoxy group having 1 to 6 carbon atoms, and more preferably a hydrogen atom.

In the compound (I-11), $R^{29}$ is preferably an alkyl group having 1 to 20 carbon atoms which may have a substituent, an aryl group having 6 to 10 carbon atoms which may have a substituent, or an araryl group having 7 to 18 carbon atoms, which may have a substituent and may have an oxygen atom between carbon atoms. Examples of the substituents include a halogen atom such as a fluorine atom, a hydroxyl group, a carboxy group, a sulfo group, a cyano group, an alkyl group having 1 to 6 carbon atoms, a fluoroalkyl group having 1 to 6 carbon atoms, an alkoxy group having 1 to 6 carbon atoms, an acyloxy group having 1 to 6 carbon atoms, and the like.

$R^{29}$ is preferably a group selected from: a linear, branched or cyclic alkyl group having 1 to 17 carbon atoms, which may be substituted with a fluorine atom; a phenyl group which may be substituted with a fluoroalkyl group having 1 to 6 carbon atoms and/or an alkoxy group having 1 to 6 carbon atoms; and an araryl group having an alkyl group having 7 to 18 carbon atoms, which may have an oxygen atom between carbon atoms and which may be substituted with a fluorine atom having 1 to 6 carbon atoms at a terminal and/or a phenyl group which may be substituted with an alkoxy group having 1 to 6 carbon atoms.

As $R^{29}$, use can be preferably made of a hydrocarbon group having 5 to 25 carbon atoms, having at least one or more branches, in which one or more hydrogen atoms may be independently substituted with a halogen atom, a hydroxyl group, a carboxy group, a sulfo group, or a cyano group, and which may contain an unsaturated bond, an oxygen atom, or a saturated or unsaturated ring structure between carbon atoms. Examples of such $R^{29}$ include groups represented by the following Formulae (1a), (1b), (2a) to (2e), and (3a) to (3e).

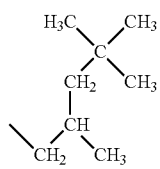

(1a)

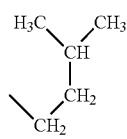

(1b)

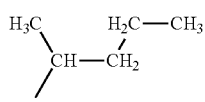

(2a)

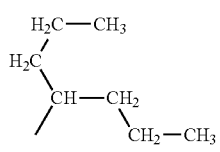

(2b)

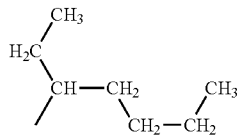

(2c)

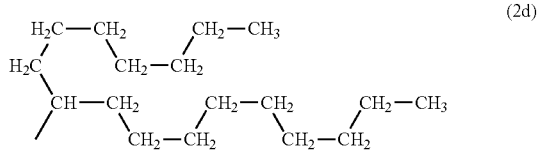

(2d)

-continued (2e)
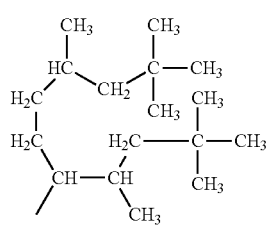

(3a)
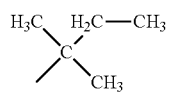

(3b)
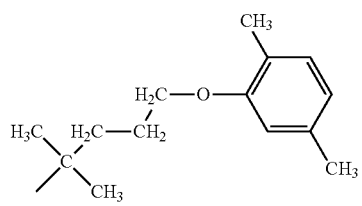

(3c)
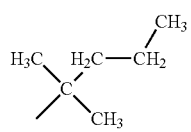

(3d)
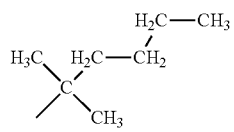

(3e)
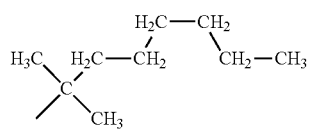

More specific examples of the compound (I-11) include the compounds indicated in Table 10 below. In Table 10, the group (11-1) is indicated as (11-1). The same applies to other groups. In other tables below, the groups are indicated in the same way. Furthermore, in the compounds indicated in Table 10, each symbol has the same meaning on the left and right of the squarylium skeleton. The same applies to the squarylium dyes indicated in the other tables below.

TABLE 10

| | | Substituents | | | |
|---|---|---|---|---|---|
| Dye No | —Y¹—X¹— | $R^{21}$ | $R^{29}$ | $R^{23}$ | $R^{26}$ |
| I-11-1 | (11-1) | —CH₃ | (2b) | H | H |
| I-11-2 | (11-1) | —CH₃ | (2c) | H | H |
| I-11-3 | (11-1) | —CH₃ | (2d) | H | H |
| I-11-4 | (11-1) | —CH₃ | (2e) | H | H |
| I-11-5 | (11-1) | —CH₂CH₃ | (2c) | H | H |
| I-11-6 | (11-1) | —CH₂CH₂CH₃ | (2c) | H | H |
| I-11-7 | (11-1) | —CH(CH₃)₂ | (2c) | H | H |
| I-11-8 | (11-1) | —CH₂CH₃ | (3b) | H | H |
| I-11-9 | (11-1) | —CH₃ | (1b) | H | H |
| I-11-10 | (11-1) | —CH₃ | (2a) | H | H |
| I-11-11 | (11-1) | —CH₃ | (1a) | H | H |
| I-11-12 | (11-1) | —CH₃ | (3a) | H | H |
| I-11-13 | (11-1) | —CH₃ | (3b) | H | H |
| I-11-14 | (11-1) | —CH₃ | (3c) | H | H |
| I-11-15 | (11-1) | —C(CH₃)₂CH₂CH₃ | (2c) | H | H |

TABLE 10-continued

| | | Substituents | | | |
|---|---|---|---|---|---|
| Dye No | —Y¹—X¹— | $R^{21}$ | $R^{29}$ | $R^{23}$ | $R^{26}$ |
| I-11-16 | (11-1) | —C(CH₃)₂CH₂CH₃ | (3b) | H | H |
| I-11-17 | (11-1) | —C(CH₃)₂CH₂CH₃ | (3c) | H | H |
| I-11-18 | (11-1) | —C(CH₃)₂CH₂CH₃ | (3d) | H | H |
| I-11-19 | (11-1) | —C(CH₃)₂CH₂CH₃ | (3e) | H | H |

In the compound (I-1), $R^{24}$ is preferably —NH—SO₂—$R^{30}$ from the viewpoint of increasing the transmittance of visible light, particularly the transmittance of light having a wavelength of 430 to 550 nm. A compound in which $R^{24}$ is —NH—SO₂—$R^{30}$ in the compound (I-1) is represented by Formula (I-12).

(I-12)
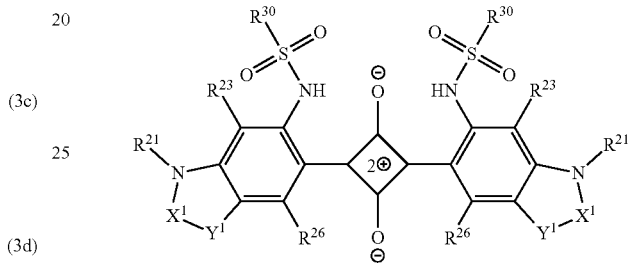

$R^{23}$ and $R^{26}$ in the compound (I-12) are independently preferably a hydrogen atom, a halogen atom, or an alkyl group or alkoxy group having 1 to 6 carbon atoms, and more preferably a hydrogen atom.

In the compound (I-12), $R^{30}$ is independently preferably an alkyl group or alkoxy group having 1 to 12 carbon atoms, which may have a branch, or a hydrocarbon group having 6 to 16 carbon atoms, which has an unsaturated ring structure, from the viewpoint of light resistance. Examples of the unsaturated ring structure include benzene, toluene, xylene, furan, benzofuran, and the like. $R^{30}$ is more independently preferably an alkyl group or alkoxy group having 1 to 12 carbon atoms, which may have a branch. In each group represented by $R^{30}$, some or all of hydrogen atoms may be substituted with a halogen atom, and particularly a fluorine atom. In the case where the present filter includes a transparent substrate, the substitution of a hydrogen atom with a fluorine atom is performed to such an extent that the adhesiveness between the absorption layer containing the dye (I-12) and the transparent substrate is not deteriorated.

Specific examples of $R^{30}$ having an unsaturated ring structure include groups represented by the following Formulae (P1) to (P8).

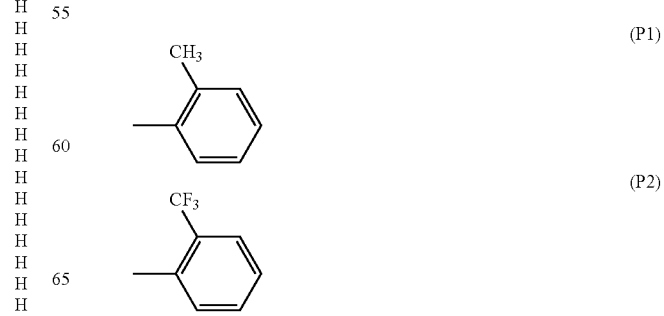

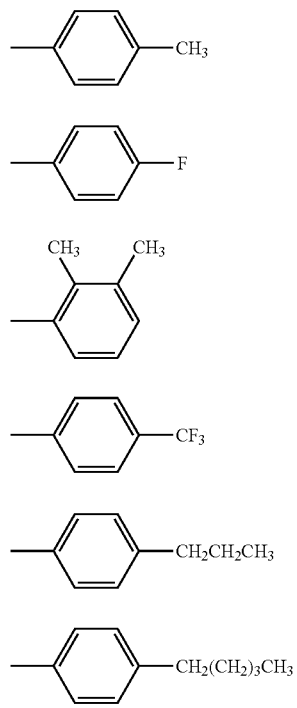

More specific examples of the compound (I-12) include the compounds indicated in Table 11 below.

TABLE 11

| Dye No. | —Y¹—X¹— | R²¹ | R³⁰ | R²³ | R²⁶ |
|---|---|---|---|---|---|
| I-12-1 | (11-1) | —CH₃ | —CH₂(CH₂)₆CH₃ | H | H |
| I-12-2 | (11-1) | —CH₃ | —CF₃ | H | H |
| I-12-3 | (11-1) | —CH₃ | —CF₂(CF₂)₂CF₃ | H | H |
| I-12-4 | (11-1) | —CH₃ | (P2) | H | H |
| I-12-5 | (11-1) | —CH₃ | (P5) | H | H |
| I-12-6 | (11-1) | —CH₃ | (P7) | H | H |
| I-12-7 | (11-1) | —CH₃ | (P8) | H | H |
| I-12-8 | (11-1) | —CH₃ | (P6) | H | H |
| I-12-9 | (11-1) | —CH(CH₃)₂ | —CF₃ | H | H |
| I-12-10 | (11-1) | —CH(CH₃)₂ | —CH(CH₃)₂ | H | H |
| I-12-11 | (11-1) | —CH(CH₃)₂ | (P4) | H | H |
| I-12-12 | (11-1) | —CH(CH₃)₂ | (P3) | H | H |
| I-12-13 | (11-1) | —CH(CH₃)₂ | —CH₂CH₂CH₃ | H | H |
| I-12-14 | (11-1) | —CH(CH₃)₂ | (P7) | H | H |
| I-12-15 | (11-1) | —CH(CH₃)₂ | —CH₂(CH₂)₆CH₃ | H | H |
| I-12-16 | (11-1) | —CH(CH₃)₂ | (P6) | H | H |
| I-12-17 | (11-1) | —CH(CH₃)₂ | —CF₂(CF₂)₂CF₃ | H | H |
| I-12-18 | (11-1) | —CH(CH₃)₂ | (P1) | H | H |
| I-12-19 | (11-1) | —CH(CH₃)₂ | (P8) | H | H |
| I-12-20 | (11-1) | —C(CH₃)₂CH₂CH₃ | —CH₂(CH₂)₆CH₃ | H | H |
| I-12-21 | (11-1) | —C(CH₃)₂CH₂CH₃ | —CF₃ | H | H |
| I-12-22 | (11-1) | —C(CH₃)₂CH₂CH₃ | —CF₂(CF₂)₂CF₃ | H | H |
| I-12-23 | (11-4) | —CH(CH₃)₂ | —CH₂(CH₂)₆CH₃ | H | H |
| I-12-24 | (11-4) | —CH(CH₃)₂ | —CH₂(CH₂)₂CH₃ | H | H |

Examples of the compound (II) include compounds represented by any of Formulae (I-1) to (II-3).

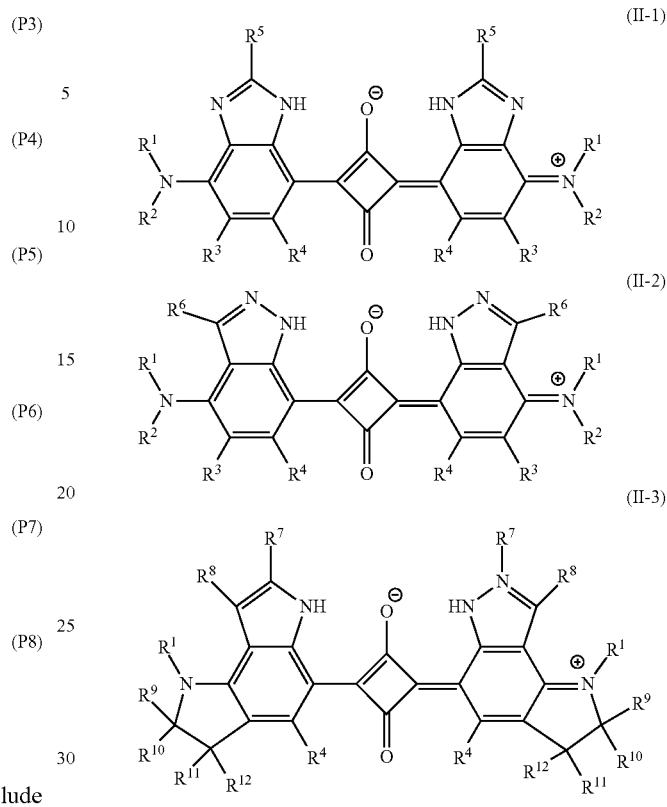

Here, in Formulae (II-1) and (II-2), $R^1$ and $R^2$ each independently represents a hydrogen atom, a halogen atom, or an alkyl group having 1 to 15 carbon atoms, which may have a substituent, and $R^3$ to $R^6$ each independently represents a hydrogen atom, a halogen atom, or an alkyl group having 1 to 10 carbon atoms, which may have a substituent.

Here, in Formula (11-3), $R^1$, $R^4$, and $R^9$ to $R^{12}$ each independently represents a hydrogen atom, a halogen atom, or an alkyl group having 1 to 15 carbon atoms, which may have a substituent, and $R^7$ and $R^8$ each independently represents a hydrogen atom, a halogen atom, or an alkyl group having 1 to 5 carbon atoms, which may have a substituent.

$R^1$ and $R^2$ in the compound (II-1) and the compound (II-2) are independently preferably an alkyl group having 1 to 15 carbon atoms and more preferably an alkyl group having 7 to 15 carbon atoms, it is further preferable that at least one of $R^1$ and $R^2$ is an alkyl group having a branched chain having 7 to 15 carbon atoms, and it is particularly preferable that both $R^1$ and $R^2$ are an alkyl group having branched chains having 8 to 15 carbon atoms, from the viewpoint of solubility in a transparent resin, visible light transmittance, and the like.

$R^3$ is independently preferably a hydrogen atom, a halogen atom or an alkyl group having 1 to 3 carbon atoms, and more preferably a hydrogen atom, a halogen atom or a methyl group, from the viewpoint of solubility in a transparent resin, visible light transmittance, and the like. $R^4$ is preferably a hydrogen atom or a halogen atom, and particularly preferably a hydrogen atom, from the viewpoint of steepness of change near the boundary between the visible region and the near-infrared region. $R^5$ in the compound (II-1) and $R^6$ in the compound (II-2) are independently preferably a hydrogen atom, a halogen atom, or an alkyl group having 1 to 5 carbon atoms, which may be substituted with a halogen atom, and more preferably a hydrogen atom, a halogen atom or a methyl group.

More specific examples of the compound (II-1) and the compound (II-2) include the compounds indicated in Table 12 and Table 13 below. In Table 12 and Table 13, —$C_8H_{17}$, —$C_4H_9$ and —$C_6H_{13}$ represent a linear octyl group, butyl group and hexyl group, respectively.

TABLE 12

| Dye No. | Substituents | | | | |
|---|---|---|---|---|---|
| | $R^1$ | $R^2$ | $R^3$ | $R^4$ | $R^5$ |
| II-1-1 | —$CH_2CH(C_2H_5)(C_4H_9)$ | —$CH_2CH(C_2H_5)(C_4H_9)$ | H | H | H |
| II-1-2 | —$CH_2CH(C_2H_5)(C_4H_9)$ | —$CH_2CH(C_2H_5)(C_4H_9)$ | H | H | —$C(CH_3)_3$ |
| II-1-3 | —$CH_2CH(C_2H_5)(C_4H_9)$ | —$CH_2CH(C_2H_5)(C_4H_9)$ | H | H | —$CF_3$ |
| II-1-4 | —$CH_2CH(C_2H_5)(C_4H_9)$ | —$CH_2CH(C_2H_5)(C_4H_9)$ | H | H | —$CH_3$ |
| II-1-5 | —$CH_2CH(C_2H_5)(C_4H_9)$ | —$CH_2CH(C_2H_5)(C_4H_9)$ | H | H | —$C_8H_{17}$ |
| II-1-6 | —$(CH_2)_2CH(CH_3)_2$ | —$(CH_2)_2CH(CH_3)_2$ | H | H | H |
| II-1-7 | —$CH_2CH(CH_3)_2$ | —$CH_2CH(CH_3)_2$ | H | H | H |
| II-1-8 | —$CH_2CH(C_2H_5)(C_4H_9)$ | $C_2H_5$ | H | H | H |
| II-1-9 | —$(CH_2)_5CH_3$ | —$(CH_2)_3CH_3$ | H | H | H |
| II-1-10 | —$CH_2CH(C_2H_5)(C_6H_{13})$ | —$CH_2CH(C_2H_5)(C_6H_{13})$ | H | H | H |

TABLE 13

| Dye No. | Substituents | | | | |
|---|---|---|---|---|---|
| | $R^1$ | $R^2$ | $R^3$ | $R^4$ | $R^6$ |
| II-2-1 | —$(CH_2)_2CH(CH_3)_2$ | —$(CH_2)_2CH(CH_3)_2$ | H | H | H |
| II-2-2 | —$CH_2CH(C_2H_5)(C_4H_9)$ | —$CH_2CH(C_2H_5)(C_4H_9)$ | H | H | H |
| II-2-3 | —$CH_2CH(CH_3)_2$ | —$CH_2CH(CH_3)_2$ | H | H | H |
| II-2-4 | —$CH_2CH(C_2H_5)(C_6H_{13})$ | —$CH_2CH(C_2H_5)(C_6H_{13})$ | H | H | H |

$R^1$ in the compound (II-3) is independently preferably an alkyl group having 1 to 15 carbon atoms, more preferably an alkyl group having 1 to 10 carbon atoms, and particularly preferably an ethyl group or an isopropyl group, from the viewpoint of solubility in a transparent resin, visible light transmittance, and the like.

$R^4$ is preferably a hydrogen atom or a halogen atom, and particularly preferably a hydrogen atom, from the viewpoint of visible light transmittance and ease of synthesis. $R^7$ and $R^8$ are independently preferably a hydrogen atom, a halogen atom, or an alkyl group having 1 to 5 carbon atoms, which may be substituted with a halogen atom, and more preferably a hydrogen atom, a halogen atom or a methyl group.

$R^9$ to $R^{12}$ are independently preferably a hydrogen atom, a halogen atom, or an alkyl group having 1 to 5 carbon atoms, which may be substituted with a halogen atom. Examples of —$CR^9R^{10}$—$CR^{11}R^{12}$— include the above-described groups (11-1) to (11-3) and a divalent organic group represented by the following Formula (11-5).

$$—C(CH_3)(CH_2—CH(CH_3)_2)—CH(CH_3)— \quad (11\text{-}5)$$

More specific examples of the compound (II-3) include the compounds indicated in Table 14 below.

TABLE 14

| Dye No. | Substituents | | | | |
|---|---|---|---|---|---|
| | —$R^9R^{10}$—$CR^{11}R^{12}$— | $R^1$ | $R^4$ | $R^7$ | $R^8$ |
| II-3-1 | (11-1) | —$C_2H_5$ | H | H | H |
| II-3-2 | (11-5) | —$C_2H_5$ | H | H | H |
| II-3-3 | (11-1) | —$CH(CH_3)_2$ | H | H | —$CH_3$ |

Examples of the compound (III) include compounds represented by any of Formulae (III-1) and (III-2).

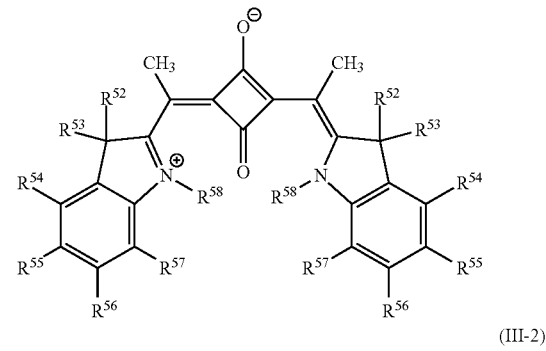

(III-1)

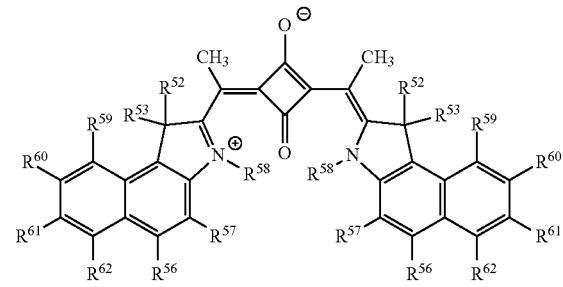

(III-2)

Here, in (II-1) and (III-2), $R^{52}$ to $R^{62}$ each independently represents a hydrogen atom, a halogen atom, or an alkyl group having 1 to 10 carbon atoms, which may have a substituent.

$R^{52}$ and $R^{53}$ in the compounds (III-1) and (III-2) are independently preferably a hydrogen atom, a halogen atom, or an alkyl group having 1 to 6 carbon atoms, which may be substituted with a halogen atom, and more preferably a hydrogen atom, a halogen atom or a methyl group. $R^{58}$ is preferably a hydrogen atom, a halogen atom, or an alkyl group having 1 to 6 carbon atoms, which may be substituted with a halogen atom, and more preferably an alkyl group having 1 to 3 carbon atoms from the viewpoint of ease of synthesis. $R^{56}$, $R^{57}$ and $R^{59}$ to $R^{62}$ are each independently preferably a hydrogen atom, a halogen atom, or an alkyl group having 1 to 6 carbon atoms, which may have a substituent, and more preferably a hydrogen atom from the viewpoint of ease of synthesis. More specific examples of the compound (III-1) and the compound (III-2) include the compounds indicated in Table 15 and Table 16 below.

TABLE 15

| Dye No. | Substituents | | | | | | |
|---|---|---|---|---|---|---|---|
| | $R^{52}$ | $R^{53}$ | $R^{54}$ | $R^{55}$ | $R^{56}$ | $R^{57}$ | $R^{58}$ |
| III-1-1 | —CH$_3$ | —CH$_3$ | H | H | H | H | H |
| III-1-2 | —CH$_3$ | —CH$_2$CH(CH$_3$)$_2$ | H | —CH$_3$ | H | H | H |

TABLE 16

| Dye No. | Substituents | | | | | | | |
|---|---|---|---|---|---|---|---|---|
| | $R^{52}$ | $R^{53}$ | $R^{56}$ | $R^{57}$ | $R^{58}$ | $R^{59}$ | $R^{60}$ | $R^{61}$ | $R^{62}$ |
| III-2-1 | —CH$_3$ | —CH$_3$ | H | H | H | H | H | H | H |

The dye (D) may be formed of one kind of compound or may be formed of two or more kinds of compounds. In the case where the dye (D) is formed of two or more kinds of compounds, each compound does not necessarily have the property of the dye (D), and it is sufficient to satisfy the property of the dye (D) as a mixture.

The compounds (I) to (III) can be produced by known methods. Regarding the compound (I), the compound (I-11) can be produced, for example, by a method disclosed in U.S. Pat. No. 5,543,086. The compound (I-12) can be produced, for example, by methods disclosed in US Patent Application Publication No. 2014/0061505 and International Publication No. WO 2014/088063. The compound (II) can be produced by a method disclosed in International Publication No. WO 2017/135359.

Specific examples of UV dyes include an oxazole-based dye, a merocyanine-based dye, a cyanine-based dye, a naphthalimide-based dye, an oxadiazole-based dye, an oxazine-based dye, an oxazolidine-based dye, a naphthalic acid-based dye, a styryl-based dye, an anthracene-based dye, a cyclic carbonyl-based dye, a triazole-based dye, and the like. Among these, an oxazole-based dye or a merocyanine-based dye is preferable. Furthermore, the UV dye may be used alone or two or more kinds thereof may be used in combination in the absorption layer.

As the transparent resin, a transparent resin satisfying (i-3) in relation to the dye (A), preferably, a transparent resin further satisfying (i-4) is used.

As the transparent resin, depending on the kind of the dye (A), for example, use can be made of one or more kinds selected from an acrylic resin, an epoxy resin, an ene-thiol resin, a polycarbonate resin, a polyether resin, a polyarylate resin, a polysulfone resin, a polyether sulfone resin, a polyparaphenylene resin, a polyarylene ether phosphine oxide resin, a polyimide resin, a polyamideimide resin, a polyolefin resin, a cyclic olefin resin, a polyester resin, and the like.

The transparent resin preferably contains a resin having at least one bond selected from an ester bond, a carbonate bond and an imide bond in a main chain. The transparent resin having these bonds in the main chain is superior in that it maintains a high visible transmittance when mixed with a dye and is excellent in heat resistance of the resin itself.

Among these, the transparent resin is preferably a polyester resin, a polycarbonate resin, a polyimide resin, or an acrylimide resin. These resins may be used alone or two or more kinds thereof may be used in combination. In the case where the dye (A) is a dye (ACi) to a dye (ACiv), a dye (ASi) or a dye (ASii), a polyester resin, a polycarbonate resin, a polyimide resin, and an acrylimide resin are particularly preferable.

A commercially available product may be used as the transparent resin. Examples of the commercially available products include OKP4HT, OKP4, B-OKP2, OKP-850 (all of which are produced by Osaka Gas Chemicals Co., Ltd., trade name), Byron (registered trademark) 103 (produced by Toyobo Co., Ltd., trade name), and the like, as the polyester resins.

Examples of the polycarbonate resin include LeXan (registered trademark) ML9103 (produced by SABIC, trade name), EP5000 (produced by Mitsubishi Gas Chemical Company, Inc., trade name), SP3810 (produced by Teijin Limited., trade name), SP1516 (produced by Teijin Limited., trade name), TS2020 (produced by Teijin Limited., trade name), xylex (registered trademark) 7507 (produced by SABIC, trade name), and the like.

Examples of the polyimide resin include Neopulim (registered trademark)C-3650 (produced by Mitsubishi Gas Chemical Company, Inc., trade name), Neopulim C-3G30 (produced by Mitsubishi Gas Chemical Company, Inc., trade name), Neopulim C-3450 (produced by Mitsubishi Gas Chemical Company, Inc., trade name), JL-20 (produced by New Japan Chemical co., ltd., trade name), FPC-0220 (produced by Mitsubishi Gas Chemical Company, Inc., trade name) (these polyimide resins may contain silica), and the like. Examples of the acrylic imide resin include PLEX-IMID8817 (produced by Daicel-Evonik Ltd., trade name) and the like.

From the viewpoint of the transparency and the solubility of the dye (A) and further the dye (D), and the heat resistance, the transparent resin is preferably a resin having a high glass transition point (Tg), for example, a resin having a Tg of 140° C. or higher.

Within a range that does not impair the effects of the present invention, the absorption layer may further contain optional components, such as an adhesion promoter, a color correction dye, a leveling agent, an antistatic agent, a heat stabilizer, a light stabilizer, an antioxidant, a dispersant, a flame retardant, a lubricant, and a plasticizer.

In the case where the absorption layer contains the dye (A) having the features (i-1) to (i-3) and the transparent resin, and further contains the dye (D), it is preferable to satisfy the following (ii-1) to (ii-3) in the spectral transmittance curve at an incident angle of 0 degree.

(ii-1) The absorption layer has a wavelength $\lambda_{ABSHT20\text{-}0°}$ that is a shorter wavelength of the wavelengths showing the transmittance of 20%, being in the wavelength range of 655 to 675 nm.

(ii-2) The absorption layer has an average transmittance $T_{AB435\text{-}630ave0°}$ of light having a wavelength of 435 to 630 nm, being 65% or more.

(ii-3) The absorption layer has an average transmittance $T_{AB850\text{-}1,100ave0°}$ of light having a wavelength of 850 to 1,100 nm, being 70% or lower.

The wavelength $\lambda_{ABSHT20\text{-}0°}$ in (ii-1) is preferably in the wavelength range of 655 to 670 nm, and more preferably in the wavelength range of 655 to 665 nm. For example, in the case where the present filter has a transparent substrate and the transparent substrate is a near-infrared-absorbing glass, the wavelength $\lambda_{ABSHT20\text{-}0°}$ is adjusted to about +5 to 20 nm from the above-mentioned preferable range in accordance with the absorption of the near-infrared-absorbing glass. That is, the wavelength $\lambda_{ABSHT20\text{-}0°}$ in this case is preferably in the wavelength range of 660 to 675 nm, and more preferably in the wavelength range of 665 to 675 nm.

The average transmittance $T_{AB435\text{-}630ave0°}$ in (ii-2) is preferably 70% or more, and more preferably 80% or more. The average transmittance $T_{AB850\text{-}1,100ave0°}$ in (ii-3) is preferably 60% or lower, and more preferably 45% or lower.

The content of the dye (A) in the absorption layer is appropriately set according to the design of the present filter so that the effect of the present filter can be exhibited. The content of the dye (A) in the absorption layer is preferably 1 to 15 parts by mass with respect to 100 parts by mass of the transparent resin from the viewpoint of shielding near-infrared light, particularly near-infrared light in a long wavelength region while securing the transmittance of visible light, and more preferably 1 to 8 parts by mass from the viewpoint of the solubility.

In the case where two or more kinds selected from the dye S, the dye M and the dye L are used in the dye (A), the content of each dye is preferably 1 to 15 parts by mass with respect to 100 parts by mass of the transparent resin, and more preferably 2 to 13 parts by mass from the viewpoint of the solubility when the total content of the entire dye (A) is within the above-mentioned range.

In the case where the absorption layer contains the dye (A) and the dye (D), the contents of the dyes are each appropriately selected such that the absorption layer satisfies the features (ii-1) to (ii-3) depending on the design of the present filter.

In this case, the content of the dye (A) in the absorption layer is the same as above, and the content of the dye (D) is preferably 1 to 15 parts by mass with respect to 100 parts by mass of the transparent resin from the viewpoint of exhibiting the property of the dye (D) while ensuring the transmittance of visible light, and more preferably 3 to 14 parts by mass, from the viewpoint of the solubility. Furthermore, the total content of the dye (A) and the dye (D) is preferably 2 to 30 parts by mass with respect to 100 parts by mass of the transparent resin, and more preferably 5 to 27 parts by mass, from the viewpoint of the solubility.

In the present filter, the absorption layer preferably has a thickness of 0.1 to 100 µm. In the case where the absorption layer is formed of a plurality of layers, the total thickness of each layer is preferably 0.1 to 100 m. In the case where the thickness is less than 0.1 µm, the desired optical properties may not be sufficiently exhibited, and in the case where the thickness exceeds 100 µm, the flatness of the layer may be deteriorated and the in-plane variation of the absorptance may occur. The thickness of the absorption layer is more preferably 0.3 to 50 m. In addition, in the case where other functional layers such as a reflection layer and an antireflection layer are provided, if the absorption layer is excessively thick, cracks or the like may occur depending on the material. Therefore, the thickness of the absorption layer is more preferably 0.3 to 10 µm.

The absorption layer can be formed, for example, in such a manner that the dye (A), preferably the dye (A) and the dye (D), the transparent resin or a raw material component of the transparent resin, and each component as necessary are blended are dissolved or dispersed in a solvent to prepare a coating liquid, and the coating liquid is applied to a substrate, dried, and cured as necessary. The substrate may be a transparent substrate included in the present filter or a peelable substrate used only when forming the absorption layer. The solvent may be any dispersion medium in which the dye can be stably dispersed or any solvent in which the dye can be dissolved.

In addition, the coating liquid may contain a surfactant for the purpose of improving voids caused by minute bubbles, recesses caused by adhesion of foreign substances or the like, repellency during a drying step, and the like. Furthermore, for applying the coating liquid, for example, a dip coating method, a cast coating method, a spin coating method, or the like can be used. The coating liquid is applied onto the substrate and then dried to form the absorption layer. In the case where the coating liquid contains the raw material component of the transparent resin, a curing treatment such as heat curing or photocuring is further performed.

The absorption layer can also be produced in a film shape by extrusion molding, and this film may be laminated on another member and integrated by thermocompression bonding or the like. For example, in the case where the present filter includes a transparent substrate, this film may be attached on the transparent substrate.

There may be only one layer of the absorption layer or may be two or more layers of the absorption layers in the present filter. In the case where there are two or more layers of the absorption layers, the structure of the layers may be the same as or different from each other. Taking the case where the absorption layer contains the dye (A), the dye (D) and the UV dye as an example, one layer may be a near-infrared absorption layer containing the dye (A), the dye (D) and a transparent resin, and the other layer may be a near-ultraviolet absorption layer containing the UV dye and the transparent resin. As another example, one layer may be a first near-infrared absorption layer containing the dye (D) and the transparent resin, and the other layer may be a second near-infrared absorption layer containing the dye (A), the UV dye and the transparent resin. Furthermore, the absorption layer may itself function as a substrate (resin substrate).

(Transparent Substrate)

In the case where a transparent substrate is used for the present filter, the transparent substrate is not particularly limited in its constituent material as long as it transmits visible light of approximately 400 to 700 nm, and may be a material that absorbs near-infrared light or near ultraviolet light. Examples thereof include an inorganic material such as glass and crystal, and an organic material such as a transparent resin.

Examples of the glass that can be used for the transparent substrate include absorptive glass (near-infrared absorption glass) containing copper ions in fluorophosphate glass or in phosphate glass, soda lime glass, borosilicate glass, alkali-free glass, quartz glass, and the like. The "phosphate glass" also includes a silicophosphate glass in which a part of the skeleton of the glass of the phosphate glass is made of $SiO_2$.

As the glass, use can be made of a chemically strengthened glass obtained by exchanging alkali metal ions (for example, Li ion and Na ion) having a small ionic radius existing on the glass plate main surface with alkali ions (for example, Na ion or K ion for Li ion, and K ion for Na ion) having a larger ionic radius by ion exchange at a temperature not higher than the glass transition point.

Examples of the transparent resin material that can be used as the transparent substrate include a polyester resin such as polyethylene terephthalate and polybutylene terephthalate, a polyolefin resin such as polyethylene, polypropylene and an ethylene vinyl acetate copolymer, an acrylic resin such as a norbornene resin, polyacrylate and polymethylmethacrylate, a urethane resin, a vinyl chloride resin, a fluororesin, a polycarbonate resin, a polyvinyl butyral resin, a polyvinyl alcohol resin, a polyimide resin, and the like.

In addition, examples of the crystal material that can be used for the transparent substrate include birefringent crystals such as quartz, lithium niobate and sapphire. The optical characteristics of the transparent substrate may have the above-mentioned optical characteristics as an optical filter obtained by laminating with the absorption layer, the reflection layer and the like. Sapphire is preferable as the crystal material.

The transparent substrate is preferably an inorganic material, and particularly preferably glass and sapphire, from the viewpoint of shape stability related to long-term reliability of optical characteristics, mechanical characteristics and the like as an optical filter, from the viewpoint of handleability during filter manufacturing, and the like.

The shape of the transparent substrate is not particularly limited, and may be a block shape, a plate shape or a film shape, and the thickness thereof is preferably 0.03 to 5 mm, and is more preferably 0.03 to 0.5 mm from the viewpoint of thinning. From the viewpoint of workability, a transparent substrate formed of glass and having a plate thickness of 0.05 to 0.5 mm is preferable.

(Reflection Layer)

The reflection layer is formed of a dielectric multilayer film and has a function of shielding light in a specific wavelength range. Examples of the reflection layer include those having wavelength selectivity that transmits visible light and mainly reflects light having a wavelength other than the light-shielding region of the absorption layer. The reflection layer preferably has a reflection region that reflects near-infrared light. In this case, the reflection region of the reflection layer may include a light-shielding region in the near-infrared region of the absorption layer. The reflection layer is not limited to the above-mentioned characteristics, and may be appropriately designed to have a specification that further shields light in a predetermined wavelength range, for example, near ultraviolet region.

In the case where the reflection layer has a reflection region that reflects near-infrared light, it is preferable that the reflection layer specifically satisfies the following (iii-1).

(iii-1) The reflection layer has an average transmittance $T_{RE850-1,100ave0°}$ of light having a wavelength of 850 to 1,100 nm being 0.2% or less in a spectral transmittance curve at an incident angle of 0 degree.

The average transmittance $T_{RE850-1,100ave0°}$ is preferably 0.15% or less, and more preferably 0.05% or less.

In the case where the reflection layer has a reflection region that reflects the near-infrared light, the absorption layer and the reflection layer preferably have the following relationship.

A relationship between a wavelength $\lambda_{ABSHT\ 20-0°}$ that is a shorter wavelength of the wavelengths showing a transmittance of 20% for light having an incident angle of 0 degree in the absorption layer and a wavelength $\lambda_{RESHT\ 20-0°}$ that is a short wavelength of the wavelengths showing a transmittance of 20% for light having an incident angle of 0 degree in the reflection layer preferably satisfies (iii-2).

$$\lambda_{ABSHT20-0°}+30\ nm \leq \lambda_{RESHT20-0°} < 790\ nm \quad \text{(iii-2)}$$

It is preferable that the reflection layer further satisfies (iii-3).

(iii-3) The reflection layer has an average transmittance of 10% or less in light in the wavelength range from $\lambda_{RESHT20-0°}$ to $\lambda_{RESHT20-0°}+300$ nm.

The reflection layer is formed of a dielectric multilayer film in which a low refractive index dielectric film (low refractive index film) and a high refractive index dielectric film (high refractive index film) are alternately laminated. The high refractive index film preferably has a refractive index of 1.6 or more, and more preferably 2.2 to 2.5. Examples of the material of the high refractive index film include $Ta_2O_5$, $TiO_2$ and $Nb_2O_5$. Among them, $TiO_2$ is preferable from the viewpoints of film formability, reproducibility in refractive index or the like, stability, and the like.

On the other hand, the low refractive index film preferably has a refractive index of less than 1.6, and more preferably 1.45 or more and less than 1.55. Examples of the material of the low refractive index film include $SiO_2$, $SiO_xN_y$, and the like. From the viewpoints of reproducibility in film formability, stability, economy, and the like, $SiO_2$ is preferable.

Furthermore, it is preferable that the reflection layer has a steeply change in transmittance in a boundary wavelength region between the transmission region and the light shielding region. For this purpose, the total number of laminated dielectric multilayer films constituting the reflection layer is preferably 15 or more, more preferably 25 or more, and further preferably 30 or more. However, when the total number of laminated layers increases, warpage or the like may occur and the film thickness increases. Therefore, the total number of laminated layers is preferably 100 layers or less, more preferably 75 layers or less, and even more preferably 60 layers or less. The thickness of the dielectric multilayer film is preferably 2 to 10 m.

In the case where the total number of laminated layers and the film thickness of the dielectric multilayer film are within the above-described ranges, the reflection layer satisfies the requirements for downsizing, and the incident angle dependency can be suppressed while maintaining high productivity. For forming the dielectric multilayer film, for example, a vacuum film forming process such as a CVD method, a sputtering method, and a vacuum vapor deposition method, a wet film forming process such as a spray method or a dip method, or the like can be used.

There may be one layer (a group of dielectric multilayer films) of the reflection layer to provide predetermined optical characteristics or two layers of the reflection layers to provide predetermined optical characteristics. In the case where there are two or more layers of the reflection layers, the reflection layers may have the same structure as or different structures from each other. In the case where two or more reflection layers are provided, it is usually formed of a plurality of reflection layers having different reflection bands.

As an example, in the case where two reflection layers are provided, one may be a near-infrared reflection layer that shields light in a short wavelength band in the near-infrared region, and the other may be a near-infrared/near-ultraviolet reflection layer that shields light in both regions of a long wavelength band of the near-infrared region and a near-ultraviolet region. Furthermore, for example, in the case where the present filter has a transparent substrate and two or more reflection layers are provided, all of layers may be provided on one main surface of the transparent substrate or may be provided on both main surface with the transparent substrate sandwiched therebetween.

(Antireflection Layer)

Examples of the antireflection layer include a dielectric multilayer film, an intermediate refractive index medium, a moth-eye structure in which the refractive index gradually changes, and the like. Among them, the dielectric multilayer film is preferable from the viewpoint of optical efficiency and productivity. The antireflection layer can be obtained by alternately stacking dielectric films as in the reflection layer.

The present filter may include, as other constituent elements, for example, constituent elements (layers) that give absorption by inorganic fine particles or the like that control transmission and absorption of light in a specific wavelength range. Specific examples of the inorganic fine particles include Indium Tin Oxides (ITO), Antimony-doped Tin Oxides (ATO), cesium tungstate, lanthanum boride, and the like. The ITO fine particles and the cesium tungstate fine particles have a high visible light transmittance and have a light absorptivity over a wide range of an infrared wavelength region exceeding 1,200 nm, and thus can be used in the case where such infrared light shielding properties are required.

Since the present filter includes the reflection layer and the absorption layer containing the dye (A), it is possible to obtain an optical filter having excellent shielding properties of near-infrared light, particularly the shielding properties of long-wavelength near-infrared light while maintaining excellent visible light transmittance.

The present filter preferably satisfies the following (iv-2) to (iv-5) when the absorption layer contains the dye (A).

(iv-2) The present filter has an average transmittance $T_{850-1,100ave0°}$ of light having a wavelength of 850 to 1,100 nm at an incident angle of 0 degree being 0.2% or less. The average transmittance $T_{850-1,100ave0°}$ is preferably 0.15% or less, and more preferably 0.10% or less.

(iv-3) The present filter has an average transmittance $T_{435-630ave0°}$ of light having a wavelength of 435 to 630 nm at an incident angle of 0 degree being 65% or more. The average transmittance $T_{435-630ave0°}$ is preferably 70% or more, and more preferably 75% or more.

(iv-4) The present filter has an average transmittance $T_{850-1,100ave30°}$ of light having a wavelength of 850 to 1,100 nm at an incident angle of 30 degree being 2% or less. The average transmittance $T_{850-1,100ave30°}$ is preferably 1% or less, and more preferably 0.05% or less.

(iv-5) The present filter has a maximum transmittance $T_{850-1,100max30°}$ of light having a wavelength of 850 to 1,100 nm at an incident angle of 30 degree being 5% or less. The maximum transmittance $T_{850-1,100max30°}$ is preferably 3% or less, and more preferably 2% or less.

The present filter preferably satisfies the optical characteristics of the following (iv-1) in the case where the absorption layer further contains the dye (D).

(iv-1) In the present filter, an average value of the absolute values of the differences in the transmittances in the spectral transmittance curves at the incident angle of 0 degree and the incident angle of 30 degrees is 2%/nm or less in the wavelength range of 615 to 725 nm. It is preferably 1.5%/nm or less, and more preferably 1.0%/nm or less.

The present filter is excellent in the visible light transmittance and the shielding properties of near-infrared light, particularly the shielding properties of long-wavelength near-infrared light. The present filter is useful, for example, as an optical filter for an imaging apparatus in a machine having both an imaging apparatus such as a digital still camera and an optical component that uses laser light. An imaging apparatus using the present filter contains a solid-state image-sensing device, an imaging lens and the present filter. The present filter can be used, for example, by being disposed between the imaging lens and the solid-state image-sensing device or directly attached to the solid-state image-sensing device, the imaging lens or the like of the imaging apparatus via an adhesive layer.

EXAMPLES

Next, the present invention will be described more specifically by way of Examples. First, synthesis examples and characteristics of the dyes (A) and the dye (D) used in the absorption layers of Examples will be described. Next, Examples of the optical filter will be described.

Test Examples 1 to 54: Synthesis and Evaluation of Dyes and Preparation and Evaluation of Absorption Layer (Synthesis and Evaluation of Dyes)

Among dyes (A) for Examples, as a dye (ACi1-1B), a dye (ACi1-2B), a dye (ACii2-2B), a dye (ACiii2-9B), and a dye (ACii3-9B), commercially available products, S0772, S2437 and S2007, produced by Few Chemicals, trade name, and S1984 and S1985, produced by Spectrum info, trade name, were prepared, respectively.

In addition, as the dye (A), a dye (ACii1-1P), a dye (ACii1-1B), a dye (ACii2-1P), a dye (ACii2-1B), a dye (ACiii1-2P), a dye (ACiii2-2P), Dye (ACiv-2P), a dye (ACiv-26P), a dye (ASi-1), a dye (ASi-2), and a dye (ASii-2) were synthesized by the following method.

Furthermore, as the dye (D), a dye (I-12-24) was synthesized by an ordinary method.

Furthermore, as dyes for Comparative Examples, TXEX910B (produced by Nippon Shokubai Co., Ltd., a phthalocyanine dye) and Dim01 (diimonium dye) represented by the following formula, which was synthesized by the method disclosed in JP-A-2014-25016, were prepared. An ultraviolet-visible spectrophotometer (U-4150 model, manufactured by Hitachi High-Tech Corporation.) was used to evaluate the optical characteristics of these dyes, and similarly, U-4150 was used to evaluate the following optical characteristics (spectral transmittance curve).

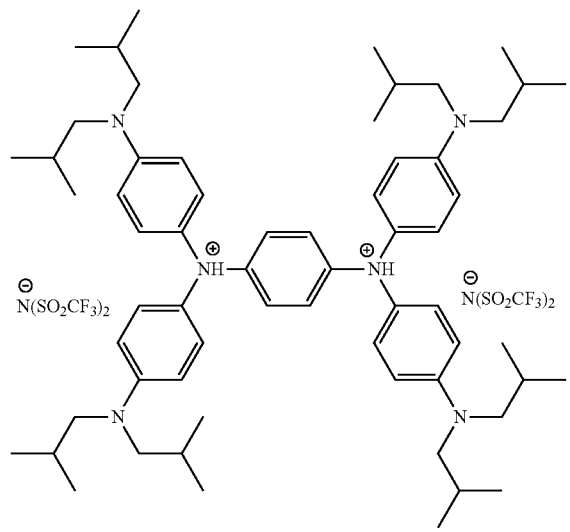

(1) Production of Dye (ACii1-1P)

A dye (ACii1-1P) was synthesized according to a reaction route described below.

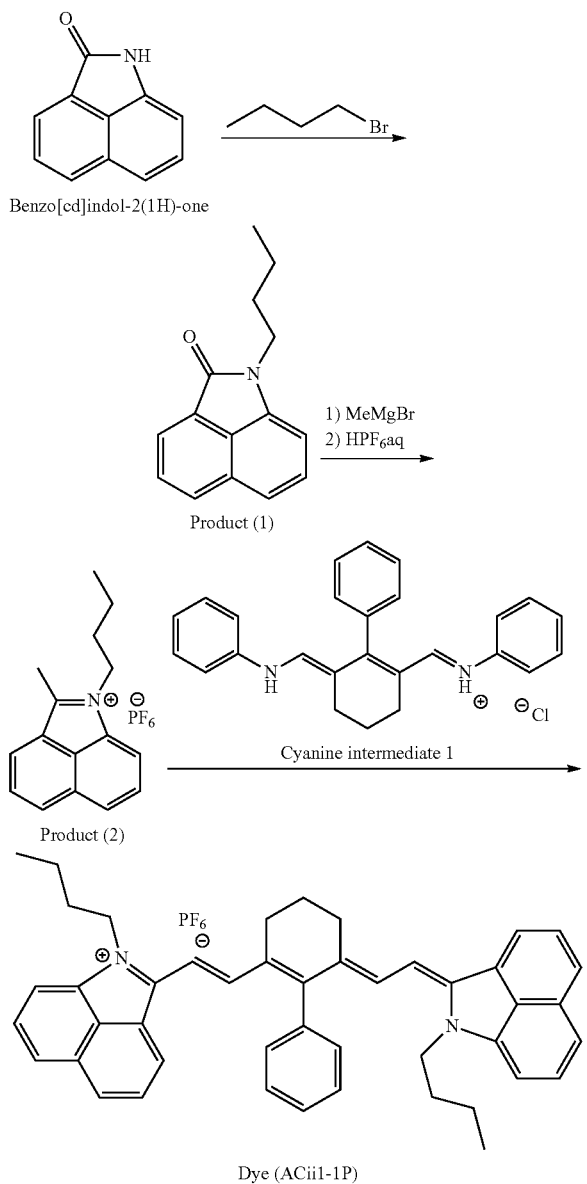

<Step 1>

Benzo [cd] indole-2 (1H)-one (16 g, 94 mmol), potassium iodide (4 g, 24 mmol), and N,N-dimethyl-4-aminopyridine (2 g, 16 mmol) were charged into a 1 L-eggplant flask, and sulfolane (250 mL) was added to dissolve the mixture and stirred at 70° C. for 2 hours. To the suspension were added 1-bromobutane (35 g, 255 mmol) and potassium hydroxide (15 g, 260 mmol), and the mixture was stirred at 70° C. for 19 hours. After completion of the reaction, an extraction work was performed with an organic solvent obtained by mixing hexane:ethyl acetate=4:1, the solvent was removed, and then a yellow oily substance was isolated as a product (1) (20.3 g, 96% yield) by flash column chromatography (hexane:ethyl acetate=8:2).

<Step 2>

The product (1) (5 g, 22 mmol) obtained in Step 1 was charged into a 300 mL-eggplant flask and dissolved in 50 mL of tetrahydrofuran. Under nitrogen atmosphere, 100 mL of 1 M methyl magnesium bromide was added dropwise at 0° C., and the temperature was raised to room temperature, followed by stirring for 12 hours. After checking the disappearance of the raw materials by using thin layer chromatography (TLC), the reaction solution was slowly poured into a beaker containing 200 mL of ice water, and then 50 g of a 60% hexafluorophosphoric acid aqueous solution was added, followed by stirring at room temperature for 1 hour. After an extraction with dichloromethane, the water solvent was removed with anhydrous magnesium sulfate, and the organic solvent was removed. After that, a small amount of resultant was dissolved in dichloromethane and reprecipitation was performed by using ethyl acetate to obtain a yellow green solid as a product (2) (6.85 g, yield 86%).

<Step 3>

The product (2) (3 g, 8.3 mmol) obtained in Step 2 and a cyanine intermediate 1 (1.59 g, 4 mmol) synthesized with reference to J. Heterocyclic Chem., 42, 959, (2005) were added to a 300 mL-eggplant flask, dissolved in 90 mL of pyridine, and stirred at 150° C. for 3 hours. After completion of the reaction, pyridine was removed by azeotropic distillation with toluene, and the obtained solid was washed with hexane. Then, the resultant was isolated by flash column chromatography (dichloromethane:ethyl acetate=10:1), the solvent was removed, a small amount of the resultant was dissolved in dichloromethane, and reprecipitation work was performed several times by using hexane to obtain a dye (ACii1-1P) as a black solid (1.0 g, yield 34%).

(2) Production of Dye (ACii1-1B)

A dye (ACii1-1B) was prepared in the same manner as the dye (ACii1-1P) except that a 42% tetrafluoroboric acid aqueous solution was used in place of the 60% hexafluorophosphoric acid aqueous solution in Step 2 in the production of the dye (ACii1-1P).

(3) Production of Dye (ACii2-1P)

A dye (ACii2-1P) was obtained according to the following reaction route in the same manner as the dye (ACii1-1P) except that the cyanine intermediate 2 was used in place of the cyanine intermediate 1 in Step 3 in the production of the dye (ACii1-1P).

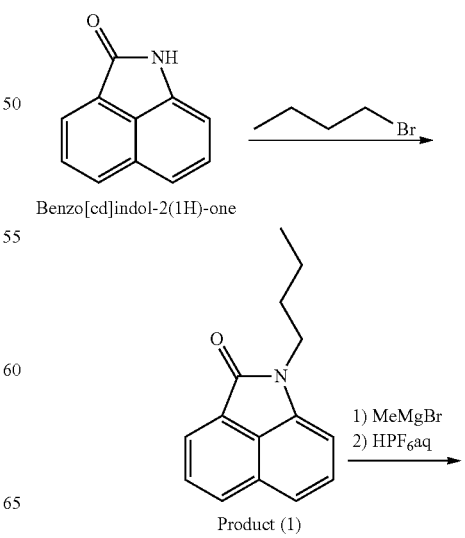

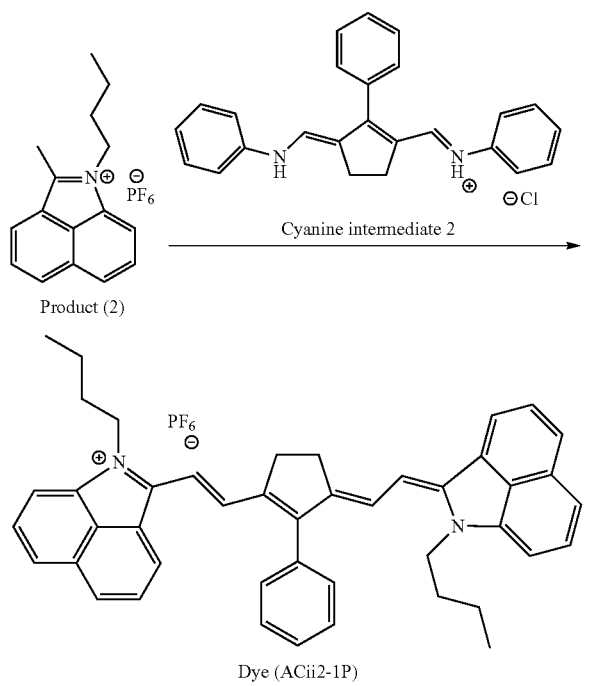

(4) Production of Dye (ACii2-1B)

A dye (ACii2-1B) was obtained in the same manner as the dye (ACii1-1B) except that a cyanine intermediate 2 was used in place of the cyanine intermediate 1 in Step 3 in the production of the dye (ACii1-1B).

(5) Production of Dye (ACiii1-2P)

A dye (ACiii1-2P) was synthesized according to a reaction route described below.

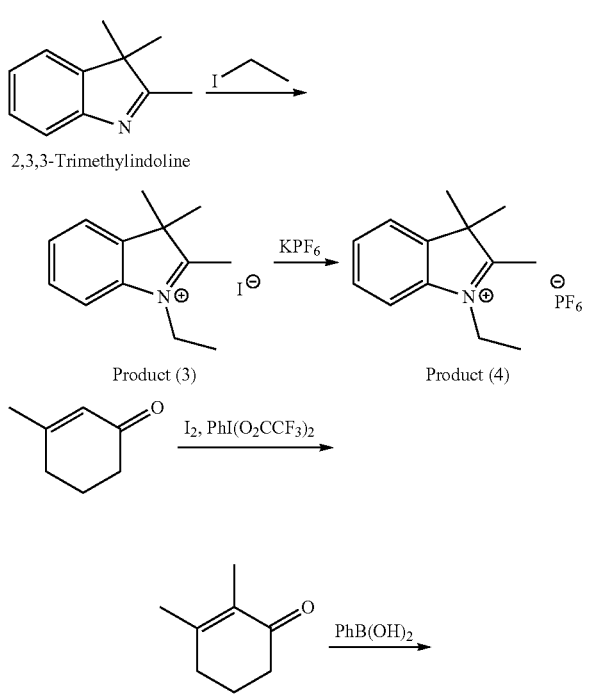

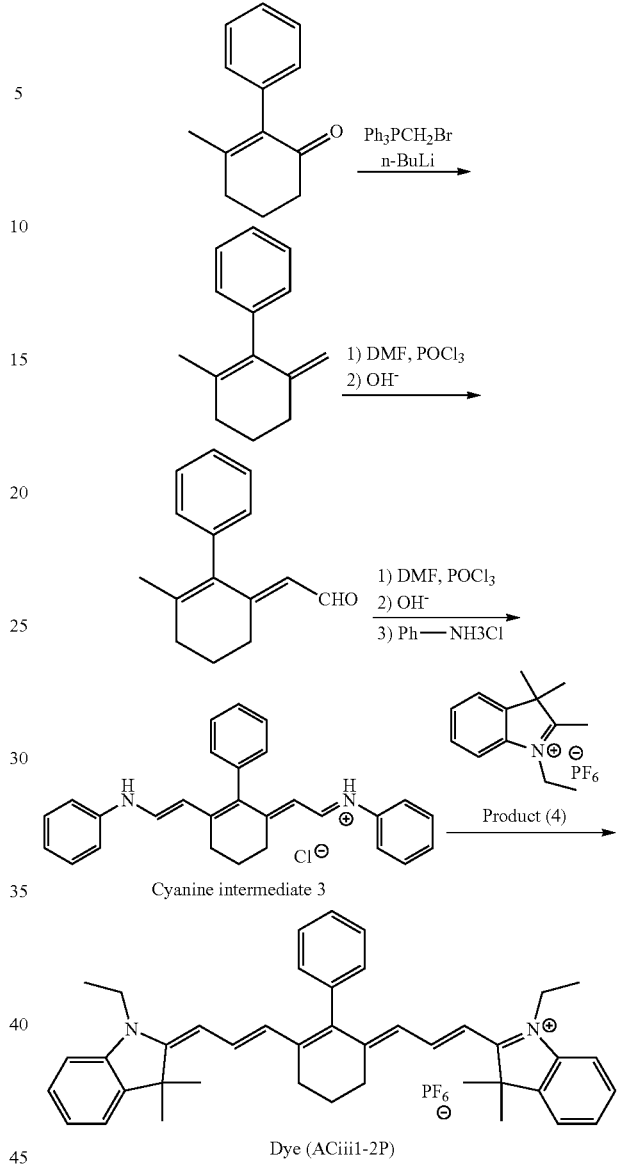

<Step 1 (Chlorination)>

To a 1 L-eggplant flask were added 2,3,3-trimethylindoline (50 g, 314 mmol) and iodoethane (100 g, 993 mmol), and the mixture was stirred at 95° C. for 48 hours. The obtained pink solid was washed with a tetrahydrofuran solution to obtain a solid product (3) (70 g, yield 70%).

<Step 2 (Salt Exchange)>

The product (3) (20 g, 64 mmol) obtained in Step 1, methanol (100 mL) and acetone (100 mL) were charged into a 1 L-eggplant flask, and stirred at 80° C. Potassium hexafluorophosphate (16 g, 87 mmol), water (100 mL) and acetone (100 mL) were charged into a 500 mL-eggplant flask separately prepared, and the mixture was stirred at room temperature for about 2 hours until potassium hexafluorophosphate was dissolved. The dissolved potassium hexafluorophosphate solution was poured into the eggplant flask containing the product (3) and stirred at 80° C. for 14 hours. After checking the disappearance of the raw materials by TLC, the solvents of methanol and acetone were removed, and an extraction was performed with dichloromethane. After isolation by flash column chromatography (dichloromethane:methanol=1,000:40), removal of the solvent and washing with hexane, a white solid product (4) (21 g, yield 96%) was obtained.

<Step 3>

A cyanine intermediate 3 (11 g, 5 steps 13%) was obtained with reference to Chem. A European Journal, 22 (4), 1266, (2016), J. Org. Chem., 70 (21), 8575, (2005), and UKRAINSKII KHIMICHESKII ZHURNAL, 44 (8), 838, (1978).

<Step 4>

The product (4) (5.12 g, 15 mmol) obtained in Step 2 and the cyanine intermediate 3 (3 g, 7 mmol) obtained in Step 3 were added to a 300 mL-eggplant flask and dissolved in 160 mL of pyridine, and the mixture was stirred at 140° C. for 1 hour. After completion of the reaction, pyridine was removed by azeotropic distillation with toluene. Then, the resultant was isolated by flash column chromatography (dichloromethane:ethyl acetate=10:1), the solvent was removed, a small amount of the resultant was dissolved in dichloromethane, and reprecipitation work was performed several times by using hexane to obtain a dye (ACiii1-2P) as a reddish brown solid (0.18 g, yield 4%).

(6) Production of Dye (ACiii2-2P)

A dye (ACiii2-2P) was obtained in the same manner as in the synthesis method of the dye (ACiii1-2P), except that 2,3,3-trimethyl-4,5-benzo-3H-indole was used as a raw material in place of 2,3,3-trimethylindoline in the production of the dye (ACiii1-2P).

(7) Production of Dye (ACiv-2P)

A dye (ACiv-2P) was synthesized according to a reaction route described below.

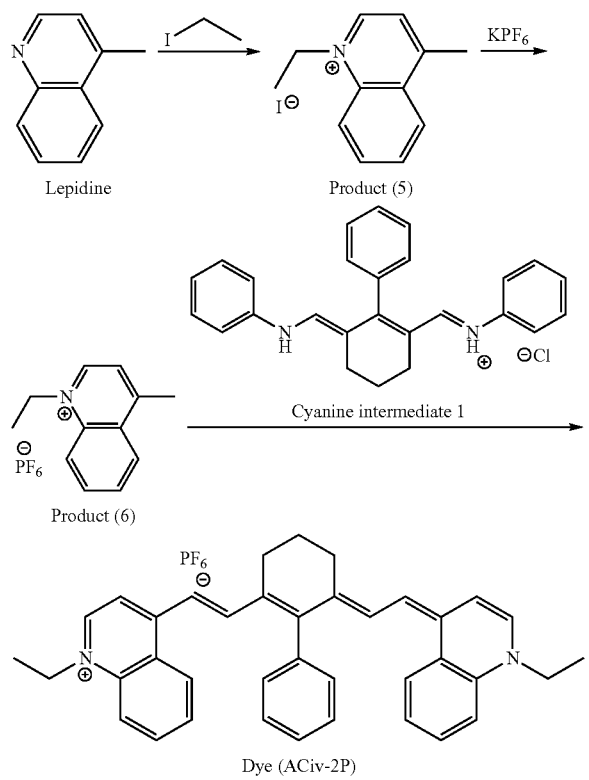

<Step 1>

Lepidine (53 g, 370 mmol) and iodoethane (100 g, 641 mmol) were added to a 1 L-eggplant flask, and the mixture was stirred at 50° C. for 15 hours. The obtained solid was washed with hexane to obtain a solid product (5) (100 g, yield 90%).

<Step 2>

The product (5) (20 g, 66.8 mmol) obtained in Step 1, methanol (100 mL) and acetone (100 mL) were charged into a 1 L-eggplant flask and stirred at 80° C. Potassium hexafluorophosphate (16 g, 87 mmol), water (100 mL) and acetone (100 mL) were charged into a 500 mL-eggplant flask separately prepared, and the mixture was stirred at room temperature for about 2 hours until potassium hexafluorophosphate was dissolved. The dissolved potassium hexafluorophosphate solution was poured into the eggplant flask containing the product (5) and stirred at 80° C. for 14 hours. After checking the disappearance of the raw materials by TLC, the solvents of methanol and acetone were removed, and an extraction was performed with dichloromethane. After isolation by flash column chromatography (dichloromethane:methanol=1,000:40), removal of the solvent and washing with hexane, a white solid product (6) (20 g, yield 94%) was obtained.

<Step 3>

Using the product (6) obtained in Step 2, a dye (ACiv-2P) was obtained in the same manner as in Step 3 described in the method for synthesizing the dye (ACii1-1P).

(8) Production of Dye (ACiv-26P)

A dye (ACiv-26P) was obtained in the same manner as in the method for synthesizing the dye (ACiv-2P), except that the cyanine intermediate 2 was used in place of the cyanine intermediate 1 in the production of the dye (ACiv-2P).

(9) Production of Dye (ASi-1)

A dye (ASi-1) was synthesized according to the reaction route described below. That is, a product (10) (6.5 mmol) produced with reference to European Journal of Medical Chemistry, 54, 647, (2012) and squaric acid (3.4 mmol) were put in a 500 mL-eggplant flask, and dissolved in toluene (330 mL) and 1-butanol (110 mL), quinoline (8 mmol) was added thereto, and the mixture was stirred at 150° C. for 4 hours. The product (10) is an iodine salt of a compound in which the 1-position hydrogen of 2-methyl-benzo [c,d] indole is substituted with R, and R is —$CH_2$—$CH(C_2H_5)$ ($C_4H_9$).

After completion of the reaction, the solvent was removed and the residue was isolated by flash column chromatography (hexane:ethyl acetate=8:2), the solvent was removed, and the residue was washed with hexane. Then, the dye (ASi-1) (0.5 g, yield 25%) as a reddish brown solid was obtained.

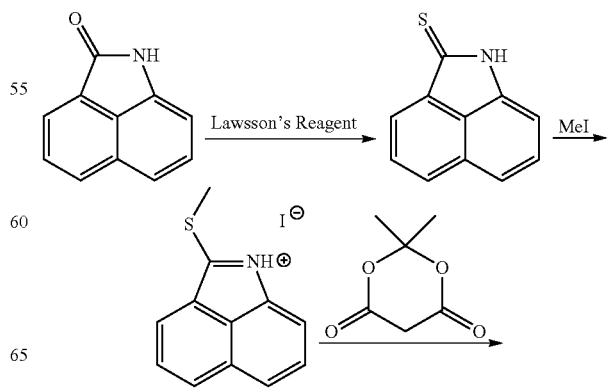

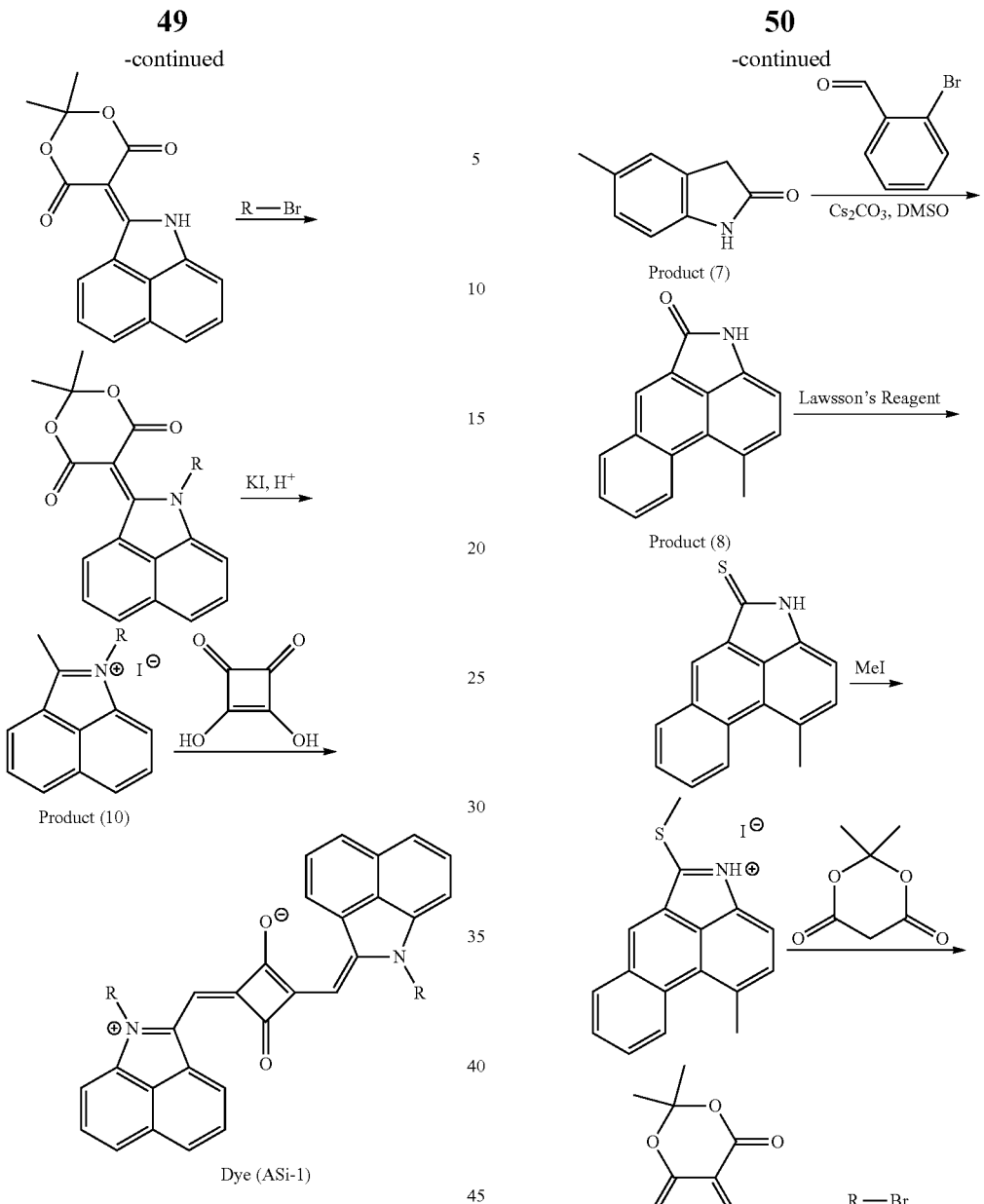

(10) Production of Dye (ASi-2)

A dye (ASi-2) was obtained in the same manner as the method for synthesizing the dye (ASi-1) except that the product (10) was changed to an iodine salt of a benzo [c,d] indole compound in which R in the product (10) was substituted with —CH$_2$—CH(C$_8$H$_{17}$)(C$_6$H$_{13}$) in the production of the dye (ASi-1).

(11) Production of Dye (ASii-2)

A dye (ASii-2) was synthesized according to the reaction route described below.

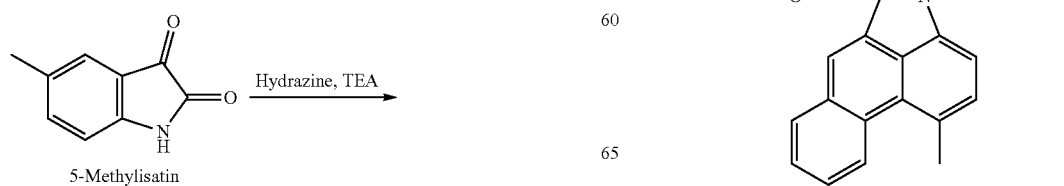

5-Methylisatin

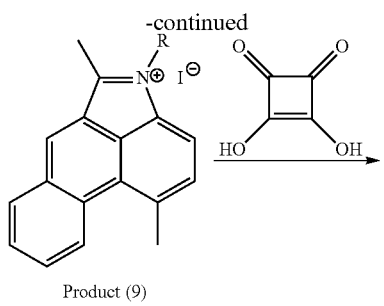

Product (9)

Dye (ASii-2)

<Step 1>

Into a 1 L-eggplant flask were charged 5-methylisatin (25 g, 155 mmol) and 1-butanol (180 mL), and hydrazine monohydrate (9.3 g, 186 mmol) was added thereto dropwise at 0° C. Then, the mixture was stirred at 35° C. for 30 minutes, heated to 80° C., and stirred for 4 hours. Furthermore, triethylamine (15.7 g, 155 mmol) was slowly added, and the mixture was stirred at 100° C. for 11 hours. Concentrated sulfuric acid was added until pH reached about 6, and cooled to room temperature, the solvent was removed, an extraction work was performed, and the obtained solid was washed with hexane to obtain a product (7) (22 g, yield 96%) as a brown solid.

<Step 2>

With reference to Org. Lett., 18, 5232, (2016), the product (7) (22 g, 149 mmol) obtained in Step 1, 2-bromobenzaldehyde (16 g, 90 mmol), cesium carbonate (86 g, 26 mmol), and dimethyl sulfoxide (700 mL) were added into a 1 L-3-neck flask, vacuum deaeration and nitrogen substitution were performed several times, then the mixture was stirred at 120° C. for 7 hours, and then cooled to room temperature. Then, after an extraction work was performed, the obtained resultant was isolated by flash column chromatography (hexane:ethyl acetate=2:8), and the solvent was removed, a yellow solid product (8) (8 g, yield 38%) was obtained.

<Step 3>

A product (9) was obtained from the product (8) obtained in Step 2 with reference to the method described in European Journal of Medical Chemistry, 54, 647, (2012). R in the product (9) is —$CH_2$—$CH(C_8H_{17})(C_6H_{13})$. A dye (ASii-2) was obtained in the same manner as the method for synthesizing the dye (ASi-2) except that the iodine salt of 1-dodecyl-2-methyl-benzo [c,d] indole was changed to the product (9) in the production of the dye (ASi-2).

Each of the above-mentioned dyes was dissolved in dichloromethane, the light absorption spectrum at a wavelength of 350 to 1,200 nm was measured, and the maximum absorption wavelength $\lambda_{max(A)DCM}$ was determined from the absorbance curve. Furthermore, from the absorbance curve in which the dye concentration in dichloromethane was adjusted so that the light transmittance at the maximum absorption wavelength $\lambda_{max(A)DCM}$ was 10%, $ABS_{400(A)DCM}/ABS_{\lambda max(A)DCM}$ and $ABS_{550(A)DCM}/ABS_{\lambda max(A)DCM}$ were determined. The results are indicated in Table 17. In the Tables, "$ABS_{400/\lambda max}$ in DCM" indicates $ABS_{400(A)\ DCM}/ABS_{\lambda max(A)DCM}$, and "$ABS_{550/\lambda max}$ in DCM" indicates $ABS_{550(A)DCM}/ABS_{\lambda max(A)DCM}$. In addition, "ASi-xx/ASi-yy" means the compound where $R^{161}$ to $R^{167}$ on the left side in the above-described Formula (ASi) are the same as the compound of the dye No. ASi-xx, and $R^{161}$ to $R^{167}$ on the right side are the same as the compound of the dye No. ASi-yy.

TABLE 17

| Dye No. | $\lambda_{max\,(A)DCM}$ [nm] | $ABS_{400/\lambda max}$ in DCM | $ABS_{550/\lambda max}$ in DCM |
|---|---|---|---|
| ACi1-1B | 865 | 0.042 | 0.007 |
| ACi1-2B | 931 | 0.027 | 0.012 |
| ACii1-1P | 1007 | 0.036 | 0.027 |
| ACii1-1B | 1006 | 0.030 | 0.021 |
| ACii2-1P | 1037 | 0.040 | 0.027 |
| ACii2-1B | 1038 | 0.045 | 0.036 |
| ACii2-2B | 1011 | 0.028 | 0.012 |
| ACiii1-2P | 873 | 0.028 | 0.033 |
| ACiii2-2P | 910 | 0.029 | 0.017 |
| ACiii2-9B | 907 | 0.024 | 0.018 |
| ACiii3-9B | 919 | 0.013 | 0.018 |
| ACiv-2P | 971 | 0.016 | 0.010 |
| ACiv-26P | 1006 | 0.017 | 0.025 |
| ASi-1 | 883 | 0.031 | 0.017 |
| ASi-2 | 885 | 0.031 | 0.018 |
| ASi-22 | 933 | 0.029 | 0.015 |
| ASi-23 | 919 | 0.030 | 0.019 |
| ASi-25 | 937 | 0.032 | 0.016 |
| ASi-22/ASi-24 | 934 | 0.030 | 0.016 |
| ASi-24/ASi-25 | 931 | 0.033 | 0.018 |
| ASii-2 | 921 | 0.097 | 0.015 |
| TXEX910B | 967 | 0.154 | 0.128 |
| Dim01 | 1101 | 0.111 | 0.016 |

(Preparation of Absorption Layer)

Absorption layers were prepared by using the dyes obtained above and transparent resins, and the optical characteristics were evaluated. Test Examples 1 to 12, 15 to 24, 27 to 34, and 37 to 44 are Test Examples relating to the present filter, and Test Examples 13, 14, 25, 26, 35, 36 and 45 to 54 are Comparative Test Examples. The following commercially available products were used as the transparent resin.

<Transparent Resin>

Transparent resin (R1); Neopulim (registered trademark) C-3G30 (produced by Mitsubishi Gas Chemical Company, Inc., trade name, polyimide resin)

Transparent resin (R2); OKP-850 (produced by Osaka Gas Chemicals Co., Ltd., trade name, polyester resin)

Transparent resin (R3); SP3810 (produced by Teijin Limited., trade name, polycarbonate resin)

Transparent resin (R4); PLEXIMID8817 (produced by Daicel-Evonik Ltd., trade name, acrylic imide resin)

Transparent resin (Rcf) for Comparative Example; BR1122 (produced by Mitsubishi Rayon Co., Ltd., trade name, acrylic resin)

The dye, the transparent resin (R1) and cyclohexanone were sufficiently stirred and uniformly dissolved. The obtained solution was applied onto a glass plate (D263; produced by SCHOTT, trade name) and dried to obtain an absorption layer having a film thickness of 1 μm. The amount of dye added (dye concentration) was adjusted so that the light transmittance at the maximum absorption wavelength $\lambda_{max(A)TR}$ was 10% at a film thickness of 1 μm. The absorbance curve of the absorption layer was obtained by using the absorbance curve of the glass plate with the absorption layer and the absorbance curve of the glass plate in a wavelength of 350 to 1,200 nm.

From the absorbance curve of the absorption layer, the maximum absorption wavelength $\lambda_{max(A)TR}$, $ABS_{400(A)TR}/ABS_{\lambda max(A)TR}$ (in the Tables, "$ABS_{400/\lambda max}$ in resin") and $ABS_{550(A)TR}/ABS_{\lambda max(A)TR}$ (in the Tables, "$ABS_{550/\lambda max}$ in resin") was determined. Furthermore, $ABS_{400(A)TR}/ABS_{\lambda max(A)TR}-ABS_{400(A)DCM}/ABS_{\lambda max(A)DCM}$ (in the Tables, "difference in $ABS_{400/\lambda max}$"), and $ABS_{550(A)TR}/ABS_{\lambda max(A)TR}-ABS_{550(A)DCM}/ABS_{\lambda max(A)DCM}$ (in the Tables, "difference in $ABS_{550/\lambda max}$") were determined. Furthermore, the mass absorption coefficient/(cm mass %) was determined. The results are indicated in Table 18. The dye concentrations in the Tables are indicated by parts by mass with respect to 100 parts by mass of the transparent resin (R1) when adjusted to have a light transmittance at $\lambda_{max(A)TR}$ being 10% at the film thickness of 1 μm.

TABLE 18

| Test Examples | Dye No. | Dye concentration [Parts by mass] | $\lambda_{max\ (A)TR}$ [nm] | $ABS_{400/\lambda max}$ in resin | $ABS_{550/\lambda max}$ in resin | Difference of $ABS_{400/\lambda max}$ | Difference of $ABS_{550/\lambda max}$ | Mass absorption coefficient/ (cm · mass %) |
|---|---|---|---|---|---|---|---|---|
| 1 | ACi1-1B | 4.4 | 865 | 0.086 | 0.026 | 0.044 | 0.019 | 2120 |
| 2 | ACi1-2B | 5.9 | 941 | 0.064 | 0.036 | 0.037 | 0.023 | 1632 |
| 3 | ACii1-1P | 5.4 | 1025 | 0.080 | 0.060 | 0.045 | 0.033 | 1719 |
| 4 | ACii1-1B | 5.2 | 1026 | 0.072 | 0.050 | 0.042 | 0.029 | 2084 |
| 5 | ACii2-1P | 5.8 | 1059 | 0.091 | 0.071 | 0.051 | 0.044 | 1626 |
| 6 | ACii2-1B | 6.4 | 1059 | 0.107 | 0.096 | 0.062 | 0.060 | 1505 |
| 7 | ACii2-2B | 5.9 | 1026 | 0.065 | 0.035 | 0.038 | 0.023 | 1618 |
| 8 | ACiii1-2P | 6.1 | 882 | 0.094 | 0.081 | 0.065 | 0.048 | 1576 |
| 9 | ACiii2-2P | 6.8 | 919 | 0.090 | 0.057 | 0.061 | 0.040 | 1375 |
| 10 | ACiii3-9B | 7.4 | 925 | 0.119 | 0.099 | 0.100 | 0.070 | 1384 |
| 11 | ACiv-2P | 6.8 | 979 | 0.080 | 0.054 | 0.064 | 0.044 | 1336 |
| 12 | ASi-1 | 6.9 | 902 | 0.047 | 0.029 | 0.016 | 0.011 | 1539 |
| 13 | TXEX910B | 20.6 | 972 | 0.217 | 0.156 | 0.064 | 0.028 | 439 |
| 14 | Dim01 | 19.4 | 1112 | 0.224 | 0.049 | 0.113 | 0.033 | 467 |

The same evaluation was performed by replacing the transparent resin (R1) with the transparent resin (R2) to the transparent resin (R4) or the transparent resin (Rcf) for a comparative example. The results are indicated in Table 19 for the transparent resin (R2), Table 20 for the transparent resin (R3), Table 21 for the transparent resin (R4), and Table 22 for the transparent resin (Rcf) for Comparative Examples.

TABLE 19

| Test Examples | Dye No. | Dye concentration [Parts by mass] | $\lambda_{max\ (A)TR}$ [nm] | $ABS_{400/\lambda max}$ in resin | $ABS_{550/\lambda max}$ in resin | Difference of $ABS_{400/\lambda max}$ | Difference of $ABS_{550/\lambda max}$ | Mass absorption coefficient/ (cm · mass %) |
|---|---|---|---|---|---|---|---|---|
| 15 | ACi1-2B | 3.1 | 937 | 0.083 | 0.045 | 0.056 | 0.033 | 1649 |
| 16 | ACii1-1P | 2.0 | 1032 | 0.079 | 0.056 | 0.043 | 0.029 | 2461 |
| 17 | ACii1-1B | 2.7 | 1032 | 0.075 | 0.053 | 0.045 | 0.032 | 1870 |
| 18 | ACii2-1P | 2.4 | 1066 | 0.084 | 0.064 | 0.044 | 0.037 | 2012 |
| 19 | ACii2-2B | 2.9 | 1036 | 0.095 | 0.031 | 0.053 | 0.024 | 1870 |
| 20 | ACiii1-2P | 2.8 | 883 | 0.112 | 0.084 | 0.084 | 0.051 | 1034 |
| 21 | ACiii2-2P | 3.4 | 921 | 0.099 | 0.064 | 0.070 | 0.047 | 1286 |
| 22 | ASi-1 | 2.1 | 908 | 0.049 | 0.029 | 0.018 | 0.011 | 2060 |
| 23 | ASi-2 | 2.1 | 909 | 0.044 | 0.024 | 0.014 | 0.006 | 1830 |
| 24 | ASi-25 | 3.8 | 959 | 0.056 | 0.028 | 0.024 | 0.012 | 1130 |
| 25 | TXEX910B | 8.6 | 968 | 0.188 | 0.138 | 0.034 | 0.009 | 557 |
| 26 | Dim01 | 12.3 | 1009 | 0.393 | 0.050 | 0.282 | 0.034 | 309 |

TABLE 20

| Test Examples | Dye No. | Dye concentration [Parts by mass] | $\lambda_{max\ (A)TR}$ [nm] | $ABS_{400/\lambda max}$ in resin | $ABS_{550/\lambda max}$ in resin | Difference of $ABS_{400/\lambda max}$ | Difference of $ABS_{550/\lambda max}$ | Mass absorption coefficient/ (cm · mass %) |
|---|---|---|---|---|---|---|---|---|
| 27 | ACii1-1P | 4.0 | 1031 | 0.089 | 0.068 | 0.054 | 0.041 | 1727 |
| 28 | ACii1-1B | 3.9 | 1030 | 0.091 | 0.067 | 0.061 | 0.046 | 1743 |
| 29 | ACii2-1P | 5.1 | 1066 | 0.097 | 0.078 | 0.057 | 0.051 | 1361 |

TABLE 20-continued

| Test Examples | Dye No. | Dye concentration [Parts by mass] | $\lambda_{max\,(A)IR}$ [nm] | $ABS_{400/\lambda max}$ in resin | $ABS_{550/\lambda max}$ in resin | Difference of $ABS_{400/\lambda max}$ | Difference of $ABS_{550/\lambda max}$ | Mass absorption coefficient/ (cm · mass %) |
|---|---|---|---|---|---|---|---|---|
| 30 | ACii2-2B | 4.7 | 1035 | 0.072 | 0.043 | 0.044 | 0.030 | 1444 |
| 31 | ACiii1-2P | 3.1 | 880 | 0.012 | 0.088 | 0.095 | 0.055 | 976 |
| 32 | ACiii2-2P | 4.4 | 918 | 0.097 | 0.055 | 0.067 | 0.038 | 1457 |
| 33 | ASi-1 | 3.1 | 908 | 0.043 | 0.025 | 0.012 | 0.007 | 1975 |
| 34 | ASi-2 | 3.3 | 909 | 0.043 | 0.026 | 0.012 | 0.008 | 1613 |
| 35 | TXEX910B | 11.3 | 970 | 0.188 | 0.143 | 0.034 | 0.014 | 556 |
| 36 | Dim01 | 17.4 | 1022 | 0.352 | 0.052 | 0.241 | 0.035 | 320 |

TABLE 21

| Test Examples | Dye No. | Dye concentration [Parts by mass] | $\lambda_{max\,(A)IR}$ [nm] | $ABS_{400/\lambda max}$ in resin | $ABS_{550/\lambda max}$ in resin | Difference of $ABS_{400/\lambda max}$ | Difference of $ABS_{550/\lambda max}$ | Mass absorption coefficient/ (cm · mass %) |
|---|---|---|---|---|---|---|---|---|
| 37 | ACi1-2B | 2.1 | 932 | 0.074 | 0.052 | 0.047 | 0.039 | 1614 |
| 38 | ACii1-1P | 1.8 | 1018 | 0.074 | 0.065 | 0.038 | 0.038 | 1900 |
| 39 | ACiii1-1B | 1.9 | 1018 | 0.087 | 0.084 | 0.057 | 0.063 | 1829 |
| 40 | ACii2-1P | 2.1 | 1049 | 0.099 | 0.096 | 0.059 | 0.069 | 1602 |
| 41 | ACii2-2B | 2.3 | 1020 | 0.087 | 0.083 | 0.059 | 0.070 | 1484 |
| 42 | ASi-2 | 1.6 | 885 | 0.050 | 0.033 | 0.017 | 0.016 | 1935 |
| 43 | ASi-1 | 1.7 | 890 | 0.054 | 0.037 | 0.023 | 0.020 | 1797 |
| 44 | ASi-2 | 1.9 | 891 | 0.054 | 0.038 | 0.023 | 0.020 | 1893 |
| 45 | TXEX910B | 6.0 | 962 | 0.184 | 0.136 | 0.030 | 0.007 | 521 |
| 46 | Dim01 | 18.9 | 971 | 0.806 | 0.056 | 0.696 | 0.039 | 150 |

TABLE 22

| Test Examples | Dye No. | Dye concentration [Parts by mass] | $\lambda_{max\,(A)IR}$ [nm] | $ABS_{400/\lambda max}$ in resin | $ABS_{550/\lambda max}$ in resin | Difference of $ABS_{400/\lambda max}$ | Difference of $ABS_{550/\lambda max}$ | Mass absorption coefficient/ (cm · mass %) |
|---|---|---|---|---|---|---|---|---|
| 47 | ACi1-2B | 9.9 | 788 | 0.186 | 0.133 | 0.159 | 0.120 | 610 |
| 48 | ACii1-1P | 13.5 | 975 | 0.291 | 0.231 | 0.256 | 0.204 | 469 |
| 49 | ACii2-1P | 10.7 | 1021 | 0.248 | 0.204 | 0.208 | 0.177 | 527 |
| 50 | ACii2-1B | 25.9 | 959 | 0.657 | 0.642 | 0.612 | 0.606 | 237 |
| 51 | ACii2-2B | 13.7 | 1004 | 0.279 | 0.202 | 0.251 | 0.190 | 45 |
| 52 | ACiii2-2P | 31.0 | 927 | 0.487 | 0.359 | 0.458 | 0.341 | 182 |
| 53 | TXEX910B | 11.8 | 976 | 0.178 | 0.141 | 0.024 | 0.012 | 454 |
| 54 | Dim01 | 14.2 | 1086 | 0.250 | 0.039 | 0.140 | 0.023 | 347 |

It is clear from Tables 18 to 22 that when the dyes (ACi) to (ACiv), the dye (ASi) or the dye (ASii) and transparent resins suitable in combination with these are used, the requirements of (i-1) to (i-3) are satisfied. Furthermore, it is clear that preferable combinations among these satisfy the requirement (i-4).

Examples 1 to 12: Manufacture and Evaluation of Optical Filter (Manufacture of Optical Filter)

An optical filter having the same structure as the optical filter 10F illustrated in FIG. 6 was manufactured by the following method.

In each Example, as the transparent substrate, as indicated in Tables 23 and 24, a glass substrate formed of CuO-containing fluorophosphate glass (manufactured by AGC Inc., trade name: NF-50GX) with a thickness of 0.21 mm or a glass substrate (D263; manufactured by SCHOTT, trade name) with a thickness of 0.2 mm was used.

As the reflection layer, a dielectric multilayer film formed as follows was used in each Example. The dielectric multilayer film was formed by laminating a total of 42 layers of $TiO_2$ films and $SiO_2$ films alternately on one main surface of the glass substrate by a vapor deposition method. The structure of the reflection layer was simulated by using the number of laminated dielectric multilayer films, the film thickness of the $TiO_2$ film and the film thickness of the $SiO_2$ film as parameters, and designed such that the average transmittance of light with a wavelength of 850 to 1,100 nm was 0.03% in the spectral transmittance curve at an incident angle of 0 degree.

Furthermore, the transparent resin indicated in Tables 23 and 24, one or two kinds of the dyes (A) (the first dye (A) and the second dye (A) in the Tables), and the dye (D) (dye (I-12-24)) were combined to form an absorption layer having a thickness of about 1.0 µm, on the main surface of the glass substrate, opposite to the side on which the reflection layer was formed. The dye contents in Tables 23 and 24 are indicated by parts by mass of the dyes with respect to 100 parts by mass of the transparent resin.

Then, seven layers of $TiO_2$ film and $SiO_2$ film were alternately laminated on the surface of the absorption layer by a vapor deposition method to form an antireflection layer, to thereby obtain optical filters (NIR filters) of Examples 1 to 12. Examples 1 to 11 are Invention Examples and Example 12 is Comparative Example.

(Evaluation)

Spectral transmittance curves at an incident angle of 0 degree were obtained for the absorption layers of the obtained optical filters of Examples 1 to 12. Tables 23 and 24 indicate the wavelength $\lambda_{ABSHT\ 20\text{-}0°}$ that is a shorter wavelength of the wavelengths showing the transmittance of 20%, the average transmittance $T_{AB435\text{-}630ave0°}$ of the light of the wavelengths 435 to 630 nm, and the average transmittance $T_{AB850\text{-}1,100ave0°}$ of light having a wavelength of 850 to 1,100 nm, which are obtained from the spectral transmittance curves.

In addition, the spectral transmittance curves at an incident angle of 0 degree and an incident angle of 30 degrees were obtained for the obtained optical filters of Examples 1 to 12. Tables 23 and 24 indicate an average value of the absolute values of the differences in the transmittances in the spectral transmittance curves at the incident angle of 0 degree and the incident angle of 30 degrees, which was obtained from the spectral transmittance curves, in the wavelengths of 615 to 725 nm (indicate "difference between wavelengths 615 to 725 nm" in the Tables). Furthermore, the average transmittance $T_{850\text{-}1,100ave0°}$ of light having a wavelength of 850 to 1,100 nm at the incident angle of 0 degree, the average transmittance $T_{435\text{-}630ave0°}$ of light having a wavelength of 435 to 630 nm, the average transmittance $T_{850\text{-}1,100ave30°}$ of light having a wavelength of 850 to 1,100 nm at the incident angle of 30 degrees, and the maximum transmittance $T_{850\text{-}1,100max30°}$ for light having a wavelength of 850 to 1,100 nm are also indicated.

TABLE 23

| | | | Example 1 | Example 2 | Example 3 | Example 4 | Example 5 | Example 6 |
|---|---|---|---|---|---|---|---|---|
| Optical filter configuration | | Types of transparent substrate | D263 | D263 | D263 | D263 | D263 | D263 |
| | Absorption layer | Transparent resin | R1 | R1 | R1 | R1 | R2 | R3 |
| | | Content of dye (D) [parts by mass] | 13.7 | 13.7 | 13.7 | 13.7 | 13.7 | 9.6 |
| | | Types of first dye (A) | ACi1-2B | ACii1-1P | ACii2-2B | ASi-1 | ASi-2 | ASi-2 |
| | | Content of first dye (A) [parts by mass] | 5.9 | 5.4 | 5.9 | 6.9 | 2.3 | 3.3 |
| | | Types of second dye (A) | — | — | — | — | — | — |
| | | Content of second dye (A) [parts by mass] | — | — | — | — | — | — |
| Optical characteristics | Absorption layer | $\lambda_{ABSHT20\text{-}0°}$ [nm] | 660 | 659 | 659 | 661 | 661 | 661 |
| | | $T_{AB435\text{-}630ave0°}$ [%] | 80.7 | 76.1 | 82.5 | 83.1 | 83.4 | 83.9 |
| | | $T_{AB850\text{-}1,100ave0°}$ [%] | 45.0 | 30.0 | 23.0 | 64.9 | 65.2 | 65.1 |
| | Optical filter | Difference between wavelengths 615 to 725 nm [%/nm] | 0.45 | 0.43 | 0.43 | 0.45 | 0.41 | 0.42 |
| | | $T_{850\text{-}1,100ave0°}$ [%] | 0.02 | 0.01 | 0.01 | 0.03 | 0.03 | 0.03 |
| | | $T_{435\text{-}630ave0°}$ [%] | 75.4 | 71.00 | 77.10 | 77.70 | 77.90 | 78.40 |
| | | $T_{850\text{-}1,100ave30°}$ [%] | 0.09 | 0.04 | 0.03 | 0.10 | 0.10 | 0.10 |
| | | $T_{850\text{-}1,100max30°}$ [%] | 0.91 | 0.62 | 0.35 | 0.93 | 0.93 | 0.94 |

TABLE 24

| | | | Example 7 | Example 8 | Example 9 | Example 10 | Example 11 | Example 12 |
|---|---|---|---|---|---|---|---|---|
| Optical filter configuration | | Types of transparent substrate | D263 | NF-50GX | NF-50GX | D263 | D263 | D263 |
| | Absorption layer | Transparent resin | R1 | R1 | R1 | R1 | R1 | R1 |
| | | Content of dye (D) [parts by mass] | 4.1 | 9.0 | 9.0 | 13.7 | 13.7 | 13.7 |
| | | Types of first dye (A) | ASi-2 | ASi-1 | ASi-1 | ACi1-2B | ASi-1 | TXEX910B |
| | | Content of first dye (A) [parts by mass] | 1.9 | 6.9 | 5.9 | 5.9 | 6.9 | 20.6 |
| | | Types of second dye (A) | — | — | — | ACii2-2B | ACii2-2B | — |
| | | Content of second dye (A) [parts by mass] | — | — | — | 5.9 | 5.9 | — |
| Optical characteristics | Absorption layer | $\lambda_{ABSHT20\text{-}0°}$ [nm] | 661 | 674 | 674 | 657 | 657 | 650 |
| | | $T_{AB435\text{-}630ave0°}$ [%] | 82.0 | 85.9 | 83.5 | 73.6 | 75.8 | 62.7 |
| | | $T_{AB850\text{-}1,100ave0°}$ [%] | 67.9 | 64.9 | 45.0 | 8.9 | 11.8 | 38.5 |
| | Optical filter | Difference between wavelengths 615 to 725 nm [%/nm] | 0.37 | 0.70 | 0.69 | 0.40 | 0.41 | 0.33 |
| | | $T_{850\text{-}1,100ave0°}$ [%] | 0.03 | 0.00 | 0 | 0.00 | 0.01 | 0.02 |
| | | $T_{435\text{-}630ave0°}$ [%] | 76.60 | 74.80 | 72.5 | 68.80 | 70.80 | 58.60 |
| | | $T_{850\text{-}1,100ave30°}$ [%] | 0.10 | 0.02 | 0.02 | 0.02 | 0.02 | 0.07 |
| | | $T_{850\text{-}1,100max30°}$ [%] | 0.93 | 0.26 | 0.25 | 0.34 | 0.34 | 0.85 |

It is clear from Tables 23 and 24 that in the optical filters of Examples 1 to 11, the absorption layer satisfies (ii-1) to (ii-3) and the optical filters satisfy (iv-1) to (iv-5).

INDUSTRIAL APPLICABILITY

The optical filter of the present invention is excellent in the visible light transmittance and excellent in the shielding properties of near-infrared light, particularly the shielding properties of long-wavelength near-infrared light. Therefore, it is useful as an optical filter for an imaging apparatus in a machine having both an imaging apparatus and an optical component that uses laser light.

Although the present invention has been specifically described with reference to particular embodiments, it will be apparent to those skilled in the art that various changes and modifications can be made without departing from the gist and scope of the invention.

This application is based on Japanese Patent Application No. 2018-018608 filed on Feb. 5, 2018, the content of which is incorporated herein by reference.

REFERENCE SIGNS LIST 10A, 10B, 10C, 10D, 10E, 10F Optical filter
11, 11a, 11b Absorption layer
12, 12a, 12b Reflection layer
13 Transparent substrate
14 Antireflection layer

The invention claimed is:

1. An optical filter, comprising:
a reflection layer comprising a dielectric multilayer film; and
an absorption layer comprising a near-infrared absorbing dye and a transparent resin,
wherein the near-infrared absorbing dye satisfies (i-1) to (i-3) and the transparent resin satisfies the (i-3) in relation to the near-infrared absorbing dye, where in the (i-1), a maximum absorption wavelength $\lambda_{max(A)DCM}$ is in a wavelength range of 850 to 1,100 nm in an absorbance curve of wavelength 350 to 1,200 nm measured in dichloromethane, in the (1-2), in the absorbance curve of wavelength 350 to 1,200 nm measured in dichloromethane, when an absorbance at the maximum absorption wavelength $\lambda_{max(A)DCM}$ is denoted by $ABS_{\lambda max(A)DCM}$, an absorbance at a wavelength of 400 nm is denoted by $ABS_{400(A) DCM}$, and an absorbance at a wavelength of 550 nm is denoted by $ABS_{550(A)DCM}$, Formulae (1) and (2), $ABS_{400(A)DCM}/ABS_{\lambda max(A)DCM} < 0.10$ (1) and $ABS_{550(A) DCM}/ABS_{\lambda max(A)DCM} < 0.04$ (2), are satisfied, in the (i-3) in an absorbance curve of the wavelength of 350 to 1,200 nm measured in the transparent resin, a maximum absorption wavelength $\lambda_{max(A)TR}$ is in a wavelength range of 850 to 1,100 nm, and when an absorbance at the maximum absorption wavelength $\lambda_{max(A)TR}$ is denoted by $ABS_{\lambda max(A)TR}$, an absorbance at the wavelength of 400 nm is denoted by $ABS_{400(A)TR}$, and an absorbance at the wavelength of 550 nm is denoted by $ABS_{550(A)TR}$, Formulae (3) and (4), $ABS_{400 (A)TR}/ABS_{\lambda max(A)TR} < 0.15$ (3) and $ABS_{550(A)TR}/ABS_{\lambda max(A)TR} < 0.10$ (4), are satisfied, and the near-infrared absorbing dye comprises a squarylium dye of Formula (ASi) or (ASii),

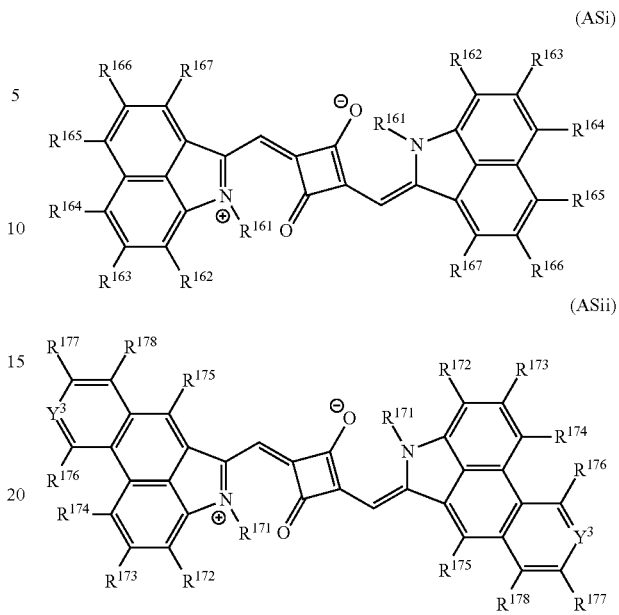

where $R^{161}$ is a branched alkyl group having 3 to 20 carbon atoms or a linear alkyl group having 13 to 20 carbon atoms, $Y^3$ is C—$R^{179}$ or N, $R^{162}$ to $R^{167}$ and $R^{171}$ to $R^{179}$ are each independently a hydrogen atom, a halogen atom, a sulfo group, a hydroxy group, a cyano group, a nitro group, a carboxyl group, a phosphoric acid group, a —$NR^{112}R^{113}$ group, a —$NHSO_2R^{114}$ group, a —$NHCOR^{115}$ group, a —$SR^{116}$ group, a —$SO_2R^{117}$ group, a —$OSO_2R^{118}$ group, an alkyl group or alkoxy group having 1 to 20 carbon atoms, a halogen-substituted alkyl group having 1 to 12 carbon atoms, a cycloalkyl group having 3 to 14 carbon atoms, an aryl group having 6 to 14 carbon atoms, or a heterocyclic group having 3 to 14 members, $R^{112}$ to $R^{118}$ each independently is a hydrogen atom, an alkyl group or alkoxy group having 1 to 20 carbon atoms, a halogen-substituted alkyl group having 1 to 12 carbon atoms, a cycloalkyl group having 3 to 14 carbon atoms, an aryl group having 6 to 14 carbon atoms, or a heterocyclic group having 3 to 14 members, and a plurality of $R^{161}$'s to $R^{167}$'s, $R^{171}$'s to $R^{178}$'s, and $Y^3$'s included in each formula may be the same as or different from each other.

2. The optical filter according to claim 1, wherein the near-infrared absorbing dye further satisfies Formulae (5) and (6), $ABS_{400(A)TR}/ABS_{\lambda max(A)TR}-ABS_{400(A)DCM}/ABS_{\lambda max(A)DCM} < 0.10$ (5) and $ABS_{550(A)TR}/ABS_{\lambda max(A)TR}-ABS_{550(A)DCM}/ABS_{\lambda max(A)DCM} < 0.08$ (6).

3. The optical filter according to claim 2, wherein the transparent resin comprises a resin having at least one bond selected from the group consisting of an ester bond, a carbonate bond and an imide bond, in a main chain.

4. The optical filter according to claim 2, wherein the transparent resin comprises at least one resin selected from the group consisting of a polyester resin, a polycarbonate resin, a polyimide resin, and an acrylimide resin.

5. The optical filter according to claim 2, wherein the absorption layer further comprises a near-infrared absorbing dye having a maximum absorption wavelength $\lambda_{max(D)TR}$ in a wavelength range of 650 to 750 nm in an absorbance curve of wavelength 350 to 1,200 nm measured in the transparent resin and having at least one of Formulae (I), (II) and (III),

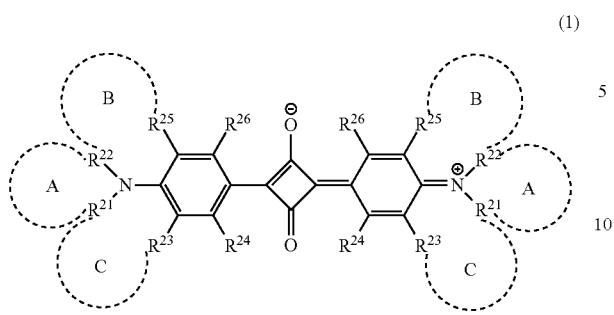
(1)

where $R^{24}$ and $R^{26}$ are each independently a hydrogen atom, a halogen atom, a hydroxyl group, an alkyl group or alkoxy group having 1 to 6 carbon atoms, an acyloxy group having 1 to 10 carbon atoms, $-NR^{27}R^{28}$ where $R^{27}$ and $R^{28}$ are each independently a hydrogen atom, an alkyl group having 1 to 20 carbon atoms, $-C(=O)-R^{29}$ where $R^{29}$ is a hydrogen atom, an alkyl group having 1 to 20 carbon atoms or an aryl group having 6 to 11 carbon atoms which may have a substituent, or an araryl group having 7 to 18 carbon atoms which may have a substituent and have an oxygen atom between carbon atoms, $-NHR^{30}$, or $-SO_2-R^{30}$ where $R^{30}$ is a hydrocarbon group having 1 to 25 carbon atoms, each of which one or more hydrogen atoms may be substituted with a halogen atom, a hydroxyl group, a carboxy group, a sulfo group, or a cyano group, or which may contain an unsaturated bond, an oxygen atom, or a saturated or unsaturated ring structure between carbon atoms, or a group of Formula(S) where $R^{41}$ and $R^{42}$ each independently is a hydrogen atom, a halogen atom, or an alkyl group or alkoxy group having 1 to 10 carbon atoms, and k is 2 or 3,

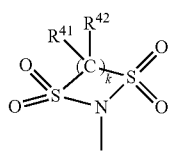
(S)

$R^{21}$ and $R^{22}$, $R^{22}$ and $R^{25}$, and $R^{21}$ and $R^{23}$ may be bonded to each other to form a heterocycle A, a heterocycle B, and a heterocycle C each having 5 or 6 members with a nitrogen atom, respectively, $R^{21}$ and $R^{22}$ in the case where the heterocycle A is formed represent, as a divalent group -Q- to which these are bonded, an alkylene group or alkyleneoxy group in which a hydrogen atom may be substituted with an alkyl group having 1 to 6 carbon atoms, an aryl group having 6 to 10 carbon atoms, or acyloxy group having 1 to 10 carbon atoms which may have a substituent, $R^{22}$ and $R^{25}$ in the case where the heterocycle B is formed, and $R^{21}$ and $R^{23}$ in the case where the heterocycle C is formed respectively represent as divalent groups $-X^1-Y^1-$ and $-X^2-Y^2-$ where $X^1$ and $X^2$ are on the side that bonds to nitrogen to which these are bonded, a group in which $X^1$ and $X^2$ are each a group of Formula (1x) or (2x), and $Y^1$ and $Y^2$ are each a group of at least one selected from Formulae (1y) to (5y), and in the case where $X^1$ and $X^2$ are each a group of Formula (2x), $Y^1$ and $Y^2$ may be a single bond, and in that case, an oxygen atom may be contained between carbon atoms,

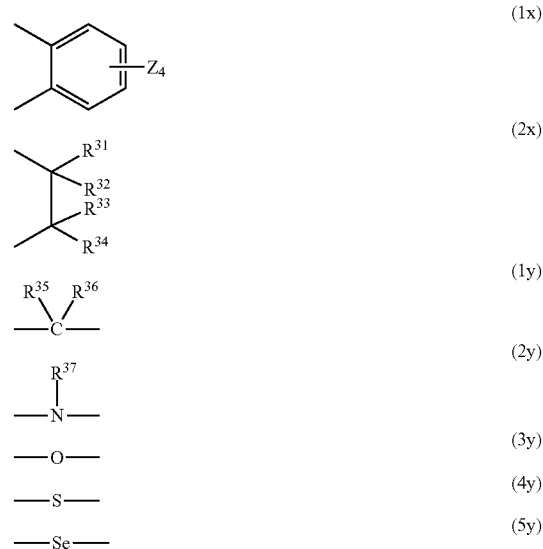

four Z's are each independently a hydrogen atom, a hydroxyl group, an alkyl group or alkoxy group having 1 to 6 carbon atoms, or $-NR^{38}R^{39}$ where $R^{38}$ and $R^{39}$ each independently is a hydrogen atom or an alkyl group having 1 to 20 carbon atoms, $R^{31}$ to $R^{36}$ each independently is a hydrogen atom, an alkyl group having 1 to 6 carbon atoms or an aryl group having 6 to 10 carbon atoms, and $R^{37}$ is an alkyl group having 1 to 6 carbon atoms or an aryl group having 6 to 10 carbon atoms, $R^{27}$, $R^{28}$, $R^{29}$, $R^{31}$ to $R^{37}$, $R^{21}$ to $R^{23}$ in the case where a heterocycle is not formed, and $R^{25}$ may be bonded to any of them to form a 5-membered ring or a 6-membered ring, and $R^{31}$ and $R^{36}$, and $R^{31}$ and $R^{37}$ may be directly bonded to each other, and $R^{21}$ and $R^{22}$ in the case where a heterocycle is not formed, each independently is a hydrogen atom, an alkyl group or allyl group having 1 to 6 carbon atoms which may have a substituent, or an aryl group or araryl group having 6 to 11 carbon atoms which may have a substituent, and $R^{23}$ and $R^{25}$ in the case where a heterocycle is not formed, each independently is a hydrogen atom, a halogen atom, or an alkyl group or alkoxy group having 1 to 6 carbon atoms,

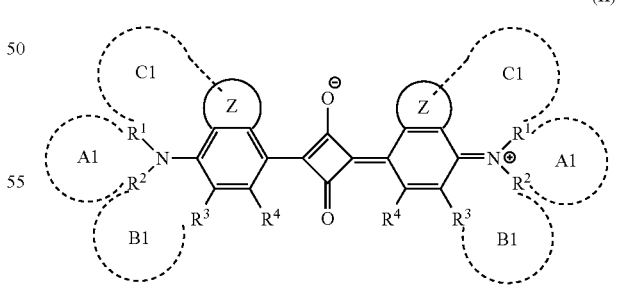
(II)

where ring Z's are each independently a 5-membered ring or 6-membered ring which has 0 to 3 heteroatoms in the ring and may be substituted, and a carbon atom or heteroatom constituting $R^1$ and $R^2$, $R^2$ and $R^3$, and $R^1$ and the ring Z may be boded to each other to form a heterocycle A1, a heterocycle B1 and a heterocycle C1 together with a nitrogen atom, respectively, and in the case where the heterocycle is not formed, $R^1$ and $R^2$ each independently is a hydrogen atom, a halogen atom, or a hydrocarbon group which may contain an unsaturated bond, a heteroatom, or a saturated or unsaturated ring structure between carbon atoms, and may have a substituent, and $R^3$ and $R^4$ each independently is a hydrogen atom, a halogen atom, or an alkyl group or alkoxy group which may contain a heteroatom between carbon atoms, (III)

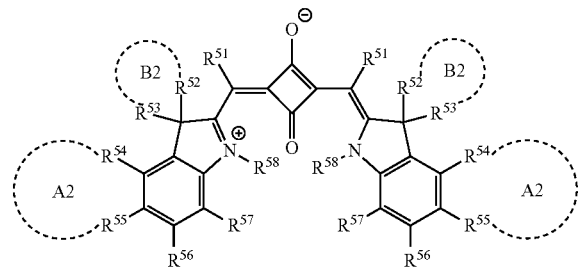

where $R^{51}$ each independently is a halogen atom or an alkyl group having 1 to 3 carbon atoms which may have a substituent, $R^{52}$ to $R^{58}$ each independently is a hydrogen atom, a halogen atom or an alkyl group having 1 to 10 carbon atoms which may have a substituent, $R^{52}$ and $R^{53}$ may be bonded to each other to form a saturated or unsaturated hydrocarbon ring B2 having 5 to 15 carbon atoms, and a hydrogen atom of the hydrocarbon ring B2 may be substituted with an alkyl group having 1 to 10 carbon atoms, and $R^{54}$ and $R^{55}$ may be bonded to each other to form a benzene ring A2, and a hydrogen atom of the benzene ring A2 may be substituted with an alkyl group having 1 to 10 carbon atoms.

6. The optical filter according to claim 5, wherein the absorption layer further satisfies (ii-1) to (ii-3) in a spectral transmittance curve at an incident angle of 0 degree, the reflection layer satisfies (iii-1), and the optical filter satisfies (iv-1), where in the (ii-1), a wavelength showing a transmittance of 20% is in a wavelength range of 655 to 675 nm, in the (ii-2), an average transmittance of light having a wavelength of 435 to 630 nm is 65% or more, in the (ii-3), an average transmittance of light having a wavelength of 850 to 1,100 nm is 70% or lower, in the (iii-1), an average transmittance of light having a wavelength of 850 to 1,100 nm is 0.2% or less in the spectral transmittance curve at an incident angle of 0 degree, and in the (iv-1), an average value of absolute values of differences in transmittances in the spectral transmittance curves at an incident angle of 0 degree and an incident angle of 30 degrees is 2%/nm or less in a wavelength range of 615 to 725 nm.

7. The optical filter according to claim 2, wherein the near-infrared absorbing dye comprises at least two dyes having different maximum absorption wavelength $\lambda_{max(A)TR}$.

8. An imaging apparatus, comprising:
the optical filter of claim 2.

9. The optical filter according to claim 2, wherein the near-infrared absorbing dye further satisfies Formulae (5) and (6), $ABS_{400(A)TR}/ABS_{\lambda max(A)TR}$-$ABS_{400(A)\ DCM}/ABS_{\lambda max(A)DCM}<0.06$ (5) and $ABS_{550(A)TR}/ABS_{\lambda max(A)TR}$-$ABS_{550(A)DCM}/ABS_{\lambda max(A)DCM}<0.08$ (6).

10. The optical filter according to claim 1, wherein the transparent resin comprises a resin having at least one bond selected from the group consisting of an ester bond, a carbonate bond and an imide bond, in a main chain.

11. The optical filter according to claim 10, wherein the transparent resin comprises at least one resin selected from the group consisting of a polyester resin, a polycarbonate resin, a polyimide resin, and an acrylimide resin.

12. The optical filter according to claim 10, wherein the absorption layer further comprises a near-infrared absorbing dye having a maximum absorption wavelength $\lambda_{max(D)TR}$ in a wavelength range of 650 to 750 nm in an absorbance curve of wavelength 350 to 1,200 nm measured in the transparent resin and having at least one of Formulae (I), (II) and (III), (1)

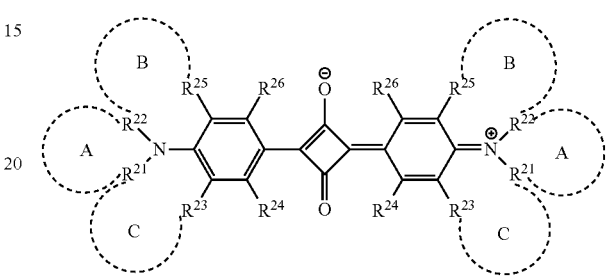

where $R^{24}$ and $R^{26}$ are each independently a hydrogen atom, a halogen atom, a hydroxyl group, an alkyl group or alkoxy group having 1 to 6 carbon atoms, an acyloxy group having 1 to 10 carbon atoms, —$NR^{27}R^{28}$ where $R^{27}$ and $R^{28}$ are each independently a hydrogen atom, an alkyl group having 1 to 20 carbon atoms, —C(=O)—$R^{29}$ where $R^{29}$ is a hydrogen atom, an alkyl group having 1 to 20 carbon atoms or an aryl group having 6 to 11 carbon atoms which may have a substituent, or an araryl group having 7 to 18 carbon atoms which may have a substituent and have an oxygen atom between carbon atoms, —$NHR^{30}$, or —$SO_2$—$R^{30}$ where $R^{30}$ is a hydrocarbon group having 1 to 25 carbon atoms, each of which one or more hydrogen atoms may be substituted with a halogen atom, a hydroxyl group, a carboxy group, a sulfo group, or a cyano group, or which may contain an unsaturated bond, an oxygen atom, or a saturated or unsaturated ring structure between carbon atoms, or a group of Formula(S) where $R^{41}$ and $R^{42}$ each independently is a hydrogen atom, a halogen atom, or an alkyl group or alkoxy group having 1 to 10 carbon atoms, and k is 2 or 3, (S)

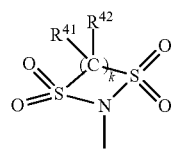

$R^{21}$ and $R^{22}$, $R^{22}$ and $R^{25}$, and $R^{21}$ and $R^{23}$ may be bonded to each other to form a heterocycle A, a heterocycle B, and a heterocycle C each having 5 or 6 members with a nitrogen atom, respectively, $R^{21}$ and $R^{22}$ in the case where the heterocycle A is formed represent, as a divalent group -Q- to which these are bonded, an alkylene group or alkyleneoxy group in which a hydrogen atom may be substituted with an alkyl group having 1 to 6 carbon atoms, an aryl group having 6 to 10 carbon atoms, or acyloxy group having 1 to 10 carbon atoms which may have a substituent, $R^{22}$ and $R^{25}$ in the case where the heterocycle B is formed, and $R^{21}$ and $R^{23}$ in the case where the heterocycle C is formed respectively represent as divalent groups —X¹—Y¹— and —X²—Y²— where X¹ and X² are on the side that bonds to nitrogen to which these are bonded, a group in which X¹ and X² are each a group of Formula (1x) or (2x), and Y¹ and Y² are each a group of at least one selected from Formulae (1y) to (5y), and in the case where X¹ and X² are each a group of Formula (2x), Y¹ and Y² may be a single bond, and in that case, an oxygen atom may be contained between carbon atoms,

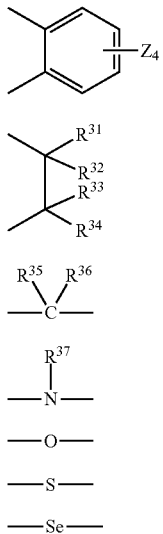

(1x)

(2x)

(1y)

(2y)

(3y)

(4y)

(5y)

four Z's are each independently a hydrogen atom, a hydroxyl group, an alkyl group or alkoxy group having 1 to 6 carbon atoms, or —NR³⁸R³⁹ where R³⁸ and R³⁹ each independently is a hydrogen atom or an alkyl group having 1 to 20 carbon atoms, R³¹ to R³⁶ each independently is a hydrogen atom, an alkyl group having 1 to 6 carbon atoms or an aryl group having 6 to 10 carbon atoms, and R³⁷ is an alkyl group having 1 to 6 carbon atoms or an aryl group having 6 to 10 carbon atoms, R²⁷, R²⁸, R²⁹, R³¹ to R³⁷, R²¹ to R²³ in the case where a heterocycle is not formed, and R²⁵ may be bonded to any of them to form a 5-membered ring or a 6-membered ring, and R³¹ and R³⁶, and R³¹ and R³⁷ may be directly bonded to each other, and R²¹ and R²² in the case where a heterocycle is not formed, each independently is a hydrogen atom, an alkyl group or allyl group having 1 to 6 carbon atoms which may have a substituent, or an aryl group or araryl group having 6 to 11 carbon atoms which may have a substituent, and R²³ and R²⁵ in the case where a heterocycle is not formed, each independently is a hydrogen atom, a halogen atom, or an alkyl group or alkoxy group having 1 to 6 carbon atoms, (II)

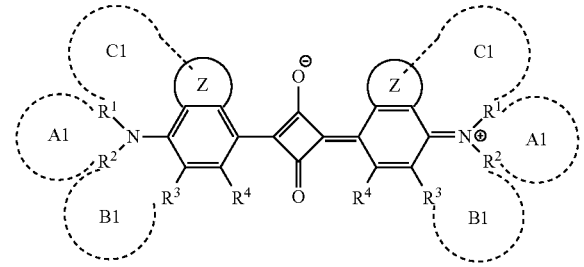

where ring Z's are each independently a 5-membered ring or 6-membered ring which has 0 to 3 heteroatoms in the ring and may be substituted, and a carbon atom or heteroatom constituting R¹ and R², R² and R³, and R¹ and the ring Z may be boded to each other to form a heterocycle A1, a heterocycle B1 and a heterocycle C1 together with a nitrogen atom, respectively, and in the case where the heterocycle is not formed, R¹ and R² each independently is a hydrogen atom, a halogen atom, or a hydrocarbon group which may contain an unsaturated bond, a heteroatom, or a saturated or unsaturated ring structure between carbon atoms, and may have a substituent, and R³ and R⁴ each independently is a hydrogen atom, a halogen atom, or an alkyl group or alkoxy group which may contain a heteroatom between carbon atoms, (III)

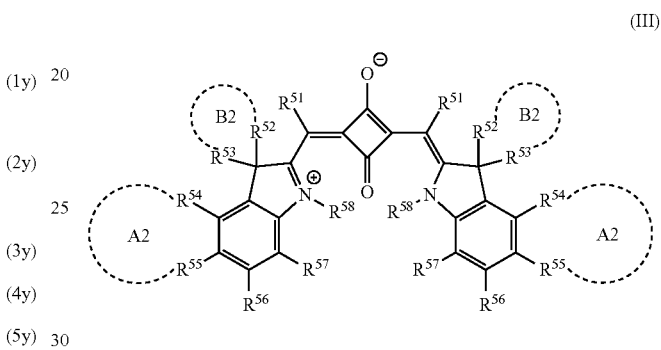

where R⁵¹ each independently is a halogen atom or an alkyl group having 1 to 3 carbon atoms which may have a substituent, R⁵² to R⁵⁸ each independently is a hydrogen atom, a halogen atom or an alkyl group having 1 to 10 carbon atoms which may have a substituent, R⁵² and R⁵³ may be bonded to each other to form a saturated or unsaturated hydrocarbon ring B2 having 5 to 15 carbon atoms, and a hydrogen atom of the hydrocarbon ring B2 may be substituted with an alkyl group having 1 to 10 carbon atoms, and R⁵⁴ and R⁵⁵ may be bonded to each other to form a benzene ring A2, and a hydrogen atom of the benzene ring A2 may be substituted with an alkyl group having 1 to 10 carbon atoms.

13. The optical filter according to claim 12, wherein the absorption layer further satisfies (ii-1) to (ii-3) in a spectral transmittance curve at an incident angle of 0 degree, the reflection layer satisfies (iii-1), and the optical filter satisfies (iv-1), where in the (ii-1), a wavelength showing a transmittance of 20% is in a wavelength range of 655 to 675 nm, in the (ii-2), an average transmittance of light having a wavelength of 435 to 630 nm is 65% or more, in the (ii-3), an average transmittance of light having a wavelength of 850 to 1,100 nm is 70% or lower, in the (iii-1), an average transmittance of light having a wavelength of 850 to 1,100 nm is 0.2% or less in the spectral transmittance curve at an incident angle of 0 degree, and in the (iv-1), an average value of absolute values of differences in transmittances in the spectral transmittance curves at an incident angle of 0 degree and an incident angle of 30 degrees is 2%/nm or less in a wavelength range of 615 to 725 nm.

14. The optical filter according to claim 10, wherein the near-infrared absorbing dye comprises at least two dyes having different maximum absorption wavelength $\lambda_{max(A)TR}$.

15. The optical filter according to claim 1, wherein the transparent resin comprises at least one resin selected from the group consisting of a polyester resin, a polycarbonate resin, a polyimide resin, and an acrylimide resin.

16. The optical filter according to claim 1, wherein the absorption layer further comprises a near-infrared absorbing dye having a maximum absorption wavelength $\lambda_{max(D)TR}$ in a wavelength range of 650 to 750 nm in an absorbance curve of wavelength 350 to 1,200 nm measured in the transparent resin and having at least one of Formulae (I), (II) and (III),

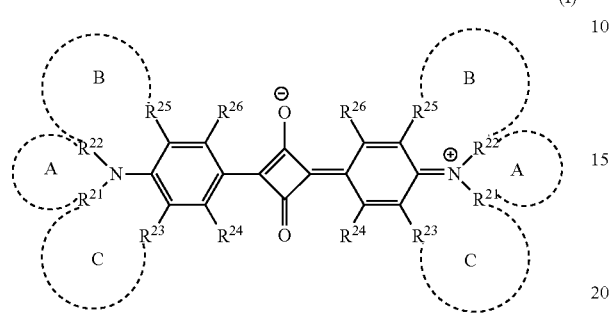

(I)

where $R^{24}$ and $R^{26}$ are each independently a hydrogen atom, a halogen atom, a hydroxyl group, an alkyl group or alkoxy group having 1 to 6 carbon atoms, an acyloxy group having 1 to 10 carbon atoms, —$NR^{27}R^{28}$ where $R^{27}$ and $R^{28}$ are each independently a hydrogen atom, an alkyl group having 1 to 20 carbon atoms, —C(=O)—$R^{29}$ where $R^{29}$ is a hydrogen atom, an alkyl group having 1 to 20 carbon atoms or an aryl group having 6 to 11 carbon atoms which may have a substituent, or an araryl group having 7 to 18 carbon atoms which may have a substituent and have an oxygen atom between carbon atoms, —$NHR^{30}$, or —$SO_2$—$R^{30}$ where $R^{30}$ is a hydrocarbon group having 1 to 25 carbon atoms, each of which one or more hydrogen atoms may be substituted with a halogen atom, a hydroxyl group, a carboxy group, a sulfo group, or a cyano group, or which may contain an unsaturated bond, an oxygen atom, or a saturated or unsaturated ring structure between carbon atoms, or a group of Formula(S) where $R^{41}$ and $R^{42}$ each independently is a hydrogen atom, a halogen atom, or an alkyl group or alkoxy group having 1 to 10 carbon atoms, and k is 2 or 3,

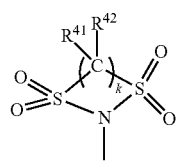

(S)

$R^{21}$ and $R^{22}$, $R^{22}$ and $R^{25}$, and $R^{21}$ and $R^{23}$ may be bonded to each other to form a heterocycle A, a heterocycle B, and a heterocycle C each having 5 or 6 members with a nitrogen atom, respectively, $R^{21}$ and $R^{22}$ in the case where the heterocycle A is formed represent, as a divalent group -Q- to which these are bonded, an alkylene group or alkyleneoxy group in which a hydrogen atom may be substituted with an alkyl group having 1 to 6 carbon atoms, an aryl group having 6 to 10 carbon atoms, or acyloxy group having 1 to 10 carbon atoms which may have a substituent, $R^{22}$ and $R^{25}$ in the case where the heterocycle B is formed, and $R^{21}$ and $R^{23}$ in the case where the heterocycle C is formed respectively represent as divalent groups —$X^1$—$Y^1$— and —$X^2$—$Y^2$— where $X^1$ and $X^2$ are on the side that bonds to nitrogen to which these are bonded, a group in which $X^1$ and $X^2$ are each a group of Formula (1x) or (2x), and $Y^1$ and $Y^2$ are each a group of at least one selected from Formulae (1y) to (5y), and in the case where $X^1$ and $X^2$ are each a group of Formula (2x), $Y^1$ and $Y^2$ may be a single bond, and in that case, an oxygen atom may be contained between carbon atoms,

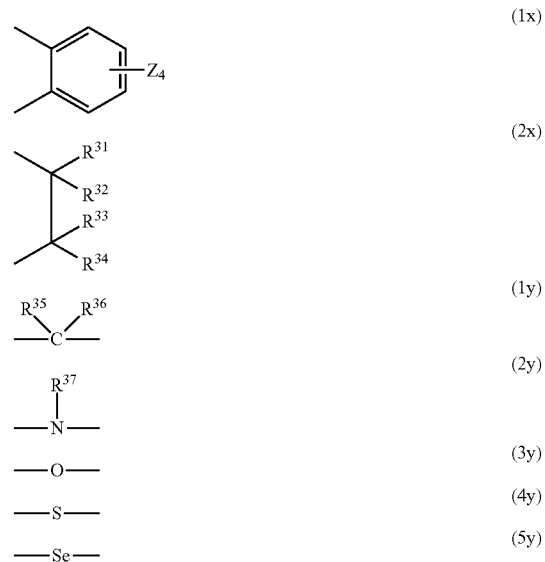

four Z's are each independently a hydrogen atom, a hydroxyl group, an alkyl group or alkoxy group having 1 to 6 carbon atoms, or —$NR^{38}R^{39}$ where $R^{38}$ and $R^{39}$ each independently is a hydrogen atom or an alkyl group having 1 to 20 carbon atoms, $R^{31}$ to $R^{36}$ each independently is a hydrogen atom, an alkyl group having 1 to 6 carbon atoms or an aryl group having 6 to 10 carbon atoms, and $R^{37}$ is an alkyl group having 1 to 6 carbon atoms or an aryl group having 6 to 10 carbon atoms, $R^{27}$, $R^{28}$, $R^{29}$, $R^{31}$ to $R^{37}$, $R^{21}$ to $R^{23}$ in the case where a heterocycle is not formed, and $R^{25}$ may be bonded to any of them to form a 5-membered ring or a 6-membered ring, and $R^{31}$ and $R^{36}$, and $R^{31}$ and $R^{37}$ may be directly bonded to each other, and $R^{21}$ and $R^{22}$ in the case where a heterocycle is not formed, each independently is a hydrogen atom, an alkyl group or allyl group having 1 to 6 carbon atoms which may have a substituent, or an aryl group or araryl group having 6 to 11 carbon atoms which may have a substituent, and $R^{23}$ and $R^{25}$ in the case where a heterocycle is not formed, each independently is a hydrogen atom, a halogen atom, or an alkyl group or alkoxy group having 1 to 6 carbon atoms,

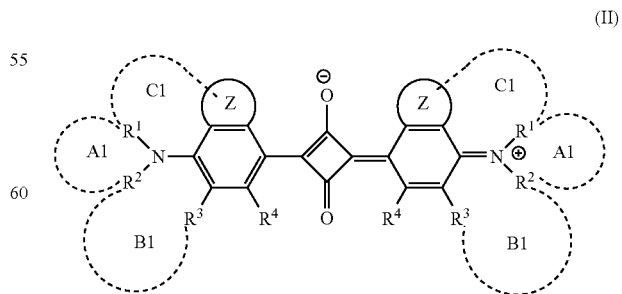

(II)

where ring Z's are each independently a 5-membered ring or 6-membered ring which has 0 to 3 heteroatoms in the ring and may be substituted, and a carbon atom or heteroatom constituting $R^1$ and $R^2$, $R^2$ and $R^3$, and $R^1$ and the ring Z may be boded to each other to form a heterocycle A1, a heterocycle B1 and a heterocycle C1 together with a nitrogen atom, respectively, and in the case where the heterocycle is not formed, $R^1$ and $R^2$ each independently is a hydrogen atom, a halogen atom, or a hydrocarbon group which may contain an unsaturated bond, a heteroatom, or a saturated or unsaturated ring structure between carbon atoms, and may have a substituent, and $R^3$ and $R^4$ each independently is a hydrogen atom, a halogen atom, or an alkyl group or alkoxy group which may contain a heteroatom between carbon atoms, (III)

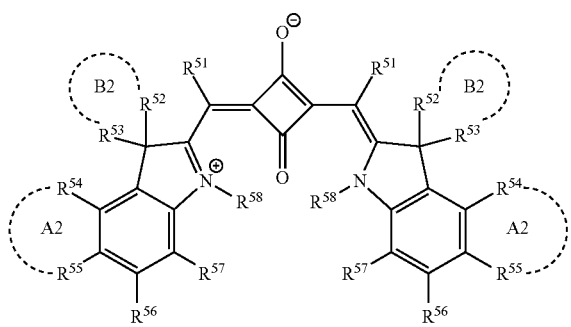

where $R^{51}$ each independently is a halogen atom or an alkyl group having 1 to 3 carbon atoms which may have a substituent, $R^{52}$ to $R^{58}$ each independently is a hydrogen atom, a halogen atom or an alkyl group having 1 to 10 carbon atoms which may have a substituent, $R^{52}$ and $R^{53}$ may be bonded to each other to form a saturated or unsaturated hydrocarbon ring B2 having 5 to 15 carbon atoms, and a hydrogen atom of the hydrocarbon ring B2 may be substituted with an alkyl group having 1 to 10 carbon atoms, and $R^{54}$ and $R^{55}$ may be bonded to each other to form a benzene ring A2, and a hydrogen atom of the benzene ring A2 may be substituted with an alkyl group having 1 to 10 carbon atoms.

17. The optical filter according to claim 16, wherein the absorption layer further satisfies (ii-1) to (ii-3) in a spectral transmittance curve at an incident angle of 0 degree, the reflection layer satisfies (iii-1), and the optical filter satisfies (iv-1), where in the (ii-1), a wavelength showing a transmittance of 20% is in a wavelength range of 655 to 675 nm, in the (ii-2), an average transmittance of light having a wavelength of 435 to 630 nm is 65% or more, in the (ii-3), an average transmittance of light having a wavelength of 850 to 1,100 nm is 70% or lower, in the (iii-1), an average transmittance of light having a wavelength of 850 to 1,100 nm is 0.2% or less in the spectral transmittance curve at an incident angle of 0 degree, and in the (iv-1), an average value of absolute values of differences in transmittances in the spectral transmittance curves at an incident angle of 0 degree and an incident angle of 30 degrees is 2%/nm or less in a wavelength range of 615 to 725 nm.

18. The optical filter according to claim 1, wherein the near-infrared absorbing dye comprises at least two dyes having different maximum absorption wavelength $\lambda_{max(A)TR}$.

19. An imaging apparatus, comprising:
the optical filter as described in of claim 1.

20. The optical filter according to claim 1, wherein the near-infrared absorbing dye further satisfies Formulae (5) and (6), $ABS_{400(A)TR}/ABS_{\lambda max(A)TR} - ABS_{400(A)DCM}/ABS_{\lambda max(A)DCM} < 0.06$ (5) and $ABS_{550(A)TR}/ABS_{\lambda max(A)TR} - ABS_{550(A)DCM}/ABS_{\lambda max(A)DCM} < 0.08$ (6).

* * * * *